(12) United States Patent
Nikai et al.

(10) Patent No.: US 6,683,554 B2
(45) Date of Patent: Jan. 27, 2004

(54) ANALOG-TO-DIGITAL CONVERSION CIRCUIT HAVING INCREASED CONVERSION SPEED AND HIGH CONVERSION ACCURACY

(75) Inventors: Norihiro Nikai, Gifu (JP); Atsushi Wada, Ogaki (JP); Kuniyuki Tani, Ogaki (JP); Yasuyuki Kimura, Gunma (JP); Kenichi Kato, Gunma (JP)

(73) Assignee: Sanyo Electric Co., Ltd., Moriguchi (JP)

( * ) Notice: Subject to any disclaimer, the term of this patent is extended or adjusted under 35 U.S.C. 154(b) by 0 days.

(21) Appl. No.: 10/173,124

(22) Filed: Jun. 18, 2002

(65) Prior Publication Data

US 2003/0006926 A1 Jan. 9, 2003

(30) Foreign Application Priority Data

Jun. 18, 2001 (JP) .......................... 2001-183898
Dec. 18, 2001 (JP) .......................... 2001-384369

(51) Int. Cl.⁷ .............................................. H03M 1/38
(52) U.S. Cl. ...................................... 341/161; 341/155
(58) Field of Search ............................. 341/162, 144, 341/120, 155, 161, 118

(56) References Cited

U.S. PATENT DOCUMENTS 6,211,806 B1 * 4/2001 McCarroll .................. 341/161
6,304,206 B1   10/2001 Wada et al. ................ 341/162
6,456,211 B2 * 9/2002 Wu et al. .................... 341/120

FOREIGN PATENT DOCUMENTS

| JP | 9-69776 | 3/1997 | |
| JP | 9-69777 | 3/1997 | ............ H03M/1/14 |
| JP | 11-88172 | 3/1999 | ............ H03M/1/14 |
| JP | 11-88173 | 3/1999 | ............ H03M/1/14 |

* cited by examiner

Primary Examiner—Peguy JeanPierre
(74) Attorney, Agent, or Firm—Westerman, Hattori, Daniels & Adrian, LLP

(57) ABSTRACT

In an analog-to-digital conversion circuit, the gain of an operational amplification circuit in each of first- to third-stage circuits is two. The reference voltage range of a sub-A/D converter in each of the stages of circuits is set to one-half the reference voltage range of a D/A converter, so that the output voltage range of the D/A converter coincides with the output voltage range of the operational amplification circuit. When the voltage range of the analog input signal is $VIN_{p-p}$, the full-scale range of the sub-A/D converter is switched to $VIN_{p-p}$, and the gain of the operational amplification circuit is one. When the voltage range of the analog input signal is $VIN_{p-p}/2$, the full-scale range of the sub-A/D converter is switched to $VIN_{p-p}/2$, and the gain of the operational amplification circuit is two.

28 Claims, 42 Drawing Sheets

1 : 1 REFERENCE VOLTAGE RANGE RATIO

1 : 2 REFERENCE VOLTAGE RANGE RATIO

F I G. 1 5
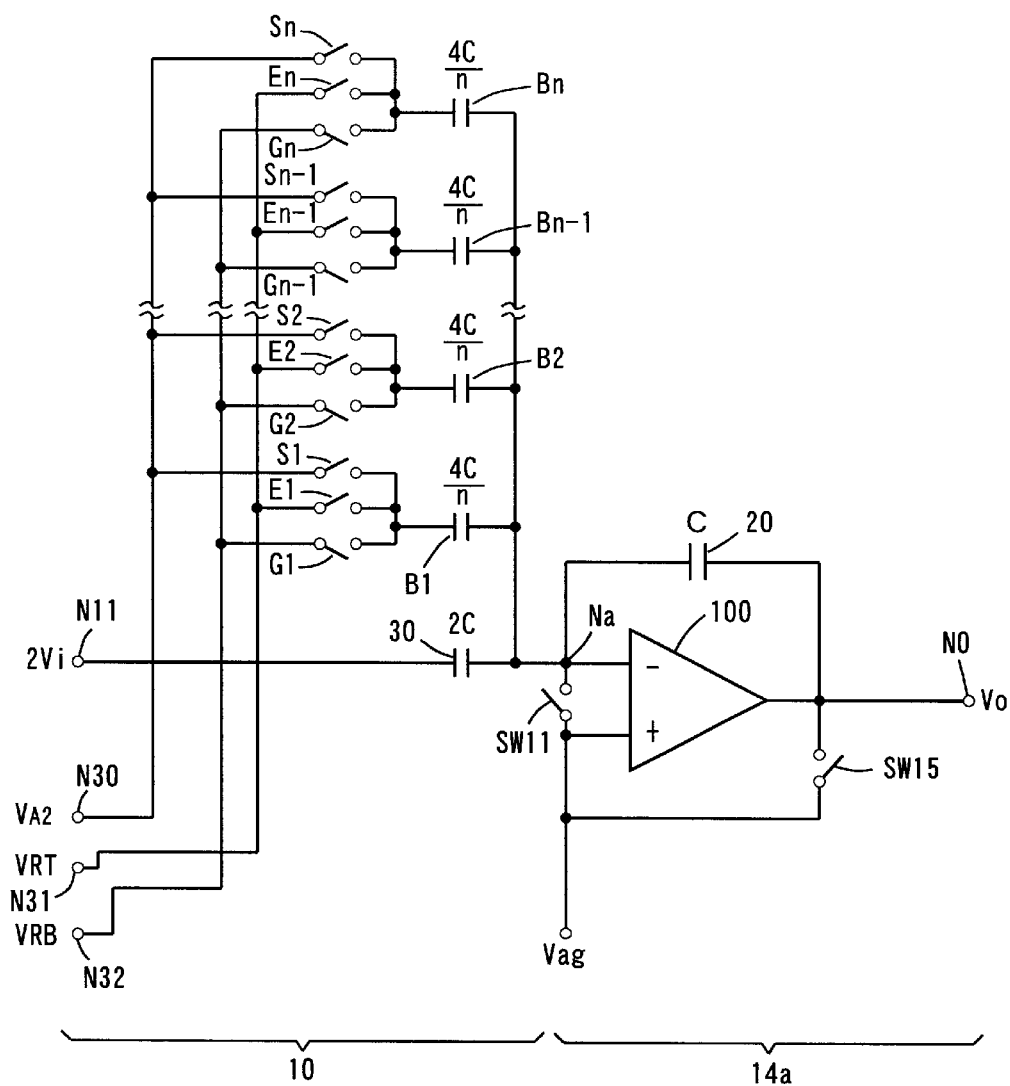

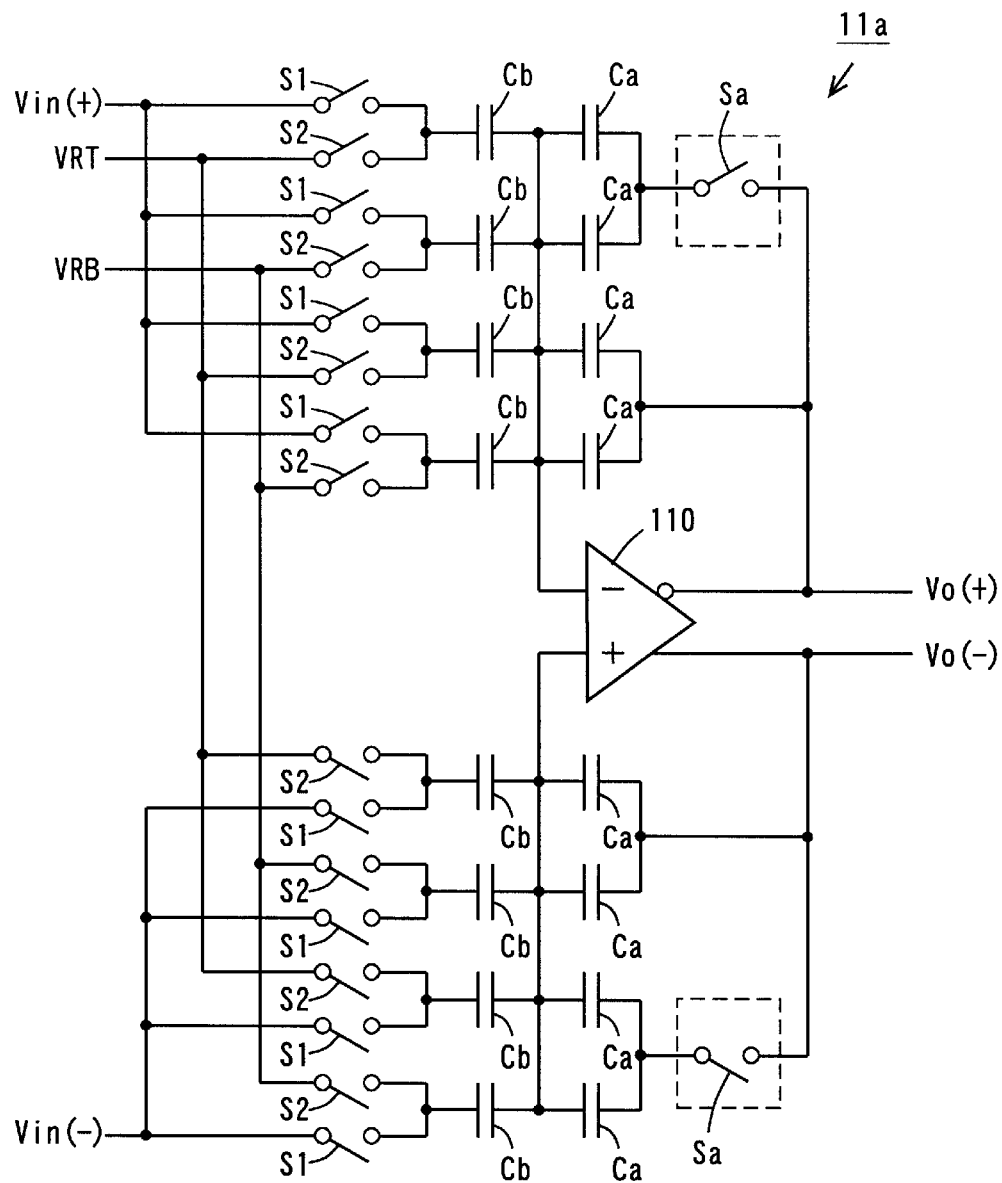
F I G. 2 1

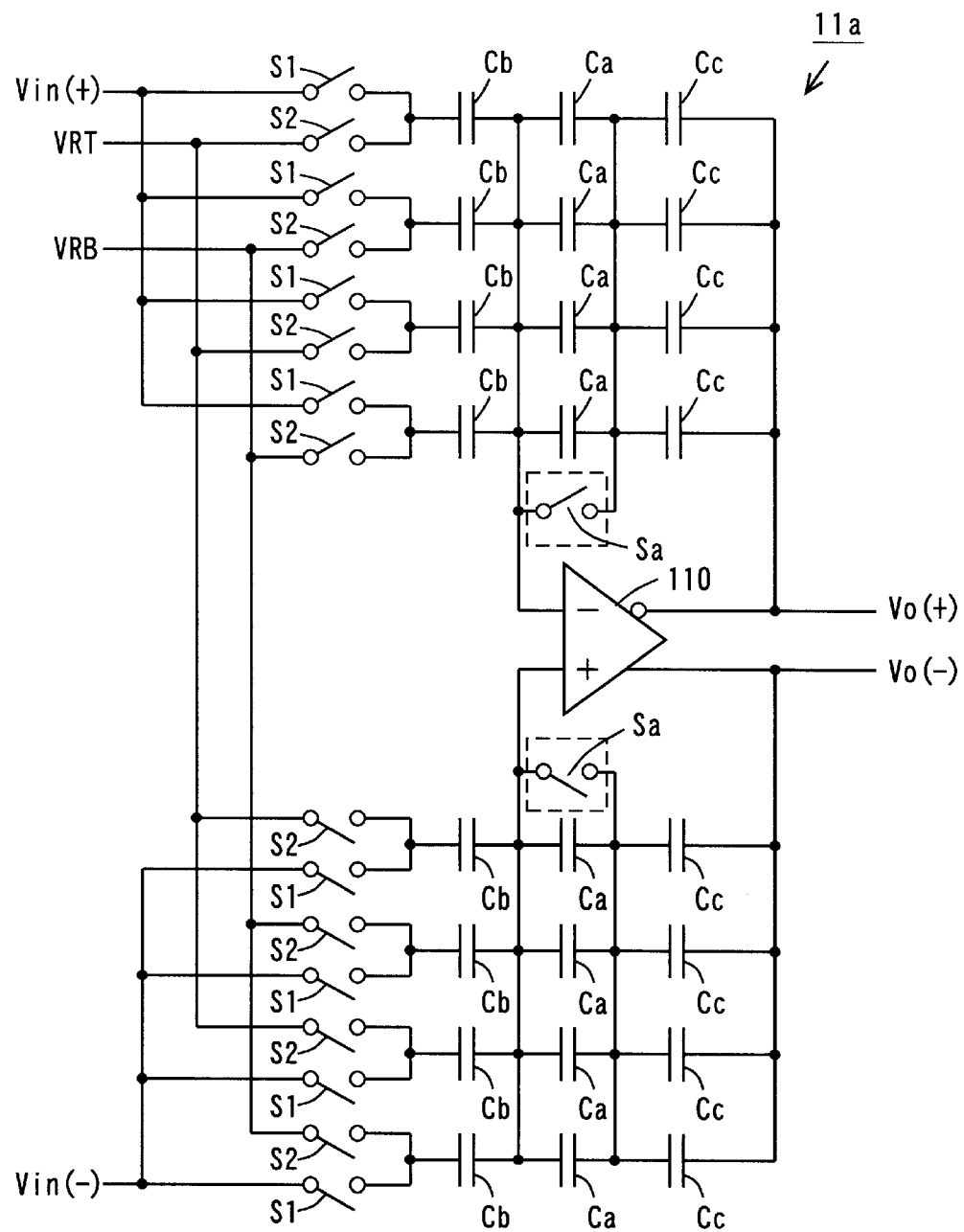
F I G. 2 3

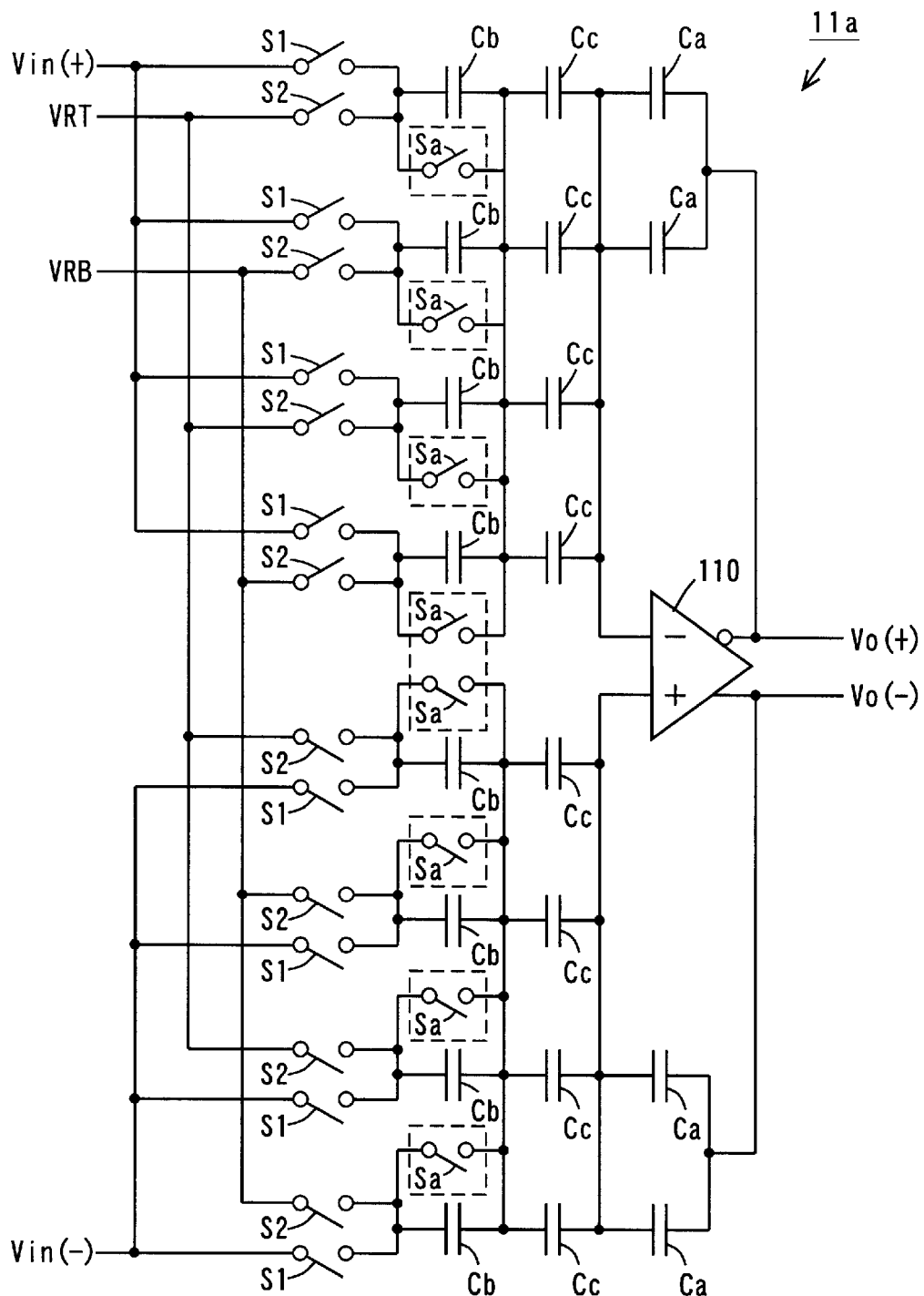
F I G. 2 6

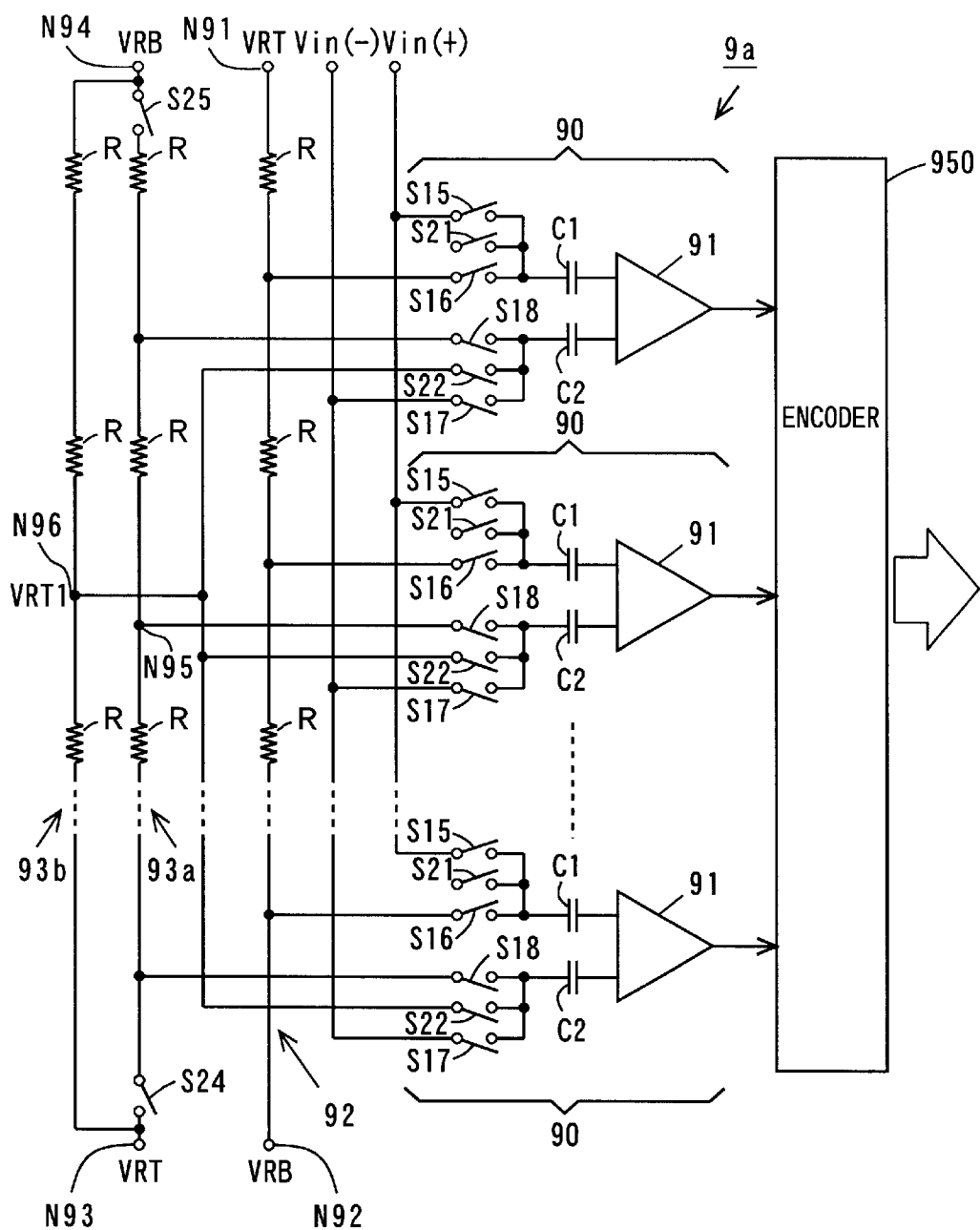
F I G. 2 9

F I G. 3 4
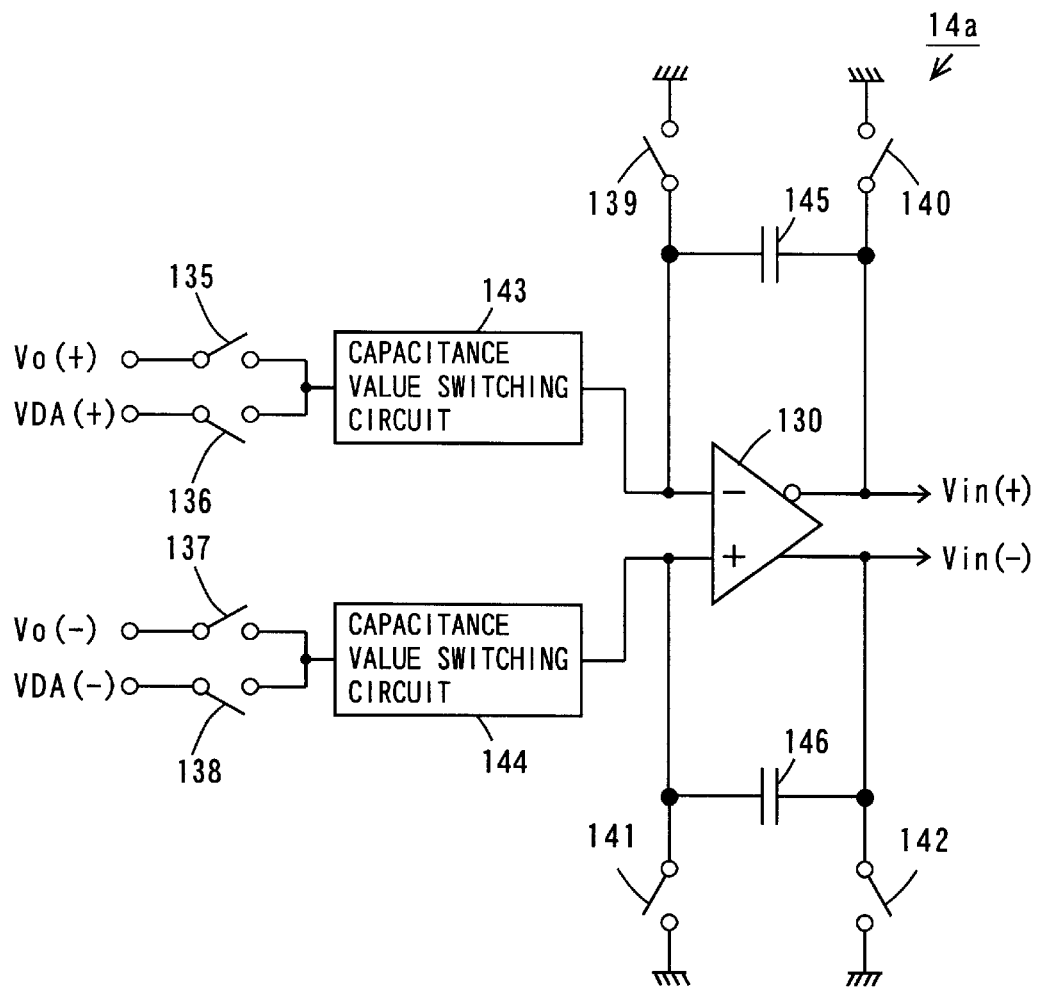

$$\Delta V_O = V_O(+) - V_O(-)$$
$$= \{V_i(+) - V_i(-)\}K - \{VDA(+) - VDA(-)\}K$$
$$= (\Delta V_i - \Delta VDA)K$$

F I G. 4 3  PRIOR ART

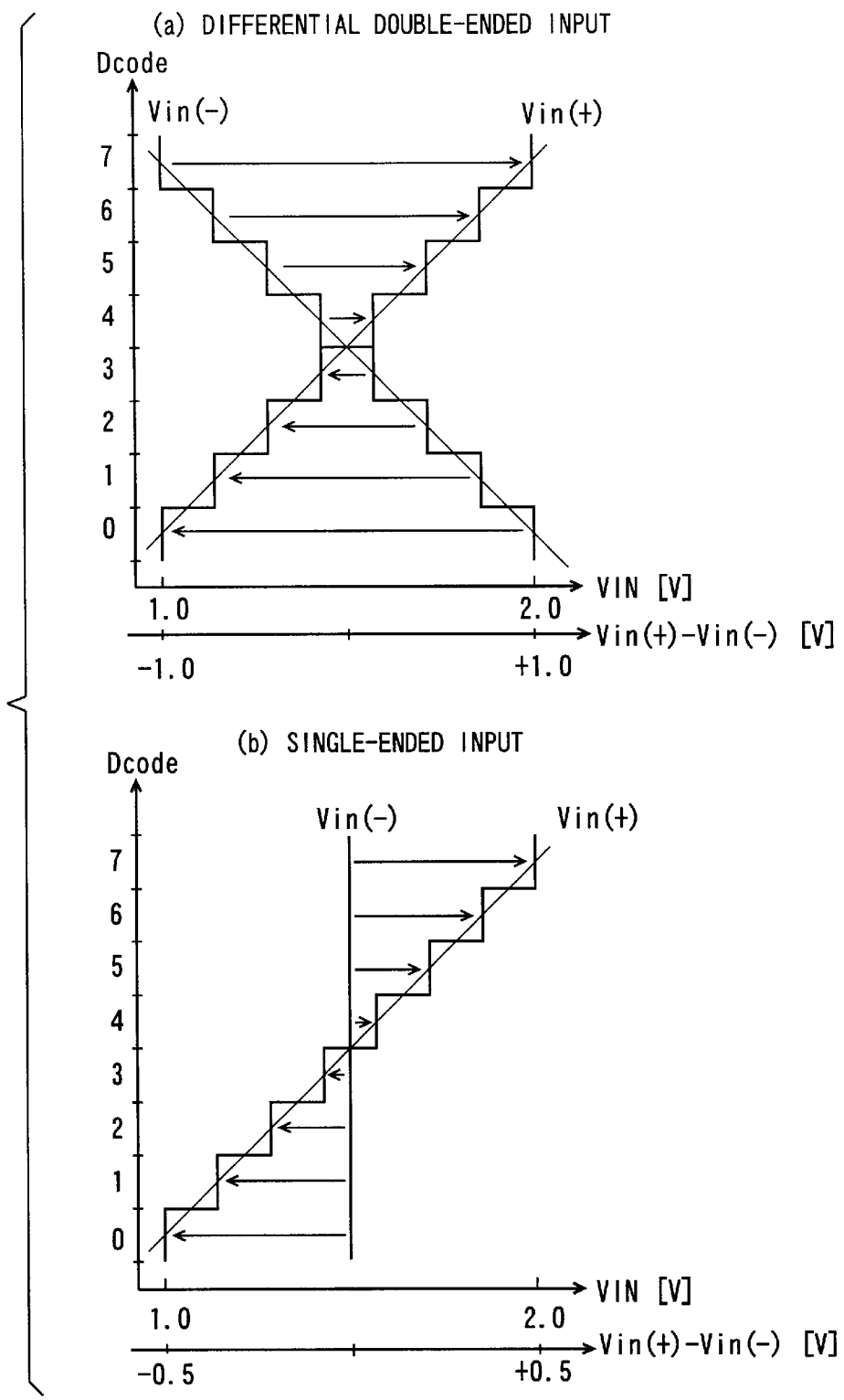
F I G. 4 6 PRIOR ART

ANALOG-TO-DIGITAL CONVERSION CIRCUIT HAVING INCREASED CONVERSION SPEED AND HIGH CONVERSION ACCURACY

BACKGROUND OF THE INVENTION

1. Field of the Invention

The present invention relates to an analog-to-digital conversion circuit having a multi-stage pipeline (multi-step flash) structure.

2. Description of the Background Art

In recent years, the demands for analog-to-digital conversion circuits (A/D converters) for processing video signals have increased with the progress of digital processing techniques for video signals. High-speed conversion operations are required for analog-to-digital conversion circuits for processing video signals. Conventionally, therefore, two-step flash (two-step parallel) systems have been widely used.

As the number of converted bits increases, however, sufficient conversion accuracy has not been obtained in the two-step flash systems. Therefore, analog-to-digital conversion circuits having multi-stage pipeline (step-flash) structures have been developed.

FIG. 38 is a block diagram showing the structure of a conventional analog-to-digital conversion circuit having a multi-stage pipeline structure. The analog-to-digital conversion circuit shown in FIG. 38 has a 10-bit four-stage pipeline structure. The analog-to-digital conversion circuit is disclosed in JP-A-9-69777, for example.

In FIG. 38, the analog-to-digital conversion circuit 101 comprises a sample-and-hold circuit 102, a first-stage circuit 103, a second-stage circuit 104, a third-stage circuit 105, a fourth-stage circuit 106, a plurality of latch circuits 107, and an output circuit 108.

Each of the first (initial)- to third-stage circuits 103 to 105 comprises a sub-A/D (Analog-to-Digital) converter 109, a D/A (Digital-to-Analog) converter 110, and a subtraction amplification circuit (a differential amplifier) 111. The fourth (final)-stage circuit 106 comprises only a sub-A/D converter 109.

The first-stage circuit 103 has a 4-bit configuration, and each of the second- to fourth-stage circuits 104 to 106 has a 2-bit configuration. In each of the first- to third-stage circuits 103 to 105, the respective numbers of bits (bit configurations) of the sub-A/D converter 109 and the D/A converter 110 are set to the same value.

The operations of the analog-to-digital conversion circuit 101 will be then described. The sample-and-hold circuit 102 samples an analog input signal Vin, and holds the sampled analog input signal for a predetermined time period. The analog input signal Vin outputted from the sample-and-hold circuit 102 is transferred to the first-stage circuit 103.

In the first-stage circuit 103, the sub-A/D converter 109 subjects the analog input signal Vin to A/D (analog-to-digital) conversion. A digital output ($2^9$, $2^8$, $2^7$, $2^6$), which is the result of the A/D conversion by the sub-A/D converter 109, is transferred to the D/A converter 110, and is also transferred to the output circuit 108 through the four latch circuits 107. The subtraction amplification circuit 111 amplifies the difference between the result of D/A (digital-to-analog) conversion by the D/A converter 110 and the analog input signal Vin. An output from the subtraction amplification circuit 111 is transferred to the second-stage circuit 104.

The second-stage circuit 104 performs the same operations as those of the first-stage circuit 103 with respect to the output from the subtraction amplification circuit 111 in the first-stage circuit 103. Further, the third-stage circuit 105 performs the same operations as those of the first-stage circuit 103 with respect to an output from the subtraction amplification circuit 111 in the second-stage circuit 104. An intermediate high order 2-bit digital output ($2^5$, $2^4$) is obtained from the second-stage circuit 104, and an intermediate low order 2-bit digital output ($2^3$, $2^2$) is obtained from the third-stage circuit 105.

In the fourth-stage circuit 106, the sub-A/D converter 109 subjects the output from the subtraction amplification circuit 111 in the third-stage circuit 105 to A/D conversion, thereby obtaining a low order 2-bit digital output ($2^1$, $2^0$).

The digital outputs from the first- to fourth-stage circuits 103 to 106 simultaneously reach the output circuit 108 through the respective latch circuits 107. That is, the latch circuits 107 are provided to synchronize the respective digital outputs from the circuits 103 to 106 with each other.

The output circuit 108 outputs a 10-bit digital output Dout of the analog input signal Vin in parallel after digital correction processing, when required.

In each of the first- to third-stage circuits 103 to 105 in the analog-to-digital conversion circuit 101, the subtraction amplification circuit 111 amplifies the difference between the analog input signal Vin or the output from the subtraction amplification circuit 111 in the preceding stage of circuit 103 or 104 and the result of the D/A conversion of the digital output thereof.

Even if the number of converted bits increases to reduce the LSB (Least Significant Bit), therefore, the resolution of each of comparators constituting the sub-A/D converter 109 can be substantially improved, thereby obtaining sufficient conversion accuracy.

FIG. 39 is a circuit diagram of the sub-A/D converter 109 and the D/A converter 110 in the analog-to-digital conversion circuit 101 shown in FIG. 38. The sub A/D converter 109 shown in FIG. 39 is a total parallel comparison (flash) system sub-A/D converter, and the D/A converter 110 is a capacitance array system D/A converter.

The sub-A/D converter 109 comprises n resistors R and n comparators D1 to Dn. All the resistors R have the same resistance value, and are connected in series between a node N31 receiving a high-potential side reference voltage VRT and a node N32 receiving a low-potential side reference voltage VRB. Let VR (1) to VR (n) respectively be potentials at nodes N41 to N4$n$ among the n resistors R between the node N32 and the node N31.

An input signal VI (the analog input signal Vin or the output from the subtraction amplification circuit 111 in the preceding stage of circuit 103, 104, or 105) is inputted to positive input terminals of the comparators D1 to Dn. Further, the potentials VR (1) to VR (n) at the nodes N41 to N4$n$ are respectively applied to negative input terminals of the comparators D1 to Dn.

Consequently, outputs from the comparators D1 to Dn enter a high level, respectively, when the input signal VI is higher than the potentials VR (1) to VR (n), while entering a low level, respectively, when the input signal VI is lower than the potentials VR (1) to VR (n).

The D/A converter 110 comprises respective n switches E1 to En, F1 to Fn, G1 to Gn, and H1 to Hn, n positive-side capacitors B1 to Bn, and n negative-side capacitors C1 to Cn which are respectively connected to one another in an array shape.

All the capacitors B1 to Bn and the capacitors C1 to Cn have the same capacitance value c. A differential positive side output voltage VDA (+) is generated from one terminal (hereinafter referred to as an output terminal) of each of the capacitors B1 to Bn, and a differential negative side output voltage VDA (−) is generated from one terminal (hereinafter referred to as an output terminal) of each of the capacitors C1 to Cn. The other terminal of each of the capacitors B1 to Bn and C1 to Cn is referred to as an input terminal.

Respective one terminals of the switches E1 to En are connected to the node N31, and the other terminals thereof are respectively connected to the input terminals of the capacitors B1 to Bn. Respective one terminals of the switches F1 to Fn are connected to the node N31, and the other terminals thereof are respectively connected to the input terminals of the capacitors C1 to Cn. Respective one terminals of the switches G1 to Gn are connected to the node N32, and the other terminals thereof are respectively connected to the input terminals of the capacitors B1 to Bn. Respective one terminals of the switches H1 to Hn are connected to the node N32, and the other terminals thereof are respectively connected to the input terminals of the capacitors C1 to Cn.

The switches E1 to En, F1 to Fn, G1 to Gn, H1 to Hn constitute four series of switches. For example, the switches E1, F1, G1, and H1 constitute one series of switches, and the switches En, Fn, Gn, and Hn constitute one series of switches. The switches E1 to En, F1 to Fn, G1 to Gn, and H1 to Hn respectively perform on-off operations in accordance with the output levels of the comparators D1 to Dn. For example, when the output from the comparator Dn is at a high level, the switches En and Hn are turned on, and the switches Gn and Fn are turned off. Conversely, when the output from the comparator Dn is at a low level, the switches En and Hn are turned off, and the switches Gn and Fn are turned on.

The operations of the D/A converter 110 will be then described. In the initial conditions, both potentials at the input and output terminals of each of the capacitors B1 to Bn are 0 volt. All the switches E1 to En, F1 to Fn, G1 to Gn, and H1 to Hn are turned off. Consequently, in the initial conditions, the quantity of charges (electricity) Q1 stored in all the capacitors B1 to Bn and C1 to Cn is zero.

When the outputs from m of the n comparators D1 to Dn enter a high level, m of the n switches E1 to En are turned on and the (n−m) switches are turned off, and (n−m) of the switches G1 to Gn are turned on and the m switches are turned off. Charges Q2 stored in all the capacitors B1 to Bn are expressed by the following equation (A1) in accordance with the on-off operations of the switches E1 to En or the switches G1 to Gn:

$$Q2=m(VRT-VDA(+))c+(n-m)(VRB-VDA(+))\,c \qquad (A1)$$

From the principle of conservation of charge, Q1=Q2. Consequently, the differential positive side output voltage VDA (+) is expressed by the following equation (A2):

$$VDA(+)=VRB+m(VRT-VRB)/n \qquad (A2)$$

On the other hand, when the outputs from m of the n comparators D1 to Dn enter a high level, m of the n switches H1 to Hn are turned on and the (n−m) switches are turned off, and (n−m) of the switches F1 to Fn are turned on and the m switches are turned off. Charges Q3 stored in all the capacitors C1 to Cn are expressed by the following equation (A3) in accordance with the on-off operations of the switches H1 to Hn or the switches F1 to Fn:

$$Q3=(n-m)(VRT-VDA(-))c+m(VRB-VDA(-))c \qquad (A3)$$

From the principle of conservation of charge, Q1=Q3. Consequently, the differential negative side output voltage VDA (−) is expressed by the foregoing equations (A4):

$$VDA(-)=VRT-m(VRT-VRB)/n \qquad (A4)$$

Consequently, a difference voltage ΔVDA is expressed by the following equation (A5):

$$\Delta VDA=VDA(+)-VDA(-)=VRB-VRT+2m(VRT-VRB)/n \qquad (A5)$$

FIG. 40 is a circuit diagram showing the principle of the operations of the subtraction amplification circuit 111 in the analog-to-digital conversion circuit 101 shown in FIG. 38. FIG. 41 is a diagram for explaining the operations of the subtraction amplification circuit 111 shown in FIG. 40. The subtraction amplification circuit 111 shown in FIG. 40 is a subtraction amplification circuit using a complete differential system. The structure of the subtraction amplification circuit 111 is disclosed in JP-A-11-88173.

In the subtraction amplification circuit 111 shown in FIG. 40, an inverse input terminal of an operational amplifier 100 is connected to a node Na, and a non-inverse input terminal thereof is connected to a node Nb. Further, an inverse output terminal of the operational amplifier 100 is connected to a node NO1, and is connected to the inverse input terminal through a capacitor 20a. A non-inverse output terminal thereof is connected to a node NO2, and is connected to the non-inverse input terminal through a capacitor 20b.

The node Na is grounded through a switch SW11, and the node Nb is grounded through a switch SW12. Further, the node Na is connected to a node N11 through a capacitor 30a, and is connected to a node N12 through a capacitor 40a. The node Nb is connected to a node N21 through a capacitor 30b, and is connected to a node N22 through a capacitor 40b. A switch SW13 is connected between the nodes NO1 and NO2. The switch SW13 operates at the same timing as the switches SW11 and SW12.

The analog input signal Vin or the output from each of the subtraction amplification circuits 111 in the preceding stage of circuit 103, 104, or 105 is fed as a differential voltage $\Delta V_1$ to the subtraction amplification circuit 111. $\Delta V_i = V_i(+) - V_i(-)$. Further, the result of the D/A conversion by the D/A converter 110 in the same stage is fed as a differential voltage ΔVDA to the subtraction amplification circuit 111. ΔVDA=VDA(+)−DVA(−).

A voltage which changes from $V_i(+)$ to $V_{A1}$ is inputted to the node Nil, a voltage which changes from $V_{A2}$ to VDA (+) is inputted to the node N12, a voltage which changes from Vi (−) to $V_{A1}$ is inputted to the node N21, and a voltage which changes from $V_{A2}$ to VDA (−) is inputted to the node N22.

Referring now to FIG. 41, the operations of the subtraction amplification circuit 111 shown in FIG. 40 will be described. Let C be the capacitance value of each of the capacitors 20a and 20b, and let KC be the capacitance value of each of the capacitors 30a, 30b, 40a, and 40b. K is a constant. Further, let $V_G$ be a ground potential.

The switches SW11 and SW12 are first turned on. At this time, the switch SW13 is also turned on. The voltage $V_i$ (+) is inputted to the node N11, the set voltage $V_{A2}$ is inputted to the node N12, the voltage $V_i$ (−) is inputted to the node N21, and the set voltage $V_{A2}$ is inputted to the node N22. Consequently, potentials at the nodes NO1 and NO2 are ground potentials $V_G$.

The switches SW11 and SW12 are then turned off. At this time, the switch SW13 is also turned off. The set voltage $V_{A1}$ is inputted to the node N11, the voltage VDA (+) is inputted to the node N12, the set voltage $V_{A1}$ is inputted to the node N21, and the voltage VDA (−) is inputted to the node N22. Consequently, voltages at the nodes NO1 and NO2 are respectively $V_O$ (+) and $V_O$ (−).

When the voltages $V_O$ (+) and $V_O$ (−) at the nodes NO1 and NO2 are found from the principle of conservation of charge, the following equation is obtained:

$$V_O(+)=V_G+\{V_1(+)-VDA(+)\}K+(V_{A1}-V_{A2})K$$
$$V_O(-)=V_G+\{V_1(-)-VDA(-)\}K+(V_{A1}-V_{A2})K$$

Consequently, a differential voltage $\Delta V_O$ is expressed by the following equation:

$$\Delta V_O=V_O(+)=V_O(-)=\{V_i(+)-V_i(-)\}K-\{VDA(+)-VDA(-)\}K=\{\Delta V_i-\Delta VDA\}K$$

In such a way, the subtraction amplification circuit 111 shown in FIG. 40 performs subtraction of a difference voltage $\Delta V_i$ supplied from the preceding stage of circuit and the differential voltage $\Delta VDA$ supplied from the D/A converter 110 in the same stage and amplification of the result of the subtraction.

In this case, the set voltages $V_{A1}$ and $V_{A2}$ can be arbitrarily set. Consequently, a voltage at the time of equalizing outputs from the sample-and-hold circuit 102 or outputs from the subtraction amplification circuit 111 in the preceding stage can be used as the set voltage $V_{A1}$. Further, an external voltage can be used as the set voltage $V_{A2}$.

In such a way, the voltages $V_i$ (+) and $V_i$ (−) which are analog input signals can be respectively inputted to the nodes N11 and N21 without passing through switches. Accordingly, noise is reduced, and a low-voltage operation can be performed. Consequently, it is possible to reduce the voltage of the analog-to-digital conversion circuit 101 and increase the accuracy thereof.

FIG. 42 is a circuit diagram showing the specific structures of the D/A converter 110 and the subtraction amplification circuit 111 shown in FIG. 40 in a case where the subtraction amplification circuit 111 is used in the analog-to-digital conversion circuit 101 shown in FIG. 38. The structures of the D/A converter 110 and the subtraction amplification circuit 111 are disclosed in JP-A-11-88173, for example.

In FIG. 42, a node N30 in the D/A converter 110 is connected to the input terminals of the capacitors B1 to Bn, respectively, through switches S1 to Sn. Further, the node N30 is connected to the input terminals of the capacitors C1 to Cn, respectively, through switches T1 to Tn. The set voltage $V_{A2}$ is inputted to the node N30, the high-potential side reference voltage VRT is inputted to the node N31, and the low-potential side reference voltage VRB is inputted to the node N32. The output terminals of the capacitors B1 to Bn are connected to the node Na in the subtraction amplification circuit 111, and the output terminals of the capacitors C1 to Cn are connected to the node Nb in the subtraction amplification circuit 111.

The node Na in the subtraction amplification circuit 111 is connected to the node N11 through the capacitor 30a, and the node Nb is connected to the node N21 through the capacitor 30b. The voltage $V_i$ (+) is inputted to the node N11, and the voltage $V_i$ (−) is inputted to the node N21.

The capacitance values of the capacitors 20a and 20b are respectively C, and the capacitance values of the capacitors 30a and 30b are respectively KC. Further, the capacitance values of the capacitors B1 to Bn and C1 to Cn are respectively KC/n. K is a constant.

The operations of the D/A converter 110 and the subtraction amplification circuit 111 shown in FIG. 42 will be then described.

The switches SW11 and SW12 are first turned on. At this time, the switch SW13 is also turned on. The switches S1 to Sn and T1 to Tn are turned on. Consequently, a set voltage $V_{A2}$ is inputted to the input terminals of the capacitors B1 to Bn and C1 to Cn. Further, the voltage $V_i$ (+) is inputted to the node N11, and the voltage $V_i$ (−) is inputted to the node N21. Consequently, potentials at the nodes NO1 and NO2 are ground potentials.

The switches SW11 and SW12 are then turned off. At this time, the switch SW13 is also turned off. The switches S1 to Sn and T1 to Tn are turned off. The switches E1 to En, F1 to Fn, G1 to Gn, and H1 to Hn are respectively turned on or off in accordance with the output levels of the comparators D1 to Dn shown in FIG. 38, and voltages are respectively applied to the input terminals of the capacitors B1 to Bn and C1 to Cn.

At this time, both the voltages $V_i$ (+) and $V_i$ (−) inputted to the nodes N11 and N21 are equalized to the equal voltage $V_{A1}$, as shown in FIG. 41. Consequently, the difference voltage $\Delta V_O$ between the nodes NO1 and NO2 is expressed by the following equation, as described using FIG. 41:

$$\Delta V_O=V_O(+)-V_O(-)=(\Delta V_i-\Delta VDA)K$$

An output from the subtraction amplification circuit 111 in the preceding stage can be thus used as the set voltage $V_{A1}$ inputted to the nodes N11 and N21. Accordingly, the voltage $V_i$ (+) and the set voltage $V_{A1}$ can be inputted to the node N11 without using a switch, and the voltage $V_i$ (−) and the set voltage $V_{A1}$ can be inputted to the node N21 without using a switch.

Furthermore, an arbitrary voltage can be used as the set voltage $V_{A2}$ inputted to the node N30. For example, the high-potential side reference voltage VRT or the low-potential side reference voltage VRB can be also used as the set voltage $V_{A2}$.

Furthermore, the set voltages $V_{A1}$ and $V_{A2}$ can be set in the vicinity of a power supply voltage or a ground voltage. Consequently, a low-voltage operation can be performed even if a CMOS switch is employed.

As a result, a high-accuracy analog-to-digital conversion circuit that causes switch noise to be reduced and can perform a low-voltage operation is realized.

In recent years, the further increase in the conversion speed has been also demanded for the analog-to-digital conversion circuit with the increase in speed of electronic equipment. Therefore, an analog-to-digital conversion circuit whose conversion speed is further increased is proposed in JP-A-11-88172.

FIG. 43 is a block diagram showing a conventional analog-to-digital conversion circuit disclosed in JP-A-11-88172. The analog-to-digital conversion circuit 102 shown in FIG. 43 has a 10-bit four-stage pipeline structure.

In FIG. 43, the analog-to-digital conversion circuit 102 comprises a sample-and-hold circuit 2, a first-stage circuit 3, a second-stage circuit 4, a third-stage circuit 5, a fourth-stage circuit 6, a plurality of latch circuits 7, and an output circuit 8.

Each of the first (initial)- to third-stage circuits 3 to 5 comprises a sub-A/D converter 9, a D/A converter 10, an operational amplification circuit 11, a subtraction circuit 12, an operational amplification circuit 13, and a subtraction amplification circuit 14. The subtraction circuit 12 and the operational amplifier circuit 13 constitute a subtraction amplification circuit 14. The gain of each of the operational amplification circuits 11 and 13 in each of the circuits 3 to 5 is two. The fourth (final)-stage circuit 6 comprises only a sub-A/D converter 9.

In the analog-to-digital conversion circuit 102 shown in FIG. 43, the operational amplification circuits 11 and 13 in two stages are provided in each of the first- to third-stage circuits 3 to 5. Accordingly, the loop constant of each of the operational amplification circuits 11 and 13 can be reduced, and the load capacitance of each of the operational amplification circuits 11 and 13 is reduced. As a result, the conversion speed can be increased without improving the performance of each of the operational amplification circuits 11 and 13.

In the analog-to-digital conversion circuit 102 shown in FIG. 43, however, the analog input signal is amplified with the gain 2 by the operational amplification circuit 11 in each of the first- to third-stage circuits 3 to 5. When the input voltage range of the sub-A/D converter 9 and the output voltage range of the D/A converter 10 are set to the same value, therefore, the range of an output voltage supplied to one of input terminals of the subtraction amplification circuit 14 from the operation amplification circuit 11 and the range of an output voltage supplied to the other input terminal of the subtraction amplification circuit 14 from the D/A converter 10 differ from each other. In this case, the output voltage range of the operational amplification circuit 11 and the output voltage range of the D/A converter 10 must be corrected in any method such that they coincide with each other. Consequently, the structure of each of the circuits 3 to 5 in the analog-to-digital conversion circuit 102 becomes complicated, and the circuit scale thereof is increased.

The first-stage circuit 3 has a four-bit configuration, and each of the second- to fourth-stage circuits 4 to 6 has a 2-bit configuration. In each of the first- to third-stage circuits 3 to 5, the respective numbers of bits (bit configurations) of the sub-A/D converter 9 and the D/A converter 10 are set to the same value.

In the above-mentioned analog-to-digital conversion circuit 102, when the voltage range of an analog input signal Vin is set to $VIN_{p\text{-}p}$, the full-scale range of the sub-A/D converter 9 in the first-stage circuit 3 is equal to the voltage range $VIN_{p\text{-}p}$ of the analog input signal Vin. The full-scale ranges of the sub-A/D converters 9 in the second- to fourth-stage circuits 4 to 6 are respectively equal to the output voltage ranges $VIN_{p\text{-}p}/8$ of the subtraction amplification circuits 14 in the first- to third-stage circuits 3 to 5.

The full-scale range of the D/A converter 10 in the first-stage circuit 3 is equal to the voltage range $VIN_{p\text{-}p}$ of the analog input signal Vin, similarly to that of the sub-A/D converter 9. The full-scale ranges of the D/A converters 10 in the second- and third-stage circuits 4 and 5 are $VIN_{p\text{-}p}/4$ which is twice the full-scale range of the sub-A/D converter 9 in order to be matched with the output voltage range of the operational amplification circuit 11 having the gain 2.

The operations of the analog-to-digital conversion circuit 102 shown in FIG. 43 will be then described. The sample-and-hold circuit 2 samples the analog input signal Vin, and holds the sampled analog input signal for a predetermined time period. The analog input signal Vin outputted from the sample-and-hold circuit 2 is transferred to the first-stage circuit 3.

In the first-stage circuit 3, the sub-A/D converter 9 subjects the analog input signal Vin at a voltage range $VIN_{p\text{-}p}$ to A/D conversion. The full-scale range of the sub-A/D converter 9 is $VIN_{p\text{-}p}$, as described above. A digital output ($2^9$, $2^8$, $2^7$, $2^6$), which is the result of the A/D conversion by the sub-A/D converter 9, is transferred to the D/A converter 10, and is also transferred to the output circuit 8 through the four latch circuits 7. The normal output voltage range of the D/A converter 10 is expressed by the following equation:

(resolution in first stage-1)×(full-scale range of D/A converter 10)/(resolution in first stage)=$(2^4-1)\times(VIN_{p\text{-}p})/2^4=15VIN_{p\text{-}p}/16$ On the other hand, the operational amplification circuit 11 samples, amplifies and holds the analog input signal Vin. The output voltage range of the operational amplification circuit 11 is expressed by the following equation:

(voltage range $VIN_{p\text{-}p}$ of analog input signal Vin)×(gain of operational amplification circuit 11)=$VIN_{p\text{-}p}\times 1=VIN_{p\text{-}p}$ The subtraction amplification circuit 14 subtracts the analog input signal Vin outputted from the operational amplification circuit 11 and the result of the D/A conversion by the D/A converter 10, and amplifies the result of the subtraction. An output from the subtraction amplification circuit 14 is transferred to the second-stage circuit 4. The output voltage range of the subtraction amplification circuit 14 in the first stage is expressed by the following equation:

((output voltage range of operational amplification circuit 11)−(normal output voltage range of D/A converter 10))×(gain of subtraction amplification circuit 14)=$((VIN_{p\text{-}p})-(15VIN_{p\text{-}p}/16))\times 2=VIN_{p\text{-}p}/8$ In the second-stage circuit 4, the sub-A/D converter 9 subjects the output from the subtraction amplification circuit 14 to A/D conversion. The result of the A/D conversion by the sub-A/D converter 9 is transferred to the D/A converter 10, and is also transferred to the output circuit 8 through the three latch circuits 7. Consequently, an intermediate high order 2-bit digital output ($2^5$, $2^4$) is obtained from the second-stage circuit 4. The normal output voltage range of the D/A converter 10 is expressed by the following equation:

(resolution in second stage-1)×(full-scale range of D/A converter 10)/(resolution in second stage)=$(2^2-1)\times(VIN_{p\text{-}p}/4)/2^4=3VIN_{p\text{-}p}/16$ On the other hand, the operational amplification circuit 11 amplifies an output from the operational amplification circuit 13 in the first-stage circuit 3. The output voltage range of the operational amplification circuit 11 is expressed by the following equation:

(output voltage range of subtraction amplification circuit 14 in first stage)×(gain of operational amplification circuit 11)=$(VIN_{p\text{-}p}/8)\times 2=VIN_{p\text{-}p}/4$ The subtraction amplification circuit 14 subtracts the output from the operational amplification circuit 11 and the result of the D/A conversion by the D/A converter 10, and amplifies the result of the subtraction. An output from the subtraction amplification circuit 14 is transferred to the third-stage circuit 5. The output voltage range of the subtraction amplification circuit 14 in the second stage is expressed by the following equation:

((output voltage range of operational amplification circuit 11)−(normal output voltage range of D/A converter 10)×(gain of subtraction amplification circuit 14)=$((VIN_{p\text{-}p}/4)-(3VIN_{p\text{-}p}/16))\times 2=VIN_{p\text{-}p}/8$ The third-stage circuit 5 performs the same operations as those of the second-stage circuit 4 with respect to the output from the subtraction amplification circuit 14 in the second-stage circuit 4. Consequently, an intermediate low order 2-bit digital output ($2^3$, $2^2$) is obtained from the third-stage circuit 5. The output voltage range of each of the circuits is the same as that in the second-stage circuit 4.

In the fourth-stage circuit 6, the sub-A/D converter 9 subjects the output from the subtraction amplification circuit 14 in the third-stage circuit 5 to A/D conversion, thereby obtaining a low order 2-bit digital output ($2^1$, $2^0$).

The digital outputs from the first- to fourth-stage circuits 3 to 6 simultaneously reach the output circuit 8 through the respective latch circuits 7. That is, the latch circuits 7 are provided to synchronize the respective digital outputs from the circuits 3 to 6 with each other.

The output circuit 8 outputs a 10-bit digital output Dout of the analog input signal Vin in parallel after digital correction processing, when required.

Even if the number of converted bits thus increases to reduce the LSB (Least Significant Bit) with the decrease in the power supply voltage, the resolution of the sub-A/D converter 9 can be improved, thereby obtaining sufficient conversion accuracy.

FIG. 44(a) is a circuit diagram showing the structure of the subtraction amplification circuit in the analog-to-digital conversion circuit shown in FIG. 23, and FIG. 44(b) is a diagram for explaining the operations of the subtraction amplification circuit shown in FIG. 44(a).

In FIG. 44, an inverse input terminal of an operational amplifier 101 is connected to a node nb, and a non-inverse input terminal thereof is grounded. Further, an output terminal of the operational amplifier 101 is connected to a node no, and is connected to the inverse input terminal through a capacitor 102. A switch SW1 is connected between the inverse input terminal and the non-inverse input terminal of the operational amplifier 101, and a capacitor 103 is connected between the node nb and a node na. The node na is connected to a node n1 through a switch SW2, and is connected to a node n2 through a switch SW3. Each of the switches SW2 and SW3 is generally a CMOS switch composed of a CMOS (Complementary Metal-Oxide Semiconductor) field effect transistor.

A voltage $V_1$ is inputted to the node n1, and a voltage $V_2$ is inputted to the node n2, and a voltage $V_o$ is outputted from the node no.

While referring to FIG. 44(b), the operations of the subtraction amplification circuit shown in FIG. 44(a) will be described. Let C be the capacitance value of the capacitor 101, KC be the capacitance value of the capacitor 103, and $V_G$ be a ground potential. K is a constant.

First, the switch SW1 and the switch SW2 are turned on, and the switch SW3 is turned off. Consequently, a voltage at the node na is $V_1$. Further, a voltage at the node no is zero. At this time, charges Qa at the node nb are expressed by the following equation:

$$Qa=(V_G-V_1)KC$$

After the switch SW1 is then turned off, the switch SW2 is turned off, and the switch SW3 is turned on. Consequently, the voltage at the node na is $V_2$. Further, the voltage at the node no is $V_O$. At this time, the node nb is virtually grounded. Accordingly, charges Qb at the node nb are expressed by the following equation:

$$Qb=(V_G-V_2)KC+(V_G-V_O)C$$

There is no path through which charge flows out at the node nb. Accordingly, Qa=Qb from the principle of conservation of charge. Consequently, the following equation holds:

$$(V_G-V_1)KC=(V_G-V_2)KC+(V_G-V_O)C$$

From the foregoing equation, the voltage $V_O$ at the node no is expressed by the following equation:

$$V_O=V_G+(V_1-V_2)K$$

In such a way, the voltage $V_2$ is subtracted from the voltage $V_1$, and the result of the subtraction is amplified by a factor of K.

Consequently, the subtraction amplification circuit has the function of outputting the difference between the voltage $V_1$ and the voltage $V_2$ with a gain determined by the ratio of the capacitance of the capacitor 103 to the capacitance of the capacitor 102. For example, KC=C(K=1) is set, thereby causing the subtraction amplification circuit to have a sample-and-hold function with a gain of one.

FIG. 45 is a diagram showing the structure of a sub-A/D converter used in the analog-to-digital conversion circuit shown in FIG. 43.

In a parallel-type analog-to-digital converter 9 shown in FIG. 45, a plurality of comparators 900 are arranged. The analog input voltage Vin is supplied to respective one input terminals of the plurality of comparators 900, and reference voltages obtained by dividing a voltage between a high-potential side reference voltage VRT and a low-potential side reference voltage VRB by a plurality of resistors R are respectively supplied to the other input terminals thereof. Each of the comparators 900 compares the voltage at the one input terminal with the voltage at the other input terminal. The result of the comparison by each of the plurality of comparators 900 is encoded by an encoder 910, thereby making it possible to obtain a digital code Dcode.

When the voltage range of the analog input signal fed to the analog-to-digital conversion circuit is changed, or the system of the analog input signal fed to the analog-to-digital conversion circuit is changed between a differential double-ended input and a single ended input, the specification of the analog-to-digital conversion circuit must be changed.

The differential double-ended input and the single-ended input will be herein described. FIGS. 46(a) and 46(b) are diagrams for explaining A/D conversion in the differential double-ended input and the single-ended input. A horizontal axis represents the analog input voltage Vin, and a vertical axis represents the outputted digital code Dcode.

As shown in FIG. 46(a), at the time of the differential double-ended input, a positive side analog input voltage Vin (+) and a negative side analog input voltage Vin (−) of the analog input signal Vin complementarily change. Consequently, the difference between the positive side analog input voltage Vin (+) and the negative side analog input voltage Vin (−) is a voltage range $VIN_{p-p}$ of the analog input signal Vin.

When the positive side analog input voltage Vin (+) changes in a range from 1.0 V to 2.0 V, and the negative side analog input voltage Vin (−) changes in a range from 2.0 V to 1.0 V, as shown in FIG. 46(a), therefore, the voltage range of the analog input signal Vin is 2.0 V from an operation of Vin (+)−Vin (−).

On the other hand, as shown in FIG. 46(b), at the time of the single-ended input, only the positive side analog input voltage Vin (+) changes, as shown in FIG. 46(b). Consequently, the voltage range of the positive side analog input voltage Vin (+) is the voltage range of the analog input signal Vin.

When the positive side analog input voltage Vin (+) changes in a range from 1.0 V to 2.0 V, as shown in FIG. 46(b), therefore, the voltage range of the analog input signal is 1.0 V.

That is, when the voltage range of the analog input signal Vin of the differential double-ended input system is taken as $2VIN_{p-p}$, the voltage range of the analog input signal Vin of the single-ended input system is $VIN_{p-p}$.

In the differential double-ended input system and the single-ended input system, the voltage ranges of the analog input signals thus differ even if the ranges of the changes in the analog input voltages are the same.

In the above-mentioned conventional analog-to-digital conversion circuit, when the voltage range of the analog input signal is changed, or the input system of the analog input signal is changed, the circuit structure must be redesigned.

SUMMARY OF THE INVENTION

An object of the present invention is to provide an analog-to-digital conversion circuit whose conversion speed is increased while keeping high conversion accuracy without complicating the circuit structure and increasing the circuit scale.

Another object of the present invention is to provide a pipeline-type analog-to-digital conversion circuit capable of easily changing the voltage range of an analog input signal or changing an input system between a differential double-ended input and a single-ended input without redesigning the circuit structure.

An analog-to-digital conversion circuit according to an aspect of the present invention has a multi-stage pipeline structure comprising a plurality of stages of circuits, each of the stages of circuits excluding the final-stage circuit comprising an analog-to-digital converter that converts an inputted analog signal into a digital signal, a first operational amplification circuit that amplifies the inputted analog signal, a digital-to-analog converter that converts the digital signal outputted from the analog-to-digital converter into an analog signal, and a second operational amplification circuit that amplifies the difference between the analog signal outputted from the first operational amplification circuit and the analog signal outputted from the digital-to-analog converter. In at least one of the stages of circuits excluding the final-stage circuit, the first operational amplification circuit has a gain larger than one, and the voltage range of the digital-to-analog converter and the voltage range of the analog-to-digital conversion circuit are independently set, respectively, such that the voltage range of the first operational amplification circuit and the voltage range of the digital-to-analog converter are equal to each other.

In the analog-to-digital conversion circuit according to the present invention, even when the operational amplification circuit has the gain larger than one by independently setting the voltage range of the digital-to-analog converter and the voltage range of the analog-to-digital conversion circuit, respectively, the output voltage range of the first operational amplification circuit and the voltage range of the digital-to-analog converter can be made equal to each other. Consequently, the degree of freedom of the design of each of the stages of circuits is increased. Therefore, it is possible to respectively design the analog-to-digital converter, the digital-to-analog converter, the first operational amplification circuit, and the second operational amplification circuit which are constituent elements of each of the stages of circuits at suitable voltage ranges by considering the power consumption and the area occupied by the circuit.

Furthermore, each of the stages of circuits excluding the final-stage circuit comprises the first operational amplification circuit and the second operational amplification circuit. Accordingly, the loop constants of the first operational amplification circuit and the second operational amplification circuit can be reduced, and the load capacitances of the first operational amplification circuit and the second operational amplification circuit are reduced. Consequently, the limit operating frequency of each of the first operational amplification circuit and the second operational amplification circuit is increased. Therefore, it is possible to increase the speed of the conversion operation while keeping high conversion accuracy without improving the performance of each of the first operational amplification circuit and the second operational amplification circuit itself.

As a result, the analog-to-digital conversion circuit whose conversion operation is increased in speed while keeping high conversion accuracy without complicating the circuit structure and increasing the circuit scale.

In at least one of the stages of circuits, the ratio of the voltage range of the digital-to-analog converter to the voltage range of the analog-to-digital conversion circuit may be equal to the gain of the first operational amplification circuit.

In this case, the ratio of the voltage range of the digital-to-analog converter to the voltage range of the analog-to-digital conversion circuit is equal to the gain of the first operational amplification circuit, thereby making it possible to make the voltage range of the first operational amplification circuit and the voltage range of the digital-to-analog converter equal to each other. Consequently, the second operational amplification circuit can amplify the difference between the analog signals at the equal voltage ranges.

In at least one of the stages of circuits, the analog-to-digital converter may operate on the basis of a reference voltage having a first voltage range, the digital-to-analog converter may operate on the basis of a reference voltage having a second voltage range, and the first voltage range and the second voltage range may be independently set, respectively, such that the voltage range of the first operational amplification circuit and the output voltage range of the digital-to-analog converter are equal to each other.

In this case, the analog-to-digital converter operates on the basis of the reference voltage having the first voltage range, the digital-to-analog converter operates on the basis of the reference voltage having the second voltage range, and the first voltage range and the second voltage range are independently set, respectively, thereby making it possible to make the output voltage range of the first operational amplification circuit and the voltage range of the digital-to-analog converter equal to each other.

In at least one of the stages of circuits, the ratio of the second voltage range to the first voltage range may be equal to the gain of the first operational amplification circuit.

In this case, the ratio of the second voltage range to the first voltage range is equal to the gain of the first operational amplification circuit, so that the output voltage range of the first operational amplification circuit and the voltage range of the digital-to-analog converter are equal to each other.

An analog-to-digital conversion circuit according to another aspect of the present invention has a multi-stage pipeline structure comprising a plurality of stages of circuits, each of the stages of circuits excluding the final-stage circuit comprising an analog-to-digital converter that converts an inputted analog signal into a digital signal, a first operational amplification circuit that amplifies the inputted analog signal, a digital-to-analog converter that converts the digital signal outputted from the analog-to-digital converter into an analog signal, and a second operational amplification circuit that amplifies the difference between the analog signal outputted from the first operational amplification circuit and the analog signal outputted from the digital-to-analog converter. In at least one of the stages of circuits excluding the final-stage circuit, the first operational amplification circuit has a gain larger than one, the digital-to-analog converter has a capacitance array to which a plurality of capacitances for generating a voltage of the analog signal corresponding to the digital signal are connected in an array shape, the second operational amplification circuit has an input capacitance, a feedback capacitance, and an operational amplifier, amplifies the analog signal outputted from the first operational amplification circuit with a first gain determined by the value of the input capacitance and the value of the feedback capacitance, amplifies the analog signal generated in the capacitance array by the digital-to-analog converter with a second gain determined by the value of the capacitance array and the value of the feedback capacitance, and outputs the difference between the analog signal amplified with the first gain and the analog signal amplified with the second gain, and the value of the capacitance array and the value of the input capacitance are independently set, respectively, such that the output voltage range of the first operational amplification circuit multiplied by the first gain and the voltage range of the digital-to-analog converter multiplied by the second gain are equal to each other.

In this case, the analog signal outputted from the first operational amplification circuit is amplified with the first gain, and the analog signal outputted from the digital-to-analog converter is amplified with the second gain, so that the difference between the amplified analog signals is outputted. The value of the capacitance array and the value of the input capacitance are independently set, respectively, thereby making it possible to make the output voltage range of the first operational amplification circuit multiplied by the first gain and the voltage range of the digital-to-analog converter multiplied by the second gain equal to each other.

In at least one of the stages of circuits, the ratio of the value of the capacitance array to the value of the input capacitance may be equal to the gain of the first operational amplification circuit.

In this case, the ratio of the value of the capacitance array to the value of the input capacitance is equal to the gain of the first operational amplification circuit, so that the output voltage range of the first operational amplification circuit multiplied by the first gain and the voltage range of the digital-to-analog converter multiplied by the second gain are equal to each other.

In at least one of the stages of circuits, the operational amplifier in the second operational amplification circuit may have one input terminal to which the capacitance array is connected and has the other input terminal and an output terminal, the feedback capacitance in the second operational amplification circuit may be connected between the one input terminal and the output terminal of the operational amplifier, and the input capacitance in the second operational amplification circuit may be connected in parallel with the capacitance array to the one input terminal of the operational amplifier, and second operational amplification circuit may further comprise a switch circuit that brings about a short-circuited state between the one input terminal and the other input terminal of the operational amplifier, and feeds the analog signal outputted from the operational amplifier to an input end of the input capacitance and feeds an arbitrary first set voltage to an input end of the capacitance array, then brings about an opened state between the one input terminal and the other input terminal of the operational amplifier, and feeds an arbitrary second set voltage to the input end of the input capacitance and feeds the analog signal outputted from the digital-to-analog converter to the input end of the capacitance array.

In this case, the analog signal outputted from the first operational amplification circuit is amplified with the first gain, and the analog signal outputted from the digital-to-analog converter is amplified with the second gain. The amplified analog signals are subtracted using the set voltage as a medium without switching the analog signals using a switch, thereby outputting the result of the subtraction. Consequently, noise is reduced, and a low-voltage operation can be performed.

In at least one of the stages of circuits, the set voltage of the second operational amplification circuit may be a predetermined voltage of the analog signal outputted from the first operational amplification circuit.

In this case, no switch or circuit that feeds the set voltage is required, thereby further reducing noise as well as simplifying the circuit structure.

In at least one of the stages of circuits, the first operational amplification circuit may output first and second differential analog signals, the capacitance array of the digital-to-analog converter may comprise first and second capacitance arrays for respectively generating voltages of third and fourth differential analog signals corresponding to the digital signal, the operational amplifier in the second operational amplification circuit may have one input terminal to which the first capacitance array is connected, the other input terminal to which the second capacitance array is connected, one output terminal, and the other output terminal, the feedback capacitance may comprise a first feedback capacitance connected between the one input terminal and the one output terminal of the operational amplifier, and a second feedback capacitance connected between the other input terminal and the other output terminal of the operational amplifier, the input capacitance may comprise a first input capacitance connected in parallel with the first capacitance array to the one input terminal of the operational amplifier and a second input capacitance connected in parallel with the second capacitance array to the other input terminal of the operational amplifier, the differential amplifier may further comprise a switch circuit that connects the one and other input terminals of the operational amplifier to a predetermined reference potential, and respectively feeds the first and second differential analog signals outputted from the first operational amplification circuit to input ends of the first and second input capacitances and respectively feeds an arbitrary first set voltage to input ends of the first and second capacitance arrays, then disconnects the one and other input terminals of the operational amplifier from the reference potential, and respectively feeds an arbitrary second set voltage to the input ends of the first and second input capacitances and respectively feeds third and fourth differential analog signals outputted from the digital-to-analog converter to the input ends of the first and second capacitance arrays, and the value of the first capacitance array and the value of the first input capacitance may be independently set, respectively, such that the output voltage range of the first operational amplification circuit multiplied by the first gain and the voltage range of the digital-to-analog converter multiplied by the second gain are equal to each other.

In this case, the value of the first capacitance array and the value of the first input capacitance are independently set, respectively, and the value of the second capacitance array and the value of the second input capacitance are independently set, respectively, thereby making it possible to make the output voltage range multiplied by the first gain, of the first operational amplification circuit that outputs the differential analog signal and the voltage range multiplied by the second gain, of the digital-to-analog converter that outputs the differential analog signal equal to each other.

In at least one of the stages of circuits, the ratio of the value of the first capacitance array to the value of the first input capacitance may be equal to the gain of the first operational amplification circuit, and the ratio of the second capacitance array to the value of the second input capacitance may be equal to the gain of the first operational amplification circuit.

In this case, the ratio of the value of the first capacitance array to the value of the first input capacitance and the ratio of the value of the second capacitance array to the value of the second input capacitance are equal to the gain of the first operational amplification circuit, thereby making the output voltage range multiplied by the first gain, of the first operational amplification circuit that outputs the differential analog signal and the voltage range multiplied by the second gain, of the digital-to-analog converter that outputs the differential analog signal equal to each other.

In at least one of the stages of circuits, the second set voltage of the second operational amplification circuit may be an output voltage equalized in the first operational amplification circuit.

In this case, no switch or circuit that feeds the second set voltage is required, thereby further reducing noise as well as simplifying the circuit structure.

An analog-to-digital conversion circuit according to still another aspect of the present invention has a multi-stage pipeline structure comprising a plurality of stages of circuits, each of the stages of circuits excluding the final-stage circuit comprising an analog-to-digital converter that converts an inputted analog signal into a digital signal, a first operational amplification circuit that amplifies the inputted analog signal, a digital-to-analog converter that converts the digital signal outputted from the analog-to-digital converter into an analog signal, and a second operational amplification circuit that amplifies the difference between the analog signal outputted from the first operational amplification circuit and the analog signal outputted from the digital-to-analog converter. In at least one of the stages of circuits excluding the final-stage circuit, the operational amplification circuit has a gain larger than one, the analog-to-digital converter operates on the basis of a reference voltage having a first voltage range, and the digital-to-analog converter operates on the basis of a reference voltage having a second voltage range, the digital-to-analog converter has a capacitance array to which a plurality of capacitances for generating a voltage of the analog signal corresponding to the digital signal are connected in an array shape, the second operational amplification circuit has an input capacitance, a feedback capacitance, and a first operational amplifier, amplifies the analog signal outputted from the operational amplification circuit with a first gain determined by the value of the input capacitance and the value of the feedback capacitance, amplifies the analog signal generated in the capacitance array by the digital-to-analog converter with a second gain determined by the value of the capacitance array and the value of the feedback capacitance, and outputs the difference between the analog signal amplified with the first gain and the analog signal amplified with the second gain, and the first voltage range and the second voltage range are independently set, respectively, and the value of the capacitance array and the value of the input capacitance are independently set, respectively, such that the output voltage range of the first operational amplification circuit multiplied by the first gain and the voltage range of the digital-to-analog converter multiplied by the second gain are equal to each other.

In this case, the analog-to-digital converter operates on the basis of the reference voltage having the first voltage range, the digital-to-analog converter operates on the basis of the reference voltage having the second voltage range, the first voltage range and the second voltage range are independently set, respectively, and the value of the capacitance array and the value of the input capacitance are independently set, respectively, thereby making it possible to make the output voltage range of the first operational amplification circuit multiplied by the first gain and the voltage range of the digital-to-analog converter multiplied by the second gain equal to each other.

An analog-to-digital conversion circuit according to still another aspect of the present invention has a multi-stage pipeline structure comprising a plurality of stages of circuits, each of the stages of circuits excluding the final-stage circuit comprising an analog-to-digital converter that converts an inputted analog signal into a digital signal, a digital-to-analog converter that converts the digital signal outputted from the analog-to-digital converter into an analog signal, and a first operational amplification circuit that amplifies the difference between the inputted analog signal and the analog signal outputted from the digital-to-analog converter, the final-stage circuit comprising an analog-to-digital converter that converts the inputted analog signal into a digital signal, at least one of the stages of circuits excluding the final-stage circuit comprising at least one of an analog-to-digital converter having switching means for switching a voltage range among a plurality of ranks, a digital-to-analog converter having switching means for switching a voltage range among a plurality of ranks, and a first operational amplification circuit having switching means for switching a gain among a plurality of values, and/or the final-stage circuit comprising an analog-to-digital converter having switching means for switching a voltage range among a plurality of ranks.

In the analog-to-digital conversion circuit according to the present invention, at least one of the stages of circuits excluding the final-stage circuit comprises at least one of the analog-to-digital converter having the switching means for switching the voltage range among the plurality of ranks, the digital-to-analog converter having the switching means for switching the voltage range among the plurality of ranks, and the first operational amplification circuit having the switching means for switching the gain among the plurality of values, and/or the final-stage circuit comprises the analog-to-digital converter having the switching means for switching the voltage range among the plurality of ranks, thereby making it possible to switch at least one of the voltage range of the analog-to-digital conversion circuit, the voltage range of the digital-to-analog converter, and the gain of the first operational amplification circuit.

Even if the voltage range of the analog input signal is changed by changing the differential double-ended input system to the single-ended input system, therefore, the circuit structure need not be redesigned. Further, even when the voltage range of the analog input signal of the single-ended input system is changed, or the voltage range of the analog input signal of the differential double-ended input system is changed, the circuit structure need not be redesigned.

Consequently, it is possible to easily change the voltage range of the analog input signal or change the input system between the differential double-ended input and the single-ended input without redesigning the circuit structure.

As a result, it is possible to shorten a period during which the analog-to-digital conversion circuit is developed as well as easily reduce the power consumption by optimizing the voltage range.

Each of the stages of circuits excluding the final-stage circuit may further comprise a second operational amplification circuit that amplifies the inputted analog signal and feeds the amplified analog signal to the first operational amplification circuit, and the second operational amplification circuit in at least one of the stages of circuits excluding the final-stage circuit may have switching means for switching a gain among a plurality of values.

In this case, the gain of the second operational amplification circuit in at least one of the stages of circuits is switched among the plurality of values, thereby making it possible to easily change the voltage range of the analog input signal or easily change the input system between the differential double-ended input and the single-ended input without redesigning the circuit structure.

The first operational amplification circuit in at least one of the stages of circuits excluding the final-stage circuit may have switching means for switching a gain among a plurality of values.

In this case, the gain of the first operational amplification circuit in at least one of the stages of circuits is switched among the plurality of values, thereby making it possible to easily change the voltage range of the analog input signal or change the input system between the differential double-ended input and the single-ended input without redesigning the circuit structure.

The analog-to-digital converter in at least one of the stages of circuits may have switching means for switching a voltage range among a plurality of ranks.

In this case, the voltage range of the analog-to-digital converter in at least one of the stages of circuits can be switched among the plurality of ranks, thereby making it possible to easily change the voltage range of the analog input signal or change the input system between the differential double-ended input and the single-ended input without redesigning the circuit structure.

The digital-to-analog converter in at least one of the stages of circuits excluding the final-stage circuit may have switching means for switching a voltage range among a plurality of ranks.

In this case, the voltage range of the digital-to-analog converter in at least one of the stages of circuits is switched among the plurality of ranks, thereby making it possible to easily change the voltage range of the analog input signal or change the input system between the differential double-ended input and the single-ended input without redesigning the circuit structure.

The second operational amplification circuit in at least one of the stages of circuits may have an input capacitance, a feedback capacitance, and an operational amplifier, and amplify the inputted analog signal with a gain determined by the value of the input capacitance and the value of the feedback capacitance, and the switching means may comprise a variable part that variably sets at least one of the value of the input capacitance and the value of the feedback capacitance.

In this case, the inputted analog signal is amplified with the gain determined by the value of the input capacitance and the value of the feedback capacitance. Consequently, at least one of the value of the input capacitance of the operational amplifier and the value of the feedback capacitance is changed, thereby making it possible to easily switch the gain of the second operational amplification circuit.

The variable part may comprise a switching part that switches part of the input capacitance or the feedback capacitance to a separated state or a short-circuited state.

In this case, part of the input capacitance or the feedback capacitance is switched to the separated state or the short-circuited state by the switching part, thereby making it possible to change the input capacitance or the feedback capacitance of the operational amplifier. Consequently, it is possible to easily switch the gain of the second operational amplification circuit.

The first operational amplification circuit in at least one of the stages of circuits may have an input capacitance, a feedback capacitance, and an operational amplifier, and amplify the inputted analog signal with a gain determined by the value of the input capacitance and the value of the feedback capacitance, and the switching means may comprise a variable part that variably sets at least one of the value of the input capacitance and the value of the feedback capacitance.

In this case, the inputted analog signal is amplified with the gain determined by the value of the input capacitance and the value of the feedback capacitance. Consequently, at least one of the value of the input capacitance of the operational amplifier and the value of the feedback capacitance thereof is changed, thereby making it possible to easily switch the gain of the first operational amplification circuit.

The variable part may comprise a switching part that switches part of the input capacitance or the feedback capacitance to a separated state or a short-circuited state.

In this case, part of the input capacitance or the feedback capacitance is switched to the separated state or the short-circuited state by the switching part, thereby making it possible to change the input capacitance or the feedback capacitance of the operational amplifier. Consequently, it is possible to easily switch the gain of the first operational amplification circuit.

The feedback capacitance may comprise first and second capacitances provided in parallel or in series between the input terminal and the output terminal of the operational amplifier, and the switching part may be connected in series or in parallel with the second capacitance.

When the switching part is brought into the connected state, the first and second capacitances are connected in parallel or in series between the input terminal and the output terminal of the operational amplifier. Consequently, the feedback capacitance increases or decreases. Further, when the switching part is brought into the disconnected state, only the first capacitance is connected between the input terminal and the output terminal of the operational amplifier. Consequently, the feedback capacitance decreases or increases.

The switching part may be connected to the output terminal of the operational amplifier.

In a case where the second capacitance is connected to the output side of the switching part, even if the switching part is set to the disconnected state, the parasitic capacitance of the second capacitance is charged. Consequently, the parasitic capacitance must be considered at the time of setting the gain, so that the gain varies depending on the variation in the parasitic capacitance. When the switching part is set to the disconnected state by being connected to the output side of the second capacitance, the second capacitance, together with the parasitic capacitance, is separated from the output terminal by the switching part. Consequently, the parasitic capacitance of the second capacitance need not be considered when the gain is set, so that the gain does not vary depending on the variation in the parasitic capacitance.

The input capacitance may be provided in parallel or in series with the input terminal of the operational amplifier.

When the switching part is brought into the connected state, the first and second capacitances are connected in parallel or in series with the input terminal of the operational amplifier. Consequently, the input capacitance increases or decreases. On the other hand, when the switching part is brought into the disconnected state, only the first capacitance is connected to the input terminal of the operational amplifier. Consequently, the input capacitance decreases or increases.

The switching part may be connected to the input side of the second capacitance.

In a case where the second capacitance is connected to the input side of the switching part, when the switching part is set to the disconnected state, the parasitic capacitance of the second capacitance is charged. When the gain is set, therefore, the parasitic capacitance must be considered, so that the gain varies depending on the variation in the parasitic capacitance. When the switching part is set to the disconnected state by being connected to the input side of the second capacitance, the second capacitance, together with the parasitic capacitance, is separated from the node receiving the input signal by the switching part. Consequently, the parasitic capacitance of the second capacitance need not be considered when the gain is set, so that the gain does not vary depending on the variation in the parasitic capacitance.

The analog-to-digital converter in at least one of the stages of circuits may comprise a reference voltage generation circuit that generates a plurality of reference voltages, and a plurality of comparators that compare the plurality of reference voltages generated by the reference voltage generation circuit with the inputted analog signal, and the switching means may comprise a variable part that variably sets the plurality of reference voltages generated by the reference voltage generation circuit.

In this case, the reference voltage generated by the reference voltage generation circuit is changed, thereby making it possible to change the voltage range of the reference voltage. Consequently, it is possible to easily switch the voltage range of the analog-to-digital converter.

The digital-to-analog converter in at least one of the stages of circuits excluding the final-stage circuit may comprise a reference voltage generation circuit that generates a reference voltage, a plurality of capacitances connected to a common terminal, and a plurality of switches, connected between the reference voltage generation circuit and the plurality of capacitances, which respectively feed the reference voltage generated by the reference voltage generation circuit to the plurality of capacitances in response to an inputted digital signal, and the switching means may comprise a variable part that variably sets the reference voltage generated by the reference voltage generation circuit.

In this case, the reference voltage generated by the reference voltage generation circuit is changed, thereby making it possible to change the voltage range of the reference voltage. Consequently, it is possible to easily switch the voltage range of the digital-to-analog converter.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 15 is a circuit diagram showing the specific structures of a D/A converter and the subtraction amplification circuit shown in FIG. 13 in a case where the subtraction amplification circuit is used in the analog-to-digital conversion circuit shown in FIG. 8;

FIG. 21 is a circuit diagram showing a first example of the specific circuit structure of an operational amplification circuit;

FIG. 23 is a circuit diagram showing a third example of the specific circuit structure of an operational amplification circuit;

FIG. 26 is a circuit diagram showing a sixth example of the specific circuit structure of an operational amplification circuit;

FIG. 29 is a circuit diagram showing a second example of the structure of the sub-A/D converter in the analog-to-digital conversion circuit shown in FIG. 16;

FIG. 34 is a circuit diagram showing a second example of the structure of the subtraction amplification circuit in the analog-to-digital conversion circuit shown in FIG. 18;

FIGS. 46a–b are diagrams for explaining analog-to-digital conversion in a differential double-ended input and a single-ended input.

DESCRIPTION OF THE PREFERRED EMBODIMENTS (1) First Embodiment

Figure 1:
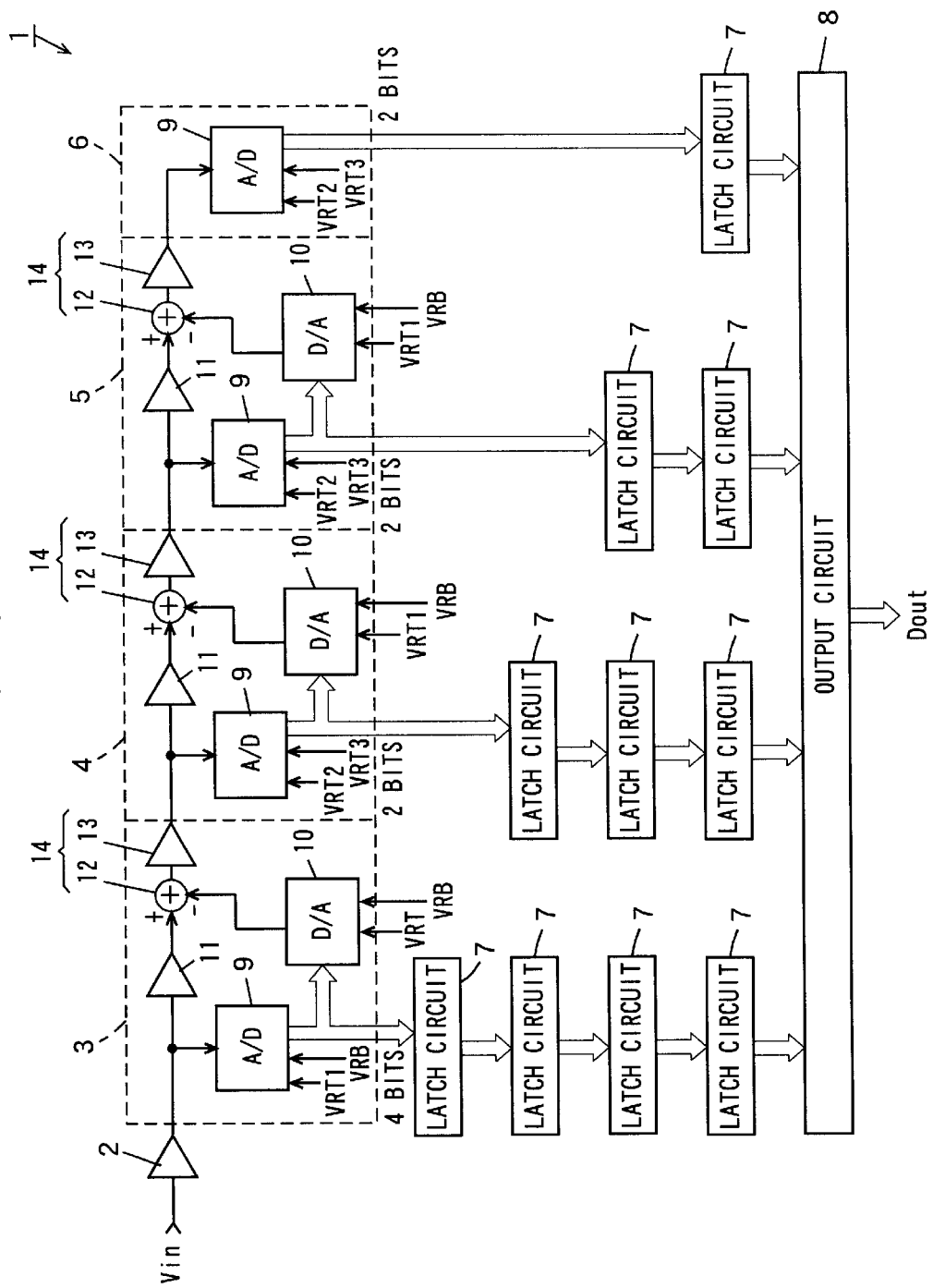
FIG. 1 is a block diagram showing the structure of an analog-to-digital conversion circuit in a first embodiment of the present invention.

FIG. 1 is a block diagram showing the structure of an analog-to-digital conversion circuit 1 in a first embodiment of the present invention. The analog-to-digital conversion circuit 1 shown in FIG. 1 has a 10-bit four-stage pipeline structure.

In FIG. 1, the analog-to-digital conversion circuit 1 comprises a sample-and-hold circuit 2, first- to fourth-stage circuits 3 to 6, a plurality of latch circuits 7, and an output circuit 8.

Each of the first (initial)- to third-stage circuits 3, 4, and 5 comprises a sub-A/D converter 9, a D/A converter 10, an operational amplification circuit 11, a subtraction circuit 12, and an operational amplification circuit 13. The subtraction circuit 12 and the operational amplification circuit 13 constitute a subtraction amplification circuit (a differential amplifier) 14. The gain of each of the operational amplification circuits 11 and 13 in each of the first- to third-stage circuits 3 to 5 is two. The fourth (final)-stage circuit 6 comprises only a sub-A/D converter 9. The subtraction amplification circuit 14 has a known circuit structure disclosed in JP-A-11-88173, for example.

The first-stage circuit 3 has a four-bit configuration, and each of the second- to fourth-stage circuits 4 to 6 has a two-bit configuration. In each of the first- to third-stage circuits 3 to 5, the respective numbers of bits (bit configurations) of the sub-A/D converter 9 and the D/A converter 10 are set to the same value.

A first intermediate reference voltage VRT1 and a low-potential side reference voltage VRB are supplied to the sub-A/D converter 9 in the first-stage circuit 3. A high-potential side reference voltage VRT and a low-potential side reference voltage VRB are supplied to the D/A converter 10 in the first-stage circuit 3. A second intermediate reference voltage VRT2 and a third intermediate reference voltage VRT3 are supplied to the sub-A/D converters 9 in the second- to fourth-stage circuits 3 to 5. A first intermediate reference voltage VRT1 and a low-potential side reference voltage VRB are supplied to the D/A converters 10 in the second- and third-stage circuits 4 and 5.

The first intermediate reference voltage VRT1 is set to a value intermediate between the high-potential side reference voltage VRT and the low-potential side reference voltage VRB, as described later. Consequently, the reference voltage range (the full-scale range of a reference voltage) of the sub-A/D converter 9 in the first-stage circuit 3 is set to one-half the reference voltage range of the D/A converter 10.

The difference between the second intermediate reference voltage VRT2 and the third intermediate reference voltage VRT3 is set to one-half the difference between the first intermediate reference voltage VRT1 and the low-potential side reference voltage VRB. Consequently, the reference voltage range of the sub-A/D converter 9 in each of the second- and third-stage circuits 4 and 5 is set to one-half the reference voltage range of the D/A converter 10.

The operations of the analog-to-digital conversion circuit 1 shown in FIG. 1 will be then described. The sample-and-hold circuit 2 samples an analog input signal Vin, and holds the sampled analog input signal for a predetermined time period. The analog input signal Vin outputted from the sample-and-hold circuit 2 is transferred to the first-stage circuit 3.

In the first-stage circuit 3, the sub-A/D converter 9 subjects the analog input signal Vin to A/D conversion. A high order 4-bit digital output ($2^9$, $2^8$, $2^7$, $2^6$), which is the result of the A/D conversion by the sub-A/D converter 9, is transferred to the D/A converter 10, and is also transferred to the output circuit 8 through the four latch circuits 7. The D/A converter 10 converts the high order 4-bit digital output, which is the result of the A/D conversion by the sub-A/D converter 9, into an analog signal.

On the other hand, the operational amplification circuit 11 amplifies the analog input signal Vin. The subtraction circuit 12 subtracts the analog input signal Vin outputted from the operational amplification circuit 11 and the result of D/A conversion by the D/A converter 10. The operational amplification circuit 13 amplifies an output from the subtraction circuit 12. An output from the operational amplification circuit 13 is transferred to the second-stage circuit 4.

In the second-stage circuit 4, the sub-A/D converter 9 subjects the output from the operational amplification circuit 13 in the first-stage circuit 3 to A/D conversion. The result of the A/D conversion by the sub-A/D converter 9 is transferred to the D/A converter 10, and is also transferred to the output circuit 8 through the three latch circuits 7. Consequently, an intermediate high order 2-bit digital output ($2^5$, $2^4$) is obtained from the second-stage circuit 4.

On the other hand, the operational amplification circuit 11 amplifies the output from the operational amplification circuit 13 in the first-stage circuit 3. The subtraction circuit 12 subtracts the output from the operational amplification circuit 11 and the result of D/A conversion by the D/A converter 10. The operational amplification circuit 13 amplifies the output from the subtraction circuit 12. The output from the operational amplification circuit 13 is transferred to the third-stage circuit 5.

The third-stage circuit 5 performs the same operations as those of the second-stage circuit 4 with respect to the output from the operational amplification circuit 13 in the second-stage circuit 4. Consequently, an intermediate low order 2-bit digital output ($2^3$, $2^2$) is obtained from the third-stage circuit 5.

In the fourth-stage circuit 6, the sub-A/D converter 9 subjects the output from the operational amplification circuit 13 in the third-stage circuit 5 to A/D conversion, thereby obtaining a low order 2-bit digital output ($2^1$, $2^0$).

The digital outputs from the first- to fourth-stage circuits 3 to 6 simultaneously reach the output circuit 8 through the respective latch circuits 7. That is, the latch circuits 7 are provided to synchronize the respective digital outputs from the circuits 3 to 6 with each other.

The output circuit 8 outputs a 10-bit digital output Dout of the analog input signal Vin in parallel after digital correction processing, when required.

As described in the foregoing, in the analog-to-digital conversion circuit 1 in the present embodiment, the reference voltage range of the D/A converter 10 in each of the first- to third-stage circuits 3 to 5 is set to two times the reference voltage range of the sub-A/D converter 9. Accordingly, the output voltage range (the full-scale range of an output voltage) of the D/A converter 10 in each of the circuits 3 to 5 is two times the input voltage range (the full-scale range of an input voltage) of the sub-A/D converter 9. Consequently, the output voltage range of the operational amplification circuit 11 having a gain 2 and the output voltage range of the D/A converter 10 coincide with each other. Consequently, the subtraction amplification circuit 14 can amplify the difference between analog signals at the same output voltage range without complicating the circuit structure of each of the circuits 3 to 5 and increasing the circuit scale thereof.

Since the operational amplification circuits 11 and 13 in two stages are provided in each of the first- to third-stage circuits 3 to 5, the loop constant of each of the operational amplification circuits 11 and 13 can be reduced, and the load capacitance of each of the operational amplification circuits 11 and 13 is reduced. As a result, it is possible to increase the conversion speed without improving the performance of each of the operational amplification circuits 11 and 13.

Furthermore, the initial-stage circuit 3 has a 4-bit configuration, and each of the second- to final-stage circuits 4 to 6 has a 2-bit configuration, so that the analog-to-digital conversion circuit 1 has a 4-2-2-2-configuraiton, thereby obtaining high conversion accuracy (see JP-A-9-69776, for example).

Although in the present embodiment, the respective gains of the operational amplification circuits 11 and 13 in each of the first- to third-stage circuits 3 to 5 are two, the gains of the operational amplification circuits 11 and 13 may be respectively set to other values.

Although in the above-mentioned embodiment, the operational amplification circuits 11 and 13 in two stages are provided in each of the first- to third-stage circuits 3 to 5, operational amplification circuits in three or more stages may be provided in each of the circuits.

Figure 2:
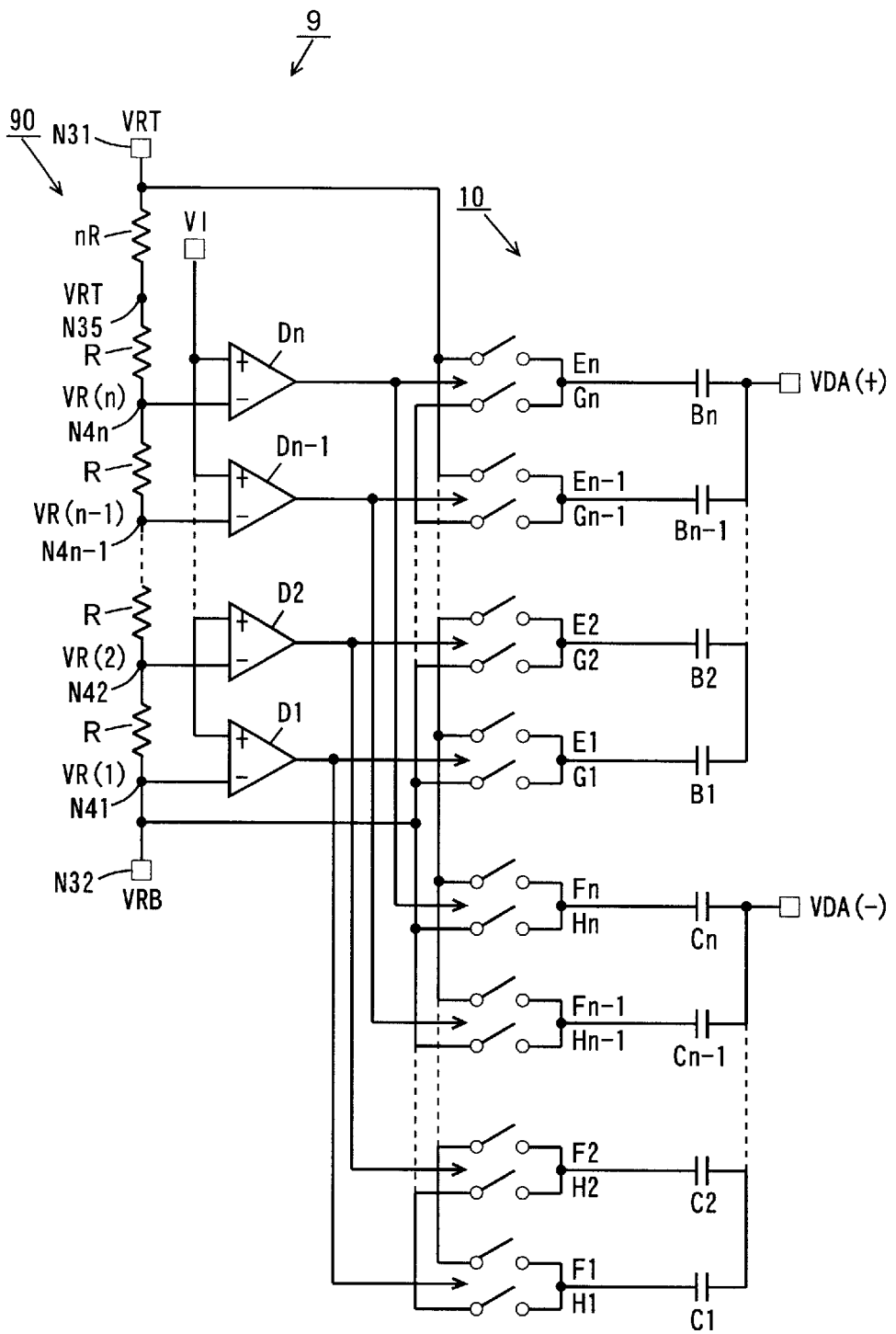
FIG. 2 is a circuit diagram of a sub-A/D converter and a D/A converter in a first-stage circuit in the analog-to-digital conversion circuit shown in FIG. 1.

FIG. 2 is a circuit diagram showing the sub-A/D converter 9 and the D/A converter 10 in the first-stage circuit 3 in the analog-to-digital conversion circuit 1 shown in FIG. 1. The sub-A/D converter 9 is total parallel comparison (flash) system sub-A/D converter, and the D/A converter 10 is a capacitance array system D/A converter.

The sub-A/D converter 9 comprises a resistance circuit 90 that generates a reference voltage and n comparators D1 to Dn. The resistance circuit 90 comprises a resistor nR and n resistors R. The resistor nR has a resistance value which is n times the resistor R, and is connected between a node N31 receiving a high-potential side reference voltage VRT and an intermediate node N35. The n resistors R have the same resistance value, and are connected in series between the intermediate node N35 and a node 32 receiving a low-potential side reference voltage VRB. A first intermediate reference voltage VRT1 which is a voltage intermediate between the high-potential side reference voltage VRT and the low-potential side reference voltage VRB is obtained at the intermediate node N35. Let VR (1) to VR (n) be potentials at nodes N41 to N4n among the n resistors R connected between the node N32 and the intermediate node N35.

An input signal VI (the analog input signal Vin) is inputted to a positive input terminal of each of the comparators D1 to Dn. The potentials VR (1) to VR (n) at the nodes N41 to N4n are respectively applied to negative input terminals of the comparators D1 to Dn.

Consequently, outputs from the comparators D1 to Dn enter a high level when the input signal VI is higher than the potentials VR (1) to VR (n), while entering a low level when the input signal VI is lower than the potentials VR (1) to VR (n).

The D/A converter 10 comprises respective n switches E1 to En, F1 to Fn, G1 to Gn, and H1 to Hn, n positive-side capacitors B1 to Bn, and n negative-side capacitors C1 to Cn which are respectively connected to one another in an array shape.

The capacitors B1 to Bn and C1 to Cn have the same capacitance value c. A differential positive side output voltage VDA (+) is generated from one terminal (hereinafter referred to as an output terminal) of each of the capacitors B1 to Bn, and a differential negative side output voltage VDA (−) is generated from one terminal (hereinafter referred to as an output terminal) of each of the capacitors C1 to Cn. The other terminal of each of the capacitors B1 to Bn and C1 to Cn is referred to as an input terminal.

Respective one terminals of the switches E1 to En are connected to the node N31, and the other terminals thereof are respectively connected to the input terminals of the capacitors B1 to Bn. Respective one terminals of the switches F1 to Fn are connected to the node N31, and the other terminals thereof are respectively connected to the input terminals of the capacitors C1 to Cn. Respective one terminals of the switches G1 to Gn are connected to the node N32, and the other terminals thereof are respectively connected to the input terminals of the capacitors B1 to Bn. Respective one terminals of the switches H1 to Hn are connected to the node N32, and the other terminals thereof are respectively connected to the input terminals of the capacitors C1 to Cn.

The switches E1 to En, F1 to Fn, G1 to Gn, and H1 to Hn constitute four series of switches. For example, the switches E1, F1, G1, and H1 constitute one series of switches, and the switches En, Fn, Gn, and Hn constitute one series of switches. The switches E1 to En, F1 to Fn, G1 to Gn, and H1 to Hn respectively perform on-off operations in accordance with the output levels of the comparators D1 to Dn. For example, when the output from the comparator Dn is at a high level, the switches En and Hn are turned on, and the switches Gn and Fn are turned off. Conversely, when the output from the comparator Dn is at a low level, the switches En and Hn are turned off, and the switches Gn and Fn are turned on.

The operations of the D/A converter 10 will be then described. In the initial conditions, both potentials at the input terminal and the output terminal of each of the capacitors B1 to Bn are zero volt, and all the switches E1 to En, F1 to Fn, G1 to Gn, and H1 to Hn are turned off. In the initial conditions, therefore, the quantity of charges (electricity) Q1 stored in all the capacitors B1 to Bn and C1 to Cn is zero.

When outputs from m of the n comparators D1 to Dn enter a high level, m of the switches E1 to En are turned on and the (n−m) switches are turned off, and (n−m) of the switches G1 to Gn are turned on and the m switches are turned off. Charges Q2 stored in all the capacitors B1 to Bn are expressed by the following equation (A1) in accordance with the on-off operations of the switches E1 to En and G1 to Gn:

$$Q2=m(VRT-VDA(+))c+(n-m)(VRB-VDA(+))c \quad (A1)$$

From the principle of conservation of charge, Q1=Q2. Consequently, the differential positive side output voltage VDA (+) is expressed by the following equation (A2):

$$VDA(+)=VRB+m(VRT-VRB)/n \quad (A2)$$

On the other hand, when the outputs from m of the n comparators D1 to Dn enter a high level, m of the switches H1 to Hn are turned on and the (n−m) switches are turned off, and (n−m) of the switches F1 to Fn are turned on and the m switches are turned off. Charges Q3 stored in all the capacitors C1 to Cn are expressed by the following equation (A3) in accordance with the on-off operations of the switches H1 to Hn and F1 to Fn:

$$Q3=(n-m)(VRT-VDA(-))c+m(VRB-VDA(-))c \quad (A3)$$

From the principle of conservation of charge, Q1=Q3. Consequently, the differential negative side output voltage VDA (−) is expressed by the following equation (A4):

$$VDA(-)=VRT-m(VRT-VRB)/n \quad (A4)$$

From the foregoing equations (A2) and (A4), therefore, a differential voltage ΔVDA is expressed by the following equation (A5):

$$\Delta VDA=VDA(+)-VDA(-)=VRB-VRT+2m(VRT-VRB)/n \quad (A5)$$

In the foregoing example, the reference voltage range RA1 of the sub-A/D converter 9 is in a range between the first intermediate reference voltage VRT1 and the low-potential side reference voltage VRB, and the reference voltage range RD1 of the D/A converter 10 is in a range between the high-potential side reference voltage VRT and the low-potential side reference voltage VRB. Here, 2RA1=RD1.

In this case, the input voltage range of the sub-A/D converter 9 is equal to the reference voltage range RA1, and the output voltage range of the D/A converter 10 is equal to the reference voltage range RD1.

The output voltage range of the D/A converter 10 can be thus two times the input voltage range of the sub-A/D converter 9 by setting the ratio of the reference voltage range RA1 of the sub-A/D converter 9 to the reference voltage range RD1 of the D/A converter 10 to 1:2.

Although in FIG. 2, the structure of the sub-A/D converter 9 for a single input is illustrated in order to make the understanding easy, the sub-A/D converter 9 for a differential input is used in the present embodiment.

Figure 3:
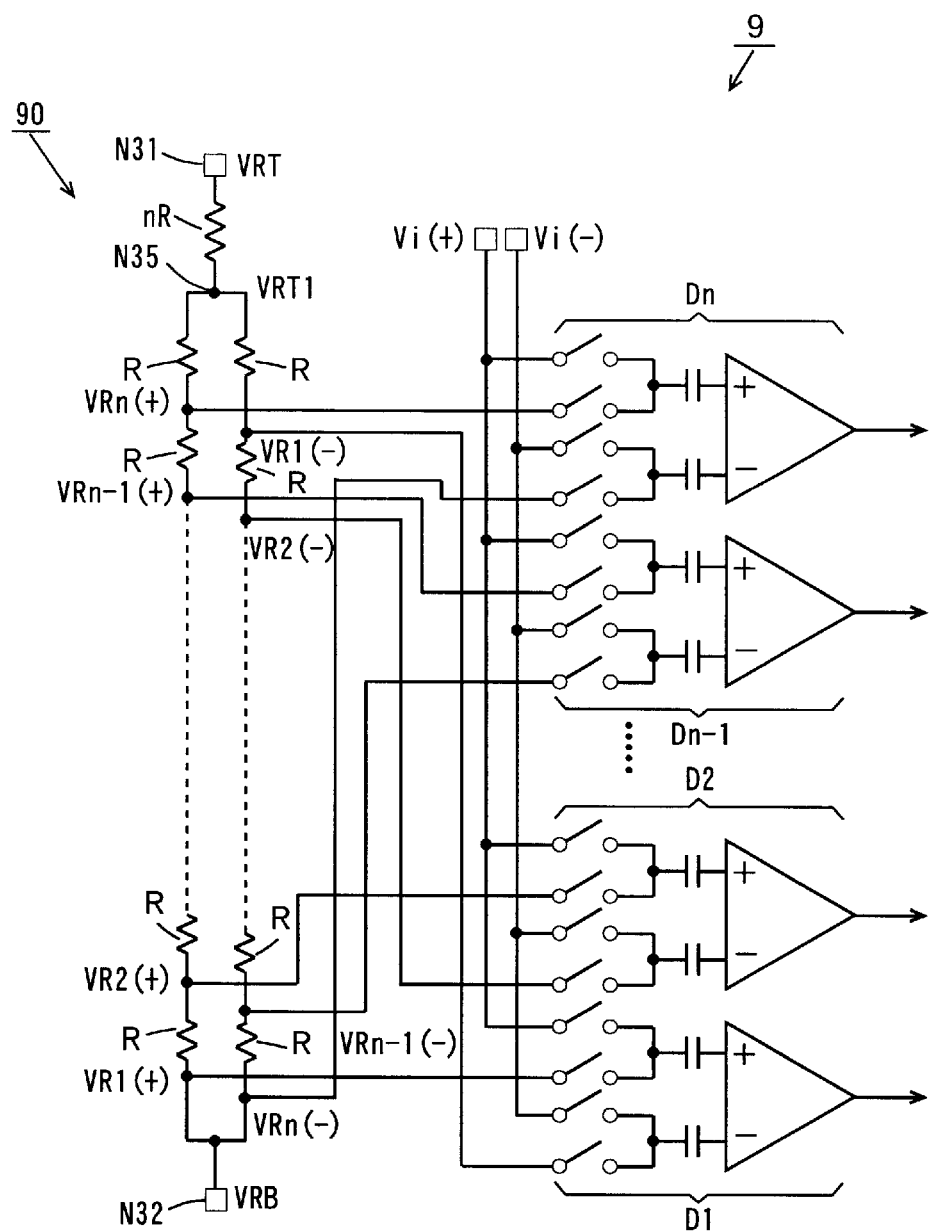
FIG. 3 is a circuit diagram showing the structures of a sub-A/D converter for a differential input and a D/A converter.

FIG. 3 is a circuit diagram showing the structures of the sub-A/D converter 9 for a differential input and the D/A converter 10.

In the sub-A/D converter 9 shown in FIG. 3, a resistor nR is connected between a node N31 receiving a high-potential side reference voltage VRT and an intermediate node N35. Two sets of series connection circuits each comprising n resistors R are connected in parallel between the intermediate node N35 and a node N32 receiving a low-potential side reference voltage VRB. A first intermediate reference voltage VRT1 is obtained from the intermediate node N35.

In one of the series connection circuits between the intermediate node N35 and the node N32, potentials at nodes among the n resistors R are taken as VRn (+) to VR1 (+) in this order. On the other hand, in the other series connection circuit between the intermediate node N35 and the node N32, potentials at nodes among the n resistors R are taken as VR1 (−) to VRn (−) in this order.

One voltage $V_i$ (+) of a differential input signal is supplied to a capacitor connected to a positive input terminal of a comparator D1 through a switch, and the reference voltage VR1 (+) is supplied thereto through a switch. On the other hand, one voltage $V_i$ (−) of the differential input signal is supplied to a capacitor connected to a negative input terminal of the comparator D1 through a switch, and a reference voltage VR1 (−) is supplied thereto through a switch.

In the same way, the one voltage $V_i$ (+) of the differential input signal is supplied to a capacitor connected to a positive input terminal of a comparator Dn through a switch, and the reference voltage VRn (+) is supplied thereto through a switch. On the other hand, the other voltage $V_i$ (−) of the differential input signal is supplied to a capacitor connected to a negative input terminal of the comparator Dn through a switch, and the reference voltage VRn (−) is supplied thereto through a switch.

Figure 4:
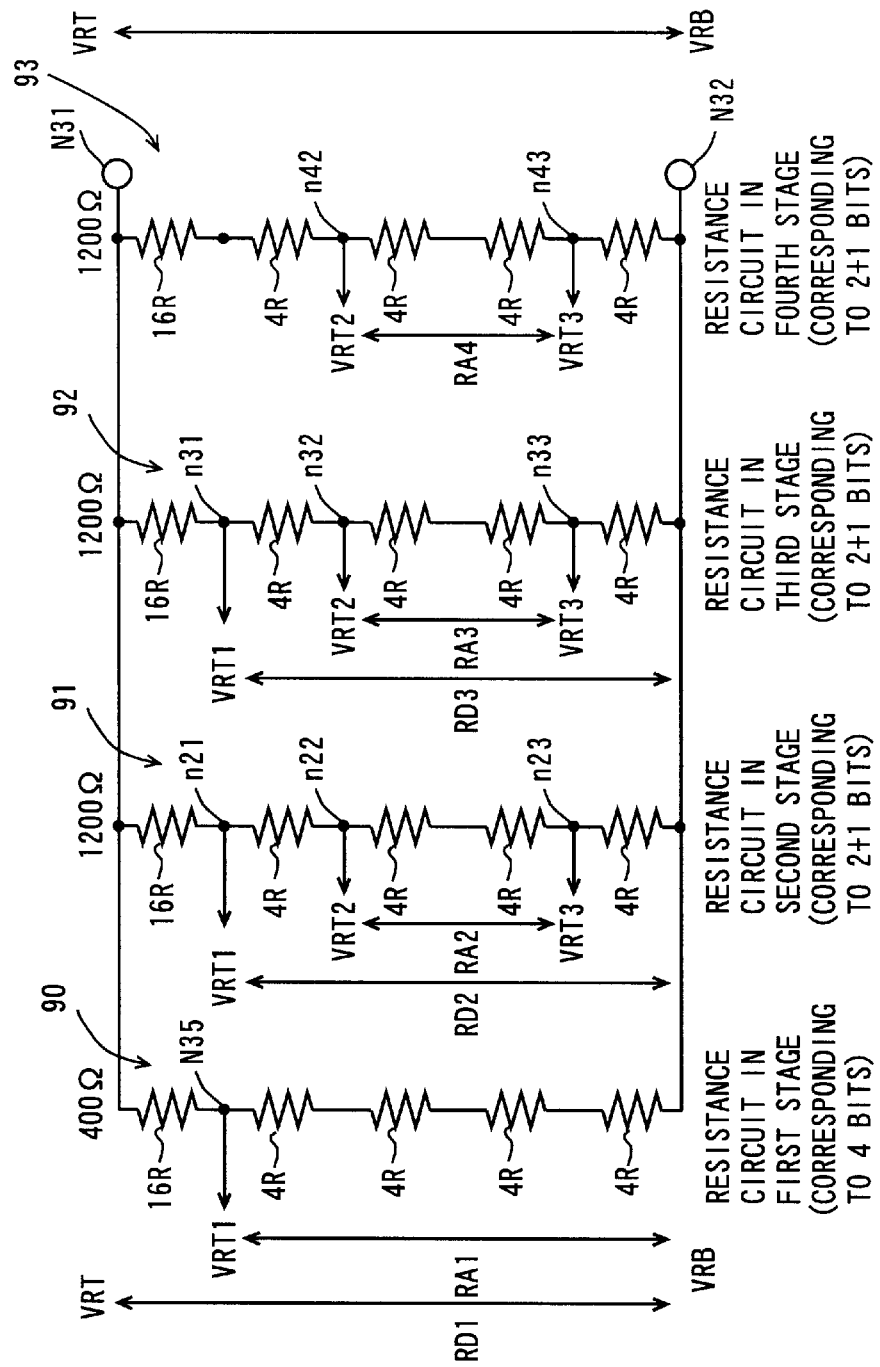
FIG. 4 is a circuit diagram showing resistance circuits in first to fourth stages for respectively generating reference voltages.

FIG. 4 is a circuit diagram showing resistance circuits in the first to fourth stages for respectively generating reference voltages. In this example, n=16.

As shown in FIG. 4, in the resistance circuit 90 in the first stage, a first resistor 16R and second to fifth resistors 4R are connected in series between the node N31 receiving the high-potential side reference voltage VRT and the node N32 receiving the low-potential side reference voltage VRB. The resistor 16R has a resistance value which is four times that of the resistor 4R. The first intermediate reference voltage VRT1 is obtained from the intermediate node N35 between the first resistor 16R and the second resistor 4R. In the first-stage circuit 3, a voltage range between the intermediate node N35 and the node N32 is the reference voltage range RA1 of the sub-A/D converter 9, and a voltage range between the node N31 and the node N32 is the reference voltage range RD1 of the D/A converter 10.

In the resistance circuits 91 and 92 in the second and third stages, a first intermediate reference voltage VRT1 is obtained from nodes n21 and n31 between the first resistor 16R and the second resistor 4R, a second intermediate reference voltage VRT2 is obtained from nodes n22 and n32 between the second resistor 4R and the third resistor 4R, and a third intermediate reference voltage VRT3 is obtained from nodes n23 and n33 between the fourth resistor 4R and the fifth resistor 4R.

In the second- and third-stage circuits 4 and 5, respective voltage ranges between the nodes n22 and n32 and the nodes n23 and n33 are reference voltage ranges RA2 and RA3 of the sub-A/D converter 9, and respective voltage ranges between the nodes n21 and n31 and the node N32 are reference voltage ranges RD2 and RD3 of the D/A converter 10.

In the resistance circuit 93 in the fourth stage, the second intermediate reference voltage VRT2 is obtained from a node n42 between the second resistor 4R and the third resistor 4R, and the third intermediate reference voltage VRT3 is obtained from a node n43 between the fourth resistor 4R and the fifth resistor 4R. In the fourth-stage circuit 6, a voltage range between the node n42 and the node n43 is a reference voltage range RA4 of the sub-A/D converter 9.

For example, the resistance value of the resistance circuit 90 in the first stage is 400 Ω, and the respective resistance values of the resistance circuits 91 to 93 in the second to fourth stages are 1200 Ω.

According to the resistance circuits 90 to 92 shown in FIG. 4, in each of the first- to third-stage circuits 3 to 5, the reference voltage range of the D/A converter 10 is twice the reference voltage range of the sub-A/D converter 9.

It is assumed herein that the difference between the high-potential side reference voltage VRT and the low-potential side reference voltage VRB is one volt. In this case, in single input (single-ended input) processing, the reference voltage range RD1 of the D/A converter 10 in the first stage is one volt, and the reference voltage range RA1 of the sub-A/D converter 9 in the first stage is 0.5 volts. On the other hand, in differential input (double-ended input) processing, the reference voltage range RD1 of the D/A converter 10 in the first stage is 1 V×2=2 V, and the reference voltage range RA1 of the sub-A/D converter 9 in the first stage is 0.5 V×2=1 V.

Figure 5:
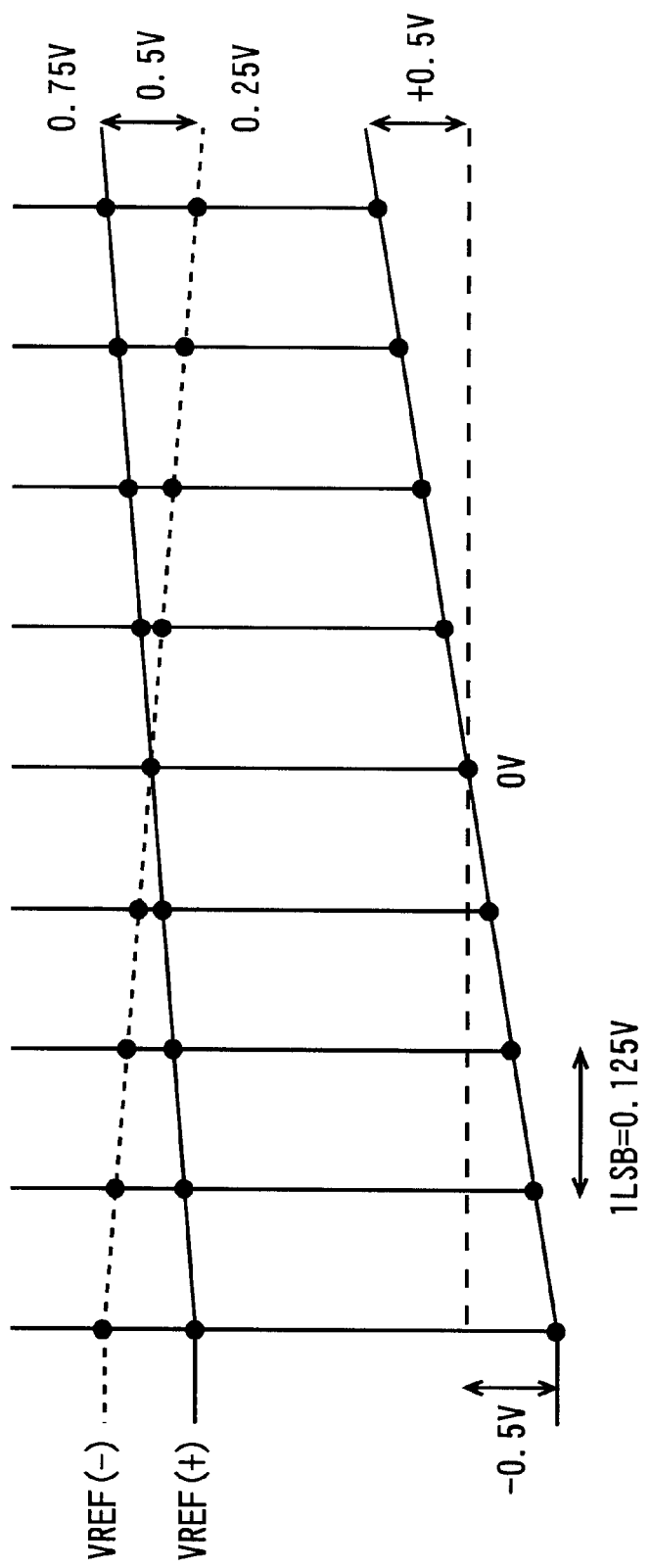
FIG. 5 is a diagram for respectively explaining a reference voltage range for a differential input.

FIG. 5 is a diagram for explaining a reference voltage range for a differential input. In FIG. 5, VREF (+) and VREF (−) are reference voltages for a differential input fed to the sub-A/D converter 9.

The reference voltage VREF (+) changes in a range from 0.25 V to 0.75 V, and the reference voltage VREF (−) changes in a range from 0.75 V to 0.25 V. Consequently, the difference between the reference voltage VREF (+) and the reference voltage VREF (−) changes in a range from −0.5 V to +0.5 V, and the full-scale of the reference voltage range is 1 V.

As described below, in the analog-to-digital conversion circuit 1 in the present embodiment, the ratio of the reference voltage range of the sub-A/D converter 9 to the reference voltage range of the D/A converter 10 is arbitrarily set in each of the first- to third-stage circuits 3 to 5, thereby making it possible to arbitrarily set the gain of the operational amplification circuit 11 and the gain of the operational amplification circuit 13.

Figure 6:
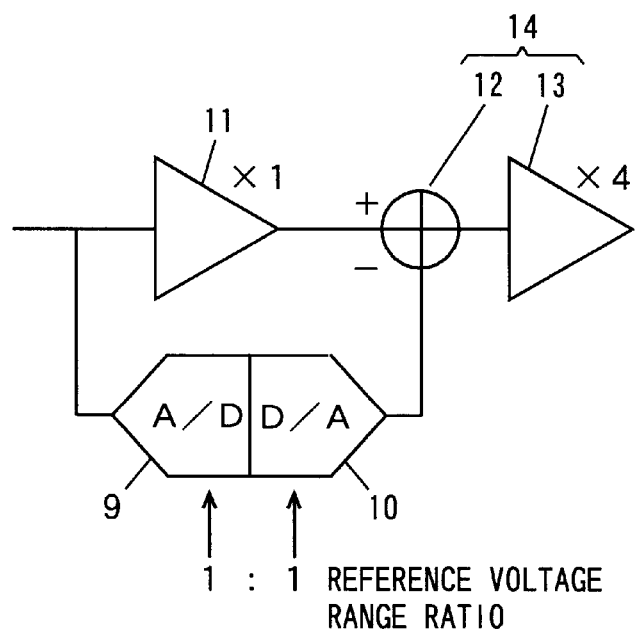
FIG. 6 is a diagram showing the relationship between the ratio of the reference voltage range of a sub-A/D converter to the reference voltage range of a D/A converter and the gain of an operational amplification circuit.
Figure 7:
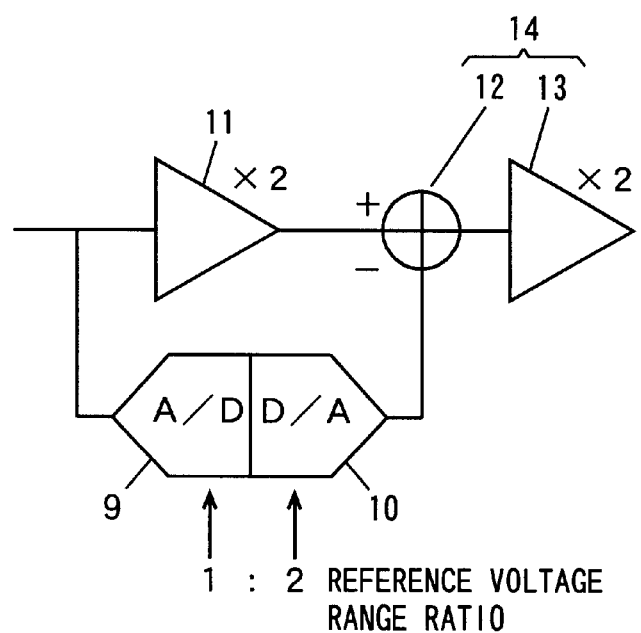
FIG. 7 is a diagram showing the relationship between the ratio of the reference voltage range of a sub-A/D converter to the reference voltage range of a D/A converter and the gain of an operational amplification circuit.

FIGS. 6 and 7 are diagrams showing the relationship between the ratio of the reference voltage range of the sub-A/D converter 9 to the reference voltage range of the D/A converter 10 and the respective gains of the operational amplification circuits 11 and 13.

When the gain of the operational amplification circuit 11 is set to one, and the gain of the operational amplification circuit 13 is set to four, as shown in FIG. 6, the ratio of the reference voltage range of the sub-A/D converter 9 to the reference voltage range of the D/A converter 10 is set to 1:1. Consequently, the output voltage range of the operational amplification circuit 11 and the output voltage range of the D/A converter 10 can coincide with each other.

Furthermore, when the gain of the operational amplification circuit 11 is set to two, and the gain of the operational amplification circuit 13 is set to two, as shown in FIG. 7, the ratio of the reference voltage range of the sub-A/D converter 9 to the reference voltage range of the D/A converter 10 is set to 1:2. Consequently, the output voltage range of the operational amplification circuit 11 and the output voltage range of the D/A converter 10 can coincide with each other.

In the analog-to-digital conversion circuit 1 according to the present embodiment, the reference voltage range of the sub-A/D converter 9 and the reference voltage range of the D/A converter 10 can be independently set, respectively, thereby making it possible to arbitrarily set the gains of the operational amplification circuits 11 and 13. Consequently, the degree of freedom of the design of each of the first- to third-stage circuits 3 to 5 is increased. Therefore, it is possible to respectively design the sub-A/D converter 9, the D/A converter 10, the operational amplification circuit 11, and the subtraction amplification circuit 14 which are constituent elements of each of the first- to third-stage circuits 3 to 5 at suitable voltage ranges by considering the power consumption and the area occupied by the circuit.

(2) Second Embodiment

Figure 8:
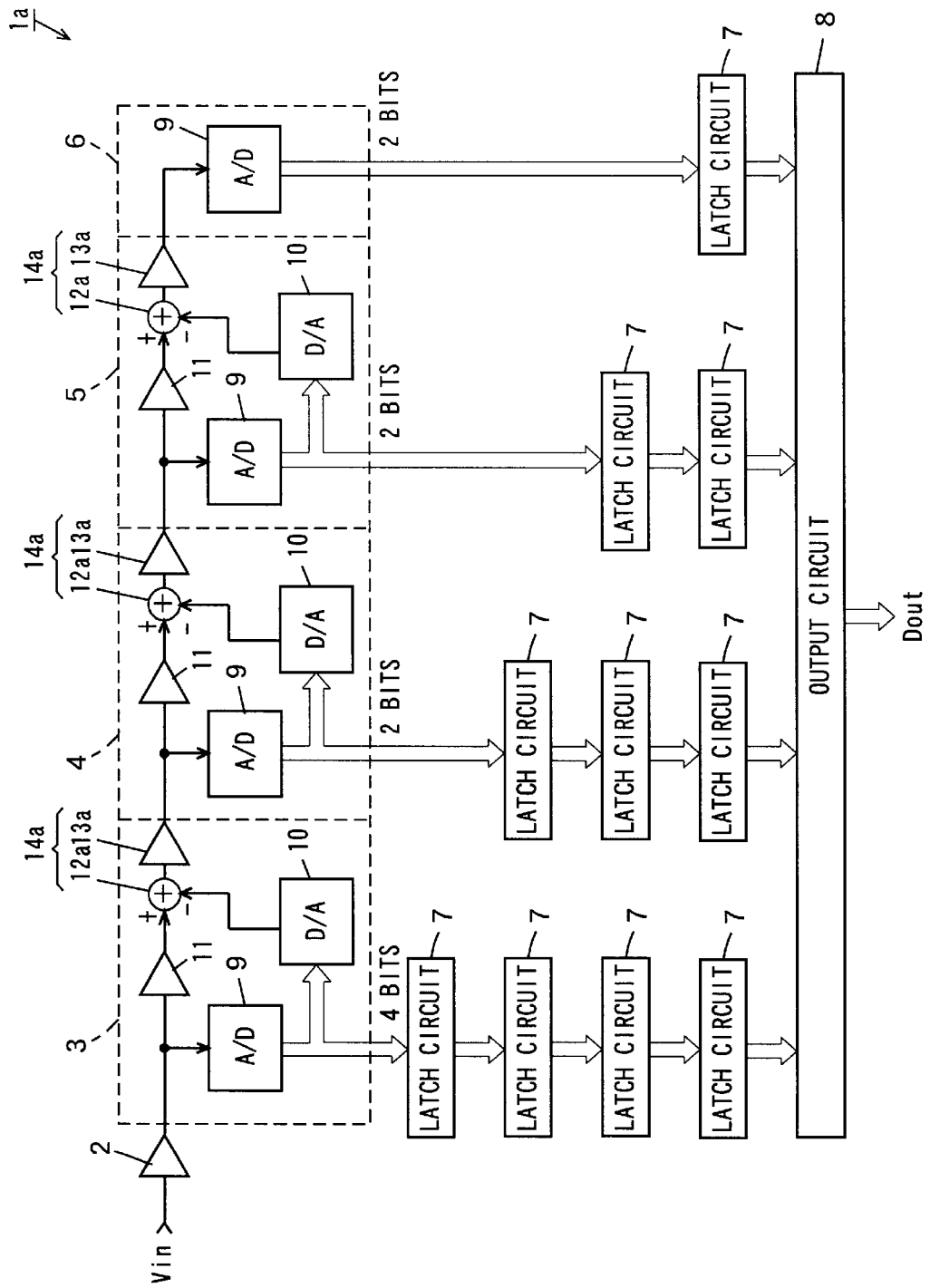
FIG. 8 is a block diagram showing the structure of an analog-to-digital conversion circuit in a second embodiment of the present invention.

FIG. 8 is a block diagram showing the structure of an analog-to-digital conversion circuit 1a in a second embodiment of the present invention. The analog-to-digital conversion circuit 1a shown in FIG. 8 has a 10-bit four-stage pipeline structure.

The analog-to-digital conversion circuit 1a shown in FIG. 8 differs from the analog-to-digital conversion circuit shown in FIG. 1 in that a subtraction amplification circuit 14a in each of first- to third-stage circuits 3 to 5 is used in place of the subtraction amplification circuit 14. The subtraction amplification circuit 14a comprises a subtraction circuit 12a and an operation amplification circuit 13a.

Figure 38:
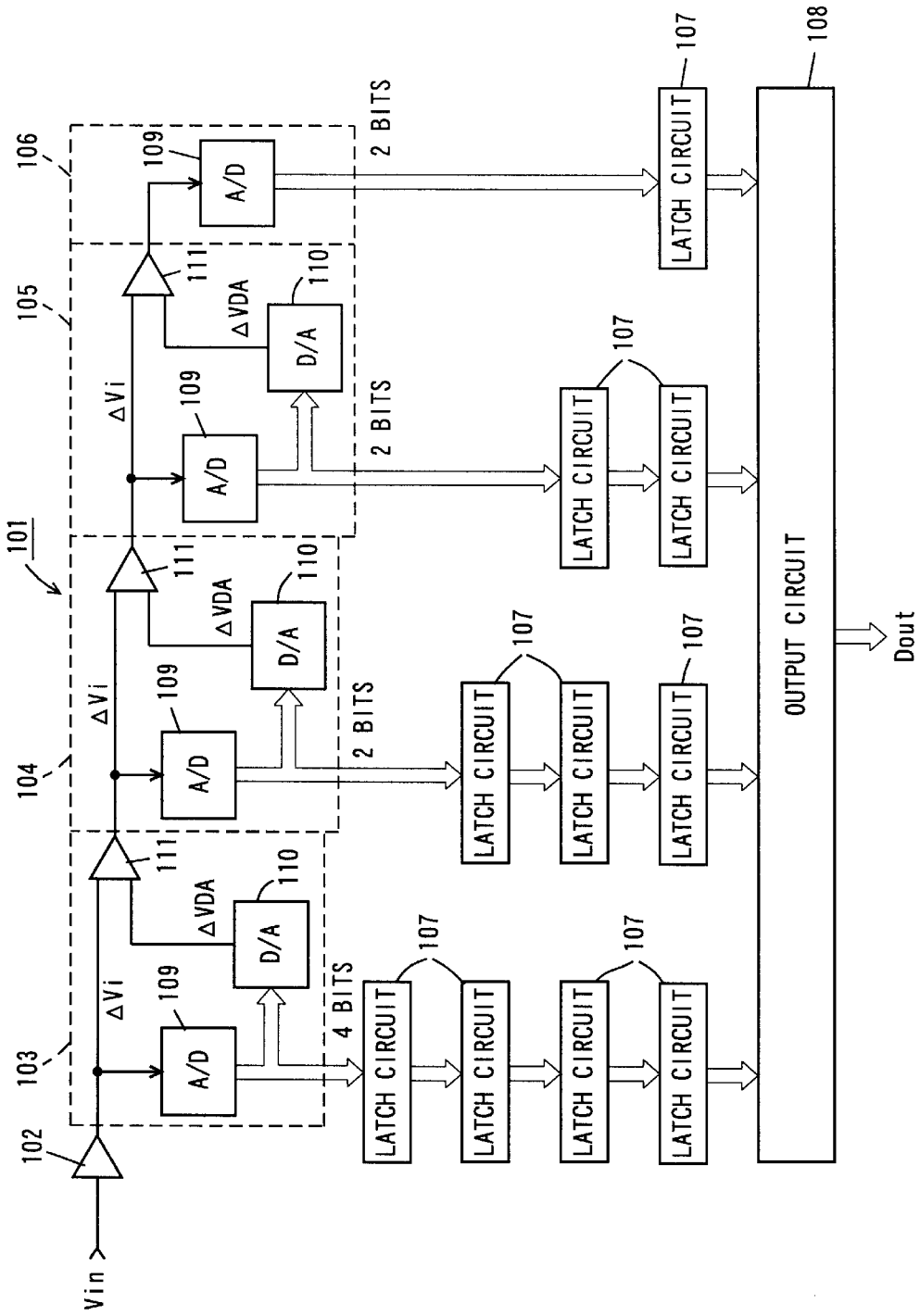
FIG. 38 is a block diagram showing the structure of a conventional analog-to-digital conversion circuit having a multi-stage pipeline structure.
Figure 39:
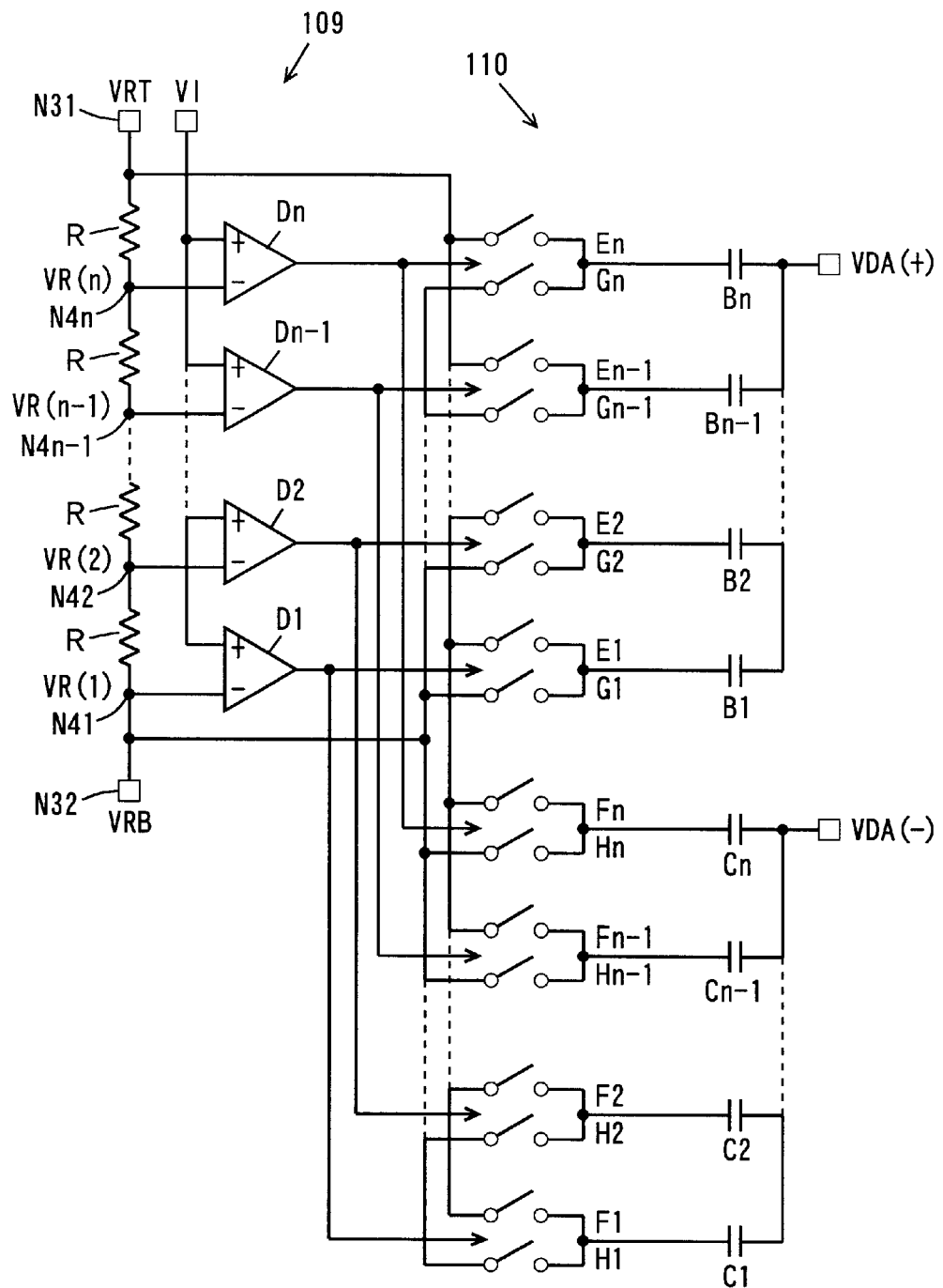
FIG. 39 is a circuit diagram of a sub-A/D converter and a D/A converter in the analog-to-digital conversion circuit shown in FIG. 38.
Figure 40:
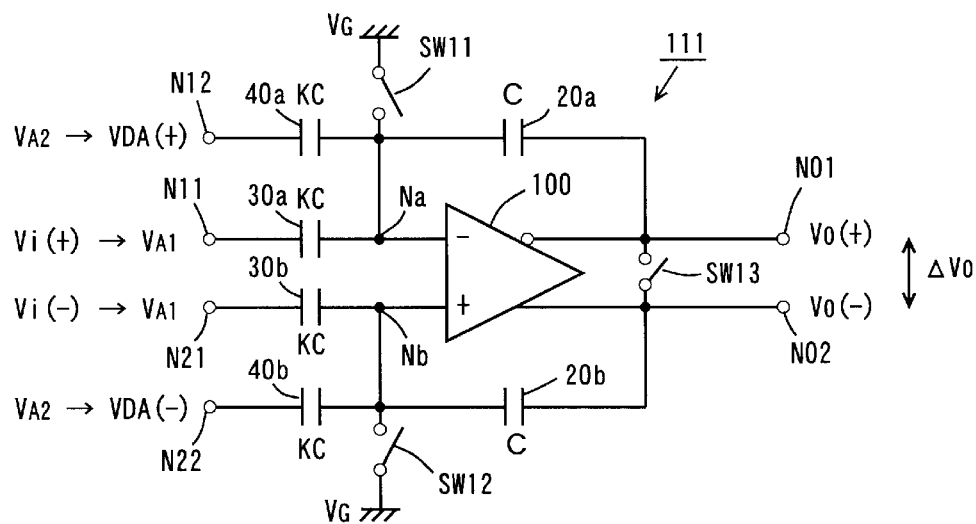
FIG. 40 is a circuit diagram showing the principle of the operations of a subtraction amplification circuit in the analog-to-digital conversion circuit.
Figure 41:
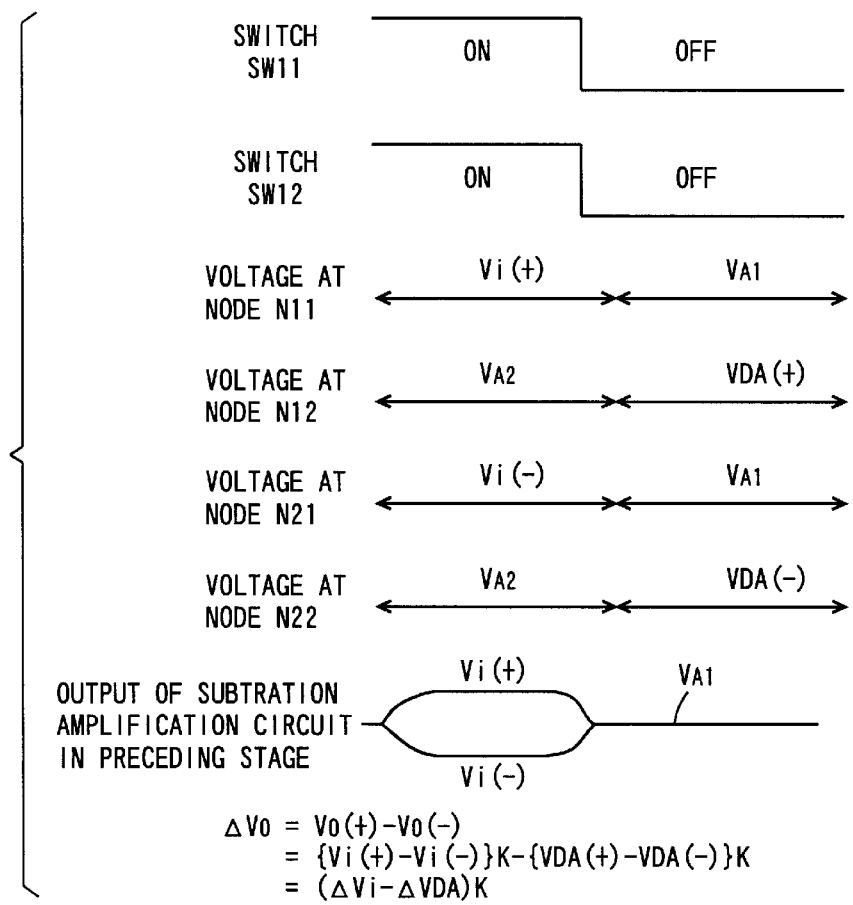
FIG. 41 is a diagram for explaining the operations of the subtraction amplification circuit shown in FIG. 40.
Figure 42:
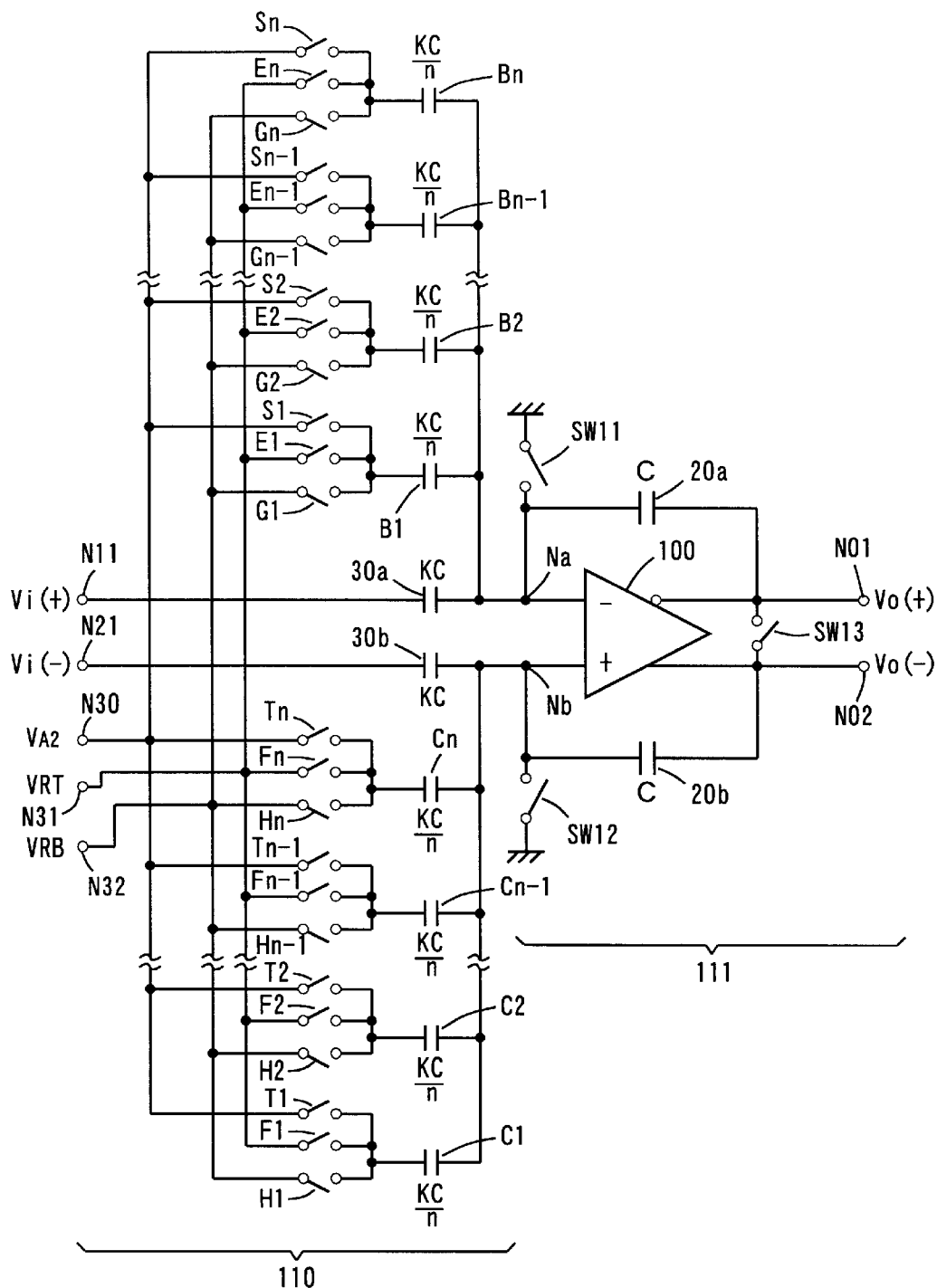
FIG. 42 is a circuit diagram showing the specific structures of a D/A converter and the subtraction amplification circuit shown in FIG. 40 in a case where the subtraction amplification circuit is used in the analog-to-digital conversion circuit shown in FIG. 38.
Figure 43:
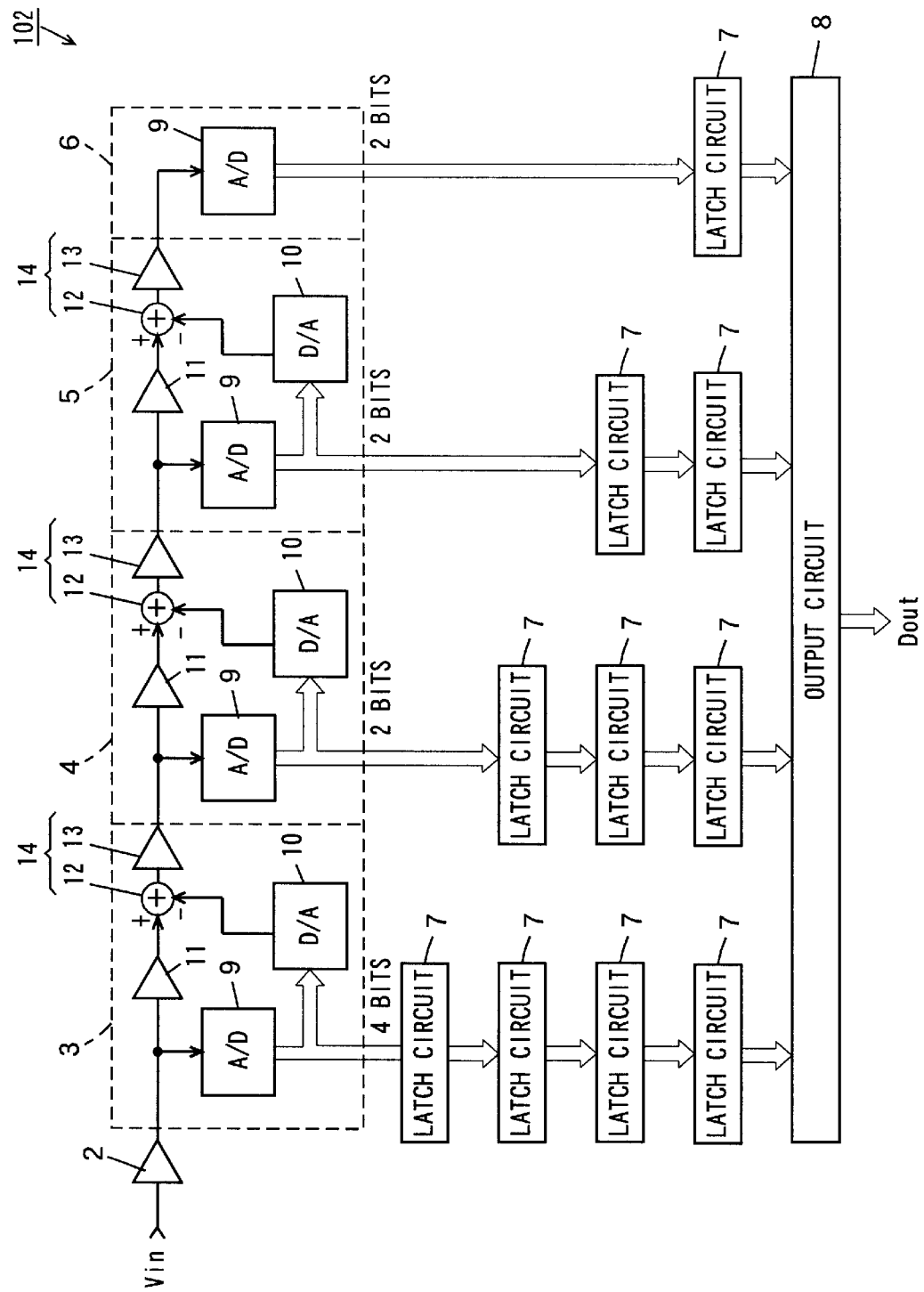
FIG. 43 is a block diagram showing a conventional analog-to-digital conversion circuit.
Figure 44:
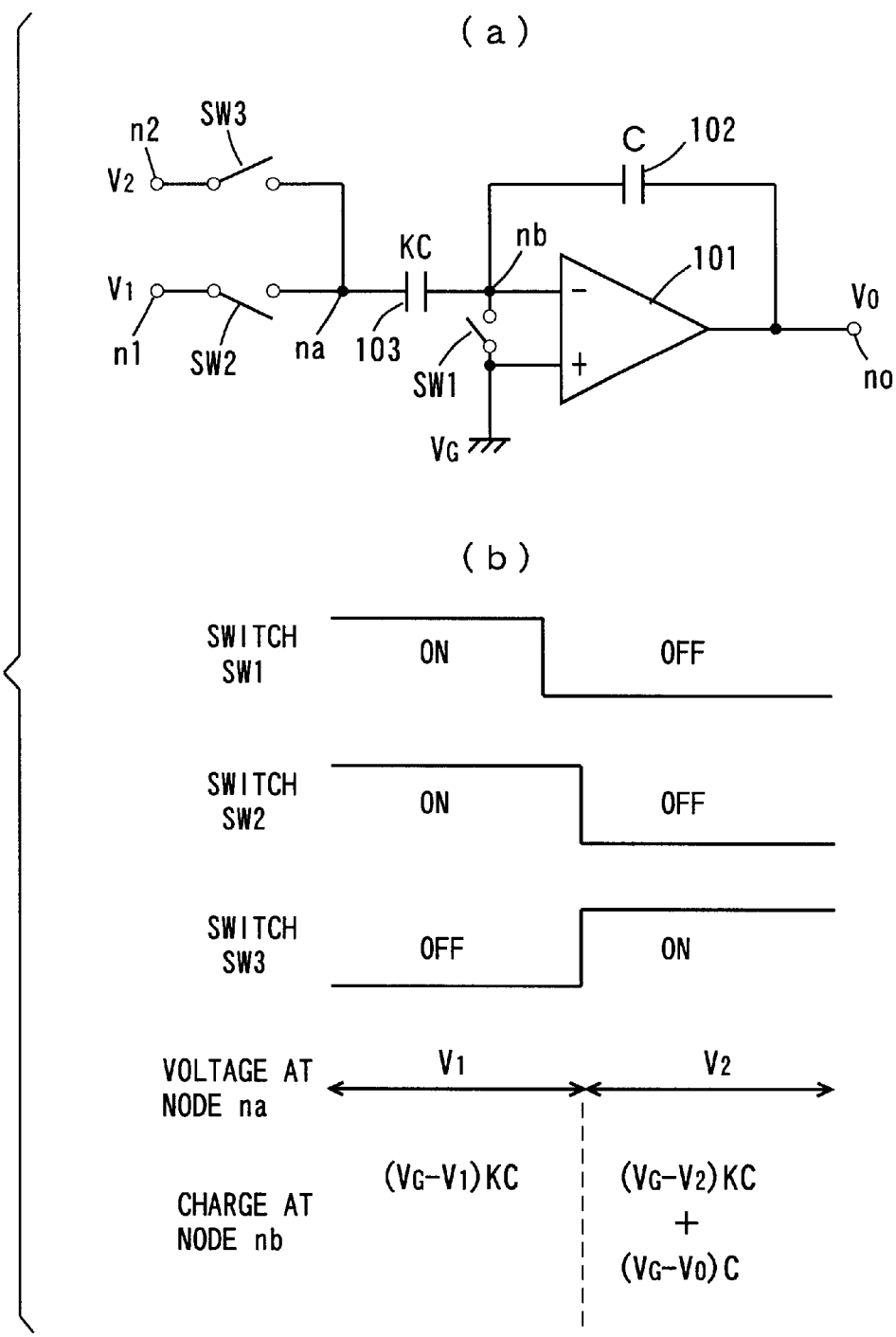
FIG. 44a is a circuit diagram showing the structure of a subtraction amplification circuit used in the analog-to-digital conversion circuit shown in FIG. 43
FIG. 44b is a diagram for explaining the operations of the subtraction amplification circuit.
Figure 45:
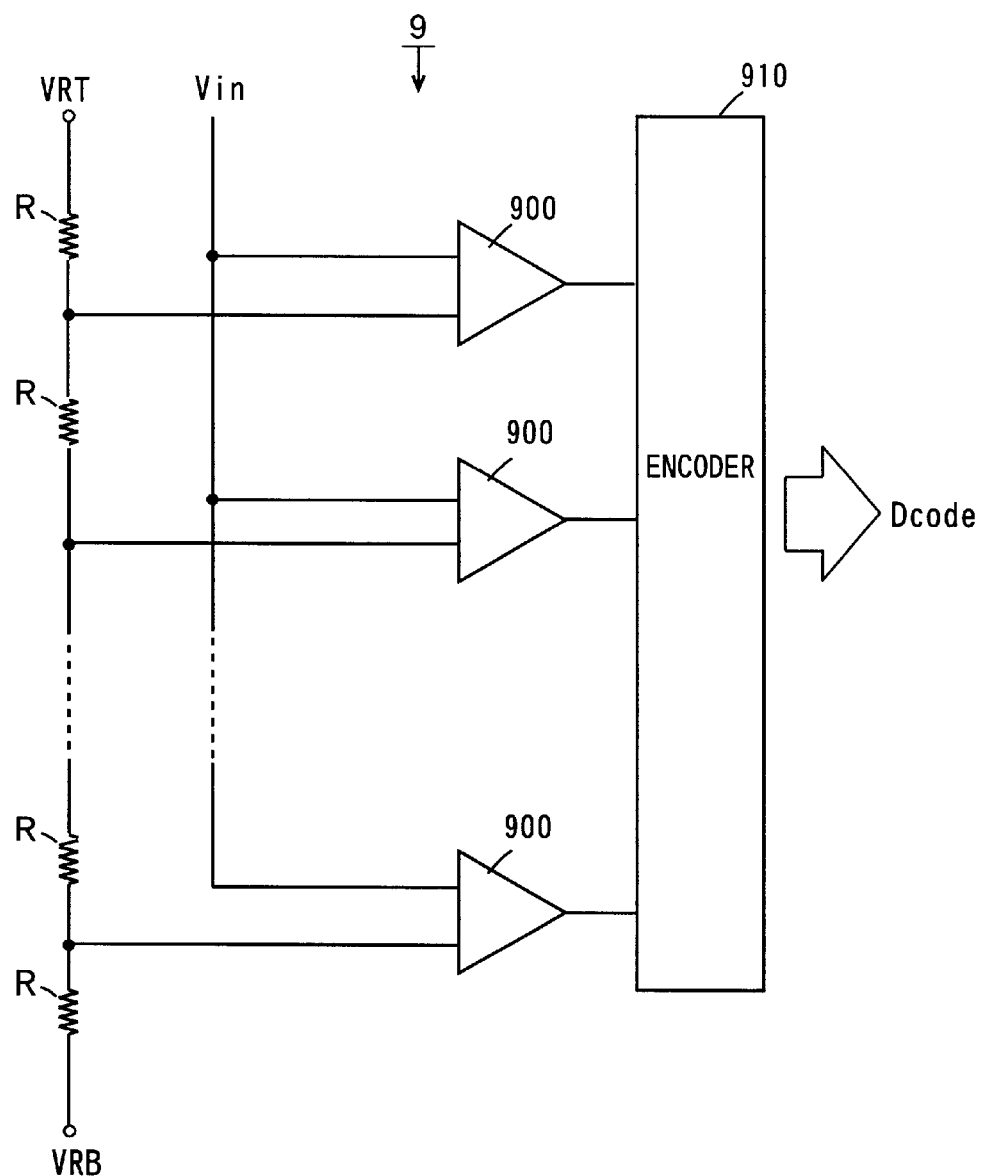
FIG. 45 is a diagram showing the structure of a sub-A/D converter used in the analog-to-digital conversion circuit shown in FIG. 43.

Furthermore, in first- to fourth-stage circuits 3 to 6, a high-potential side reference voltage VRT and a low-potential side reference voltage VRB are respectively supplied to a sub-A/D converter 9 and a D/A converter 10, as in the analog-to-digital conversion circuit 101 shown in FIG. 38. That is, the reference voltage range of the sub-A/D converter 9 and the reference voltage range of the D/A converter 10 are the same.

The structures and the operations of the other parts in the analog-to-digital conversion circuit 1 shown in FIG. 8 are the same as the structures and the operations of those in the analog-to-digital conversion circuit 1 shown in FIG. 1.

Figure 9:
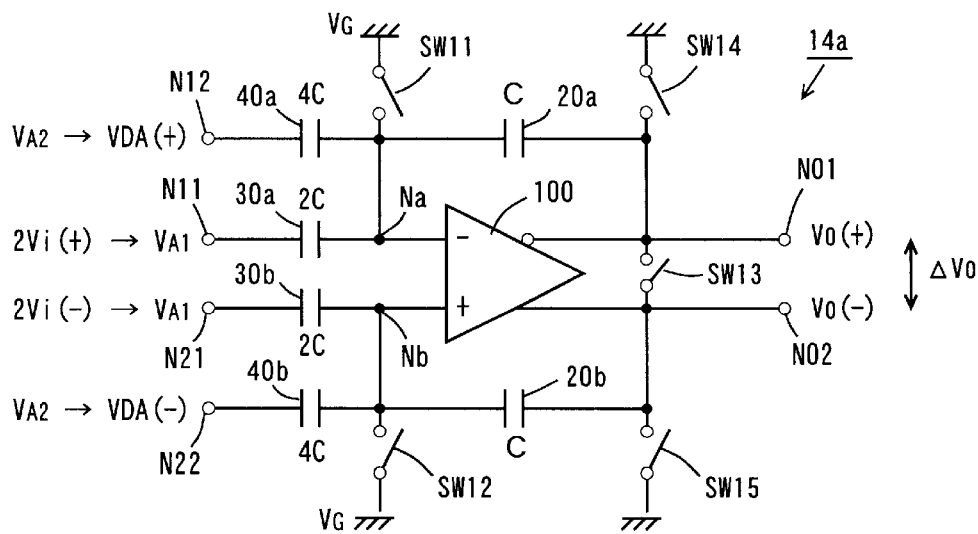
FIG. 9 is a circuit diagram for explaining the principle of the operations of a subtraction amplification circuit in the analog-to-digital conversion circuit shown in FIG. 8.
Figure 10:
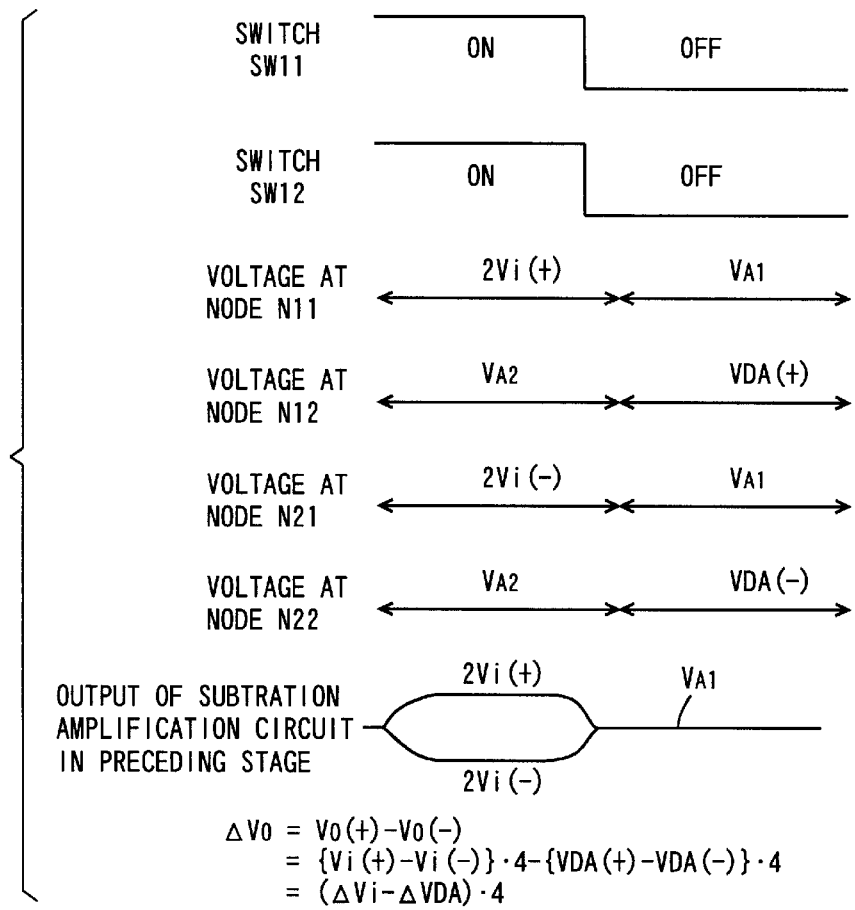
FIG. 10 is a diagram for explaining the operations of the subtraction amplification circuit shown in FIG. 9.

FIG. 9 is a circuit diagram for explaining the principle of the operations of the subtraction amplification circuit 14a in the analog-to-digital conversion circuit 1a shown in FIG. 8. FIG. 10 is a diagram for explaining the operations of the subtraction amplification circuit 14a shown in FIG. 9. The subtraction amplification circuit 14a shown in FIG. 9 is a complete differential system subtraction amplification circuit.

In the subtraction amplification circuit 14a shown in FIG. 9, an inverse input terminal of an operational amplifier 100 is connected to a node Na, and a non-inverse input terminal thereof is connected to a node Nb. Further, an inverse output terminal of the operational amplifier 100 is connected to a node NO1, and is connected to the inverse input terminal through a capacitor 20a, and a non-inverse output terminal thereof is connected to a node NO2, and is connected to the non-inverse input terminal through a capacitor 20b.

The node Na is grounded through a switch SW11, and the node Nb is grounded through a switch SW12. Further, the node Na is connected to a node N11 through a capacitor 30a, and is connected to a node N12 through a capacitor 40a. The node Nb is connected to a node N21 through a capacitor 30b, and is connected to a node N22 through a capacitor 40b. The node NO1 is grounded through a switch SW14, and the node NO2 is grounded through a switch SW15. A switch SW13 is connected between the nodes NO1 and NO2. The switch SW13 operates at the same timing as that of the switches SW11, SW12, SW14, and SW15.

The capacitance values of the capacitors 20a and 20b are respectively C, the capacitance values of the capacitors 30a and 30b are respectively 2C, and the capacitance values of the capacitors 40a and 40b are respectively 4C.

To the subtraction amplification circuit 14a, a difference voltage $2\Delta V_i$ which is amplified with a gain 2 by the operational amplification circuit 11 in the same stage is supplied. $_2\Delta V_i = 2V_i(+) - 2V_i(-)$. Further, to the subtraction amplification circuit 14a, the result of D/A conversion by the D/A converter 10 in the same stage is fed as a difference voltage $\Delta VDA$. $\Delta VDA = VDA(+) - VDA(-)$.

A voltage which changes from $2V_i(+)$ to $V_{A1}$ is inputted to the node N11, a voltage which changes from $V_{A2}$ to VDA (+) is inputted to the node N12, a voltage which changes from $2V_i(-)$ to $V_{A1}$ is inputted to the node N21, and a voltage which changes from $V_{A2}$ to VDA (-) is inputted to the node N22.

Referring now to FIG. 10, the operations of the subtraction amplification circuit 14a shown in FIG. 9 will be described. Let $V_G$ be a ground potential.

First, the switches SW11, SW12, SW14, and SW15 are turned on. At this time, the switch SW13 is also turned on. A voltage $2V_i(+)$ is inputted to the node N11, a set voltage $V_{A2}$ is inputted to the node N12, a voltage $2V_i(-)$ is inputted to the node N21, and a set voltage $V_{A2}$ is inputted to the node N22. Consequently, potentials at the nodes NO1 and NO2 are ground potentials $V_G$.

The switches SW11, SW12, SW14, and SW15 are then turned off. At this time, the switch SW13 is also turned off. A set voltage $V_{A1}$ is inputted to the node N11, a voltage VDA (+) is inputted to the node N12, a set voltage $V_{A1}$ is inputted to the node N21, and a voltage VDA (-) is inputted to the node N22. Consequently, voltages at the nodes NO1 and NO2 are respectively $V_O$ (+) and $V_O$ (-).

When the voltages $V_O$ (+) and $V_O$ (-) at the nodes NO1 and NO2 are found from the principle of conservation of charge, the following equations are obtained:

$$V_O(+) = V_G + 2V_i(+) \cdot 2 - VDA(+) \cdot 4 + V_{A1} \cdot 2 - V_{A2} \cdot 4$$

$$V_O(-) = V_G + 2V_i(-) \cdot 2 - VDA(-) \cdot 4 + V_{A1} \cdot 2 - V_{A2} \cdot 4$$

Consequently, a difference voltage $\Delta V_O$ is expressed by the following equation:

$$\Delta V_O = V_O(+) - V_O(-) = \{V_i(+) - V_i(-)\} \cdot 4 - \{VDA(+) - VDA(-)\} \cdot 4 = (\Delta V_i - \Delta VDA) \cdot 4$$

The subtraction amplification circuit 14a shown in FIG. 9 thus performs subtraction of the differential voltage $2\Delta V_i$ supplied from the operational amplification circuit 11 in the same stage and twice the differential voltage $\Delta VDA$ supplied from the D/A converter 10 in the same stage and amplification of the gain 2. That is, the difference between four times the difference voltage $\Delta V_i$ and four times the difference voltage $\Delta VDA$ is calculated.

In this case, the set voltages $V_{A1}$ and $V_{A2}$ can be arbitrarily set. Consequently, a voltage at the time of equalizing outputs from the operational amplification circuit 11 in the preceding stage can be used as the set voltage $V_{A1}$. Further, an external voltage can be used as the set voltage $V_{A2}$.

The voltages $2V_i$ (+) and $2V_i$ (-) which are analog input signals can be thus inputted to the nodes N11 and N21 without through switches. Accordingly, noise is reduced, and a low-voltage operation can be performed. Consequently, it is possible to reduce the voltage of the analog-to-digital conversion circuit 1a and increase the accuracy thereof.

Figure 11:
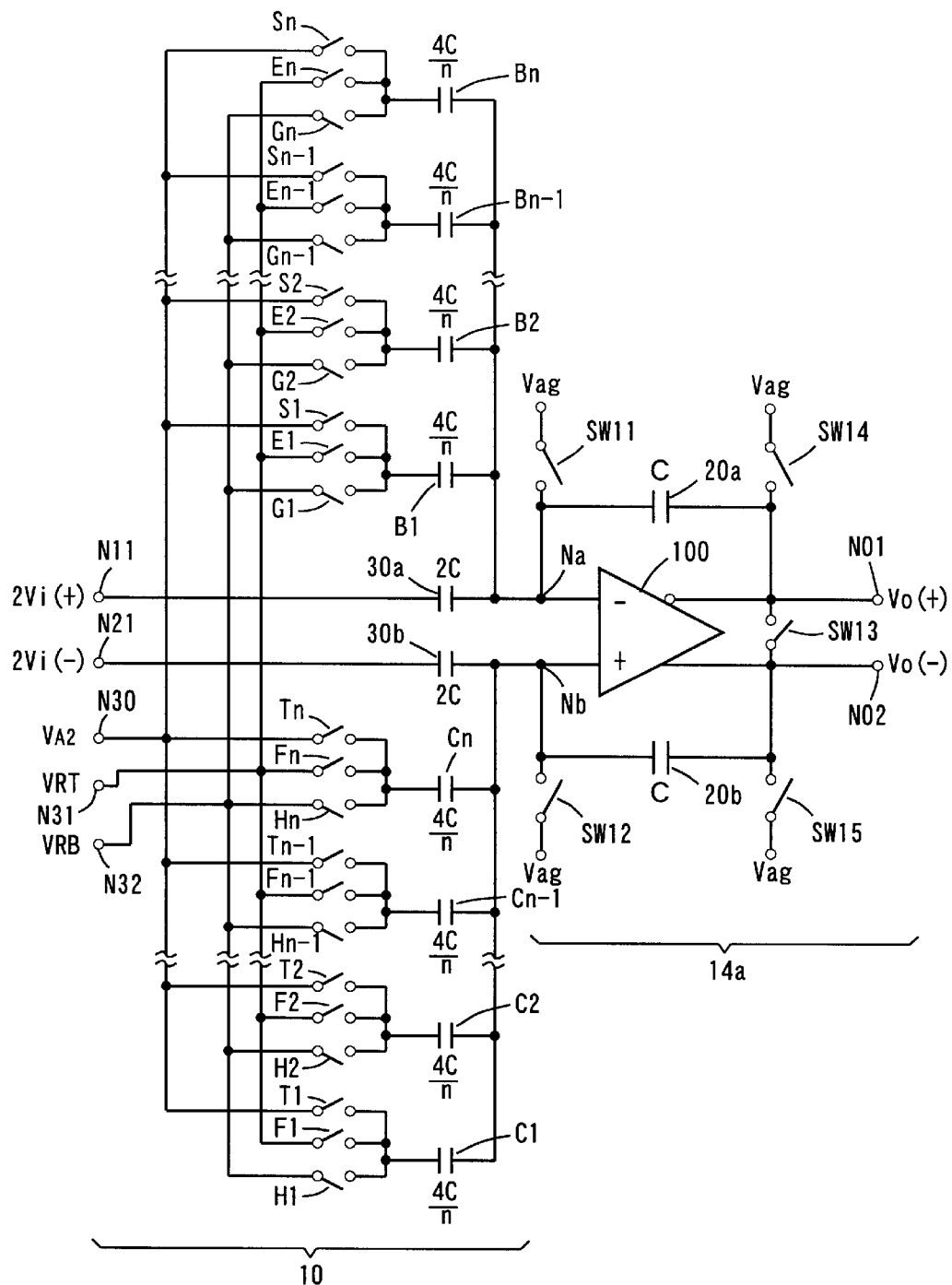
FIG. 11 is a circuit diagram showing the specific structures of a D/A converter and the subtraction amplification circuit shown in FIG. 9 in a case where the subtraction amplification circuit is used in the analog-to-digital conversion circuit shown in FIG. 8.
Figure 12:
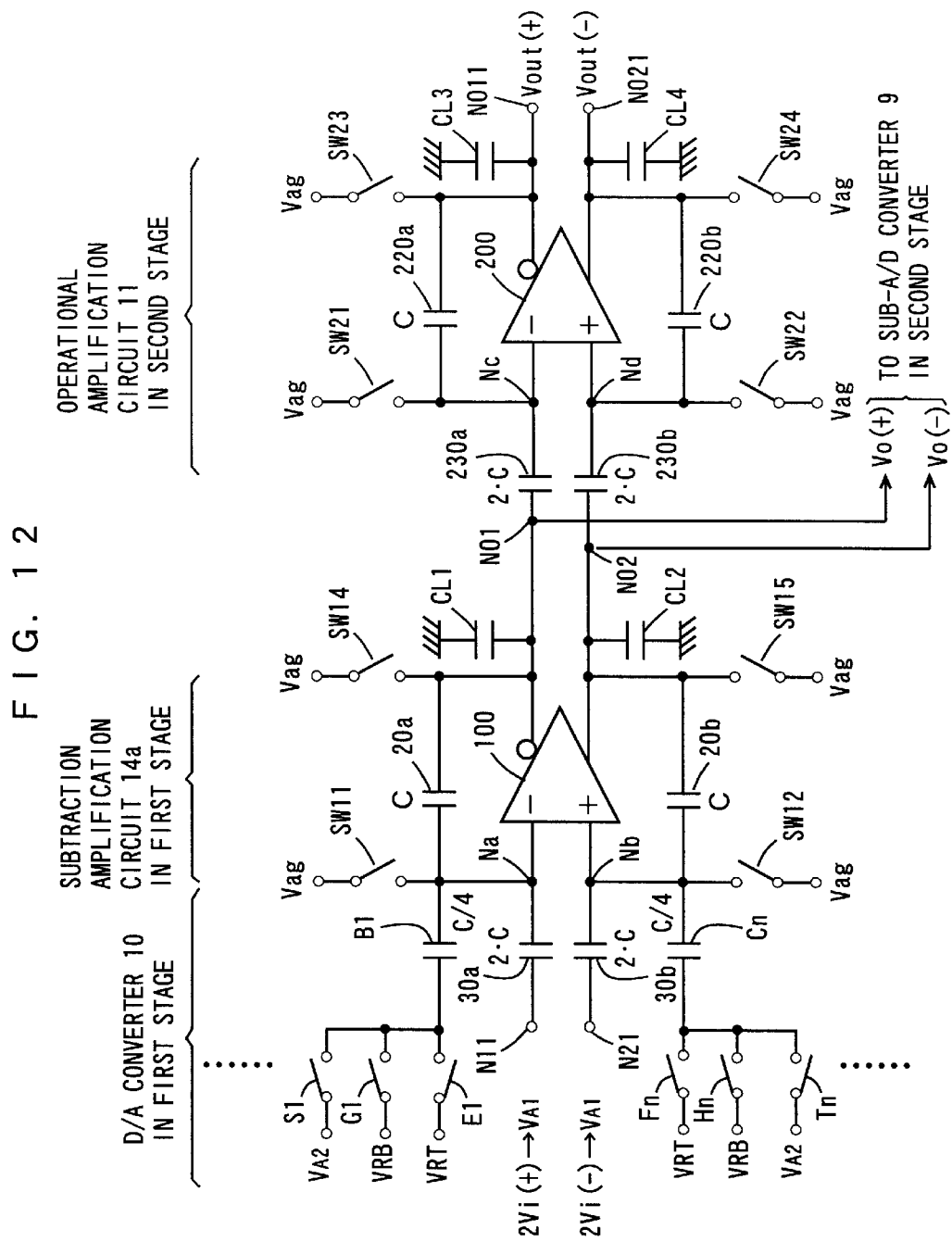
FIG. 12 is a circuit diagram showing the structures of a portion of a sub-A/D converter in the first stage, a subtraction amplification circuit in the first stage, and an operational amplification circuit in the second stage.

FIG. 11 is a circuit diagram showing the specific structures of the D/A converter 10 and the subtraction amplification circuit 14a shown in FIG. 9 in a case where the subtraction amplification 14a is used in the analog-to-digital conversion circuit 1a shown in FIG. 8. FIG. 12 is a circuit diagram showing the structures of the sub-A/D converter 10 in the first stage, the subtraction amplification circuit 14a in the first stage, and the operational amplification circuit 11 in the second stage. FIG. 12 illustrates a case where n=16.

In FIG. 11, a node N30 in the D/A converter 10 is connected to input terminals of capacitors B1 to Bn, respectively, through switches S1 to Sn. The node N30 is connected to input terminals of capacitors C1 to Cn, respectively, through switches T1 to Tn. A set voltage $V_{A2}$ is inputted to the node N30, a high-potential side reference voltage VRT is inputted to a node N31, and a low-potential side reference voltage VRB is inputted to a node N32. Output terminals of the capacitors B1 to Bn are connected to the node Na in the subtraction amplification circuit 14a, and output terminals of the capacitors C1 to Cn are connected to the node Nb in the subtraction amplification circuit 14a.

The node Na in the subtraction amplification circuit 14a is connected to the node N11 through the capacitor 30a, and is connected to a node receiving a predetermined potential Vag through the switch SW11. The node Nb is connected to the node N21 through the capacitor 30b, and is connected to a node receiving a potential Vag through the switch SW12. A voltage $2V_i$ (+) is inputted to the node N11, and a voltage $2V_i$ (−) is inputted to the node N21. Further, the node NO1 is connected to a node receiving a potential Vag through the switch SW14, and is grounded through a capacitor CL1 (see FIG. 12). The node NO2 is connected to a node receiving a potential Vag through the switch SW15, and is grounded through a capacitor CL2 (see FIG. 12).

The potential Vag supplied to the switches SW11 and SW12 and the potential Vag supplied to the switches SW14 and SW15 may differ from each other.

The capacitance values of the capacitors 20a and 20b are respectively C, and the capacitance values of the capacitors 30a and 30b are 2C. Further, the capacitance values of the capacitors B1 to Bn and C1 to Cn are respectively 4C/n. When n=16, for example, the capacitance values of the capacitors B1 to Bn and C1 to Cn are respectively C/4.

Voltages $V_O$ (+) and $V_O$ (−) respectively outputted from the nodes NO1 and NO2 are supplied to the sub-A/D converter 9 in the second stage.

As shown in FIG. 12, a capacitor 220a is connected between a node Nc and a node NO11 in the operational amplification circuit 11. Further, a capacitor 220b is connected between a node Nd and a node NO21. The node Nc is connected to the node NO1 through a capacitor 230a, and is connected to a node receiving a potential Vag through a switch SW21. The node Nd is connected to the node NO2 through a capacitor 230b, and is connected to a node receiving a potential Vag through a switch SW22. The node NO11 is connected to a node receiving a potential Vag through a switch SW23, and is grounded through a capacitor CL3. The node NO21 is connected to a node receiving a potential Vag through a switch SW24, and is grounded through a capacitor CL4.

The capacitance values of the capacitors 220a and 220b are respectively C, and the capacitance values of the capacitors 230a and 230b are respectively 2C. Consequently, a voltage Vout (+) which is amplified by a factor of two is outputted from the node NO11, and a voltage Vout (−) which is amplified is outputted from the node NO21.

The switches S1 to Sn, G1 to Gn, E1 to En, F1 to Fn, H1 to Hn, T1 to Tn, SW11, SW12, SW13, SW14, SW15, SW21, SW22, SW23, and SW24 are analog switches each composed of a CMOS circuit.

The operations of the D/A converter 10 and the subtraction amplification circuit 14a shown in FIGS. 11 and 12 will be then described.

The switches SW11, SW12, SW14, and SW15 are first turned on. At this time, the switch SW13 is also turned on. The switches S1 to Sn and T1 to Tn are turned on. Consequently, a set voltage $V_{A2}$ is inputted to the input terminals of the capacitors B1 to Bn and C1 to Cn. Further, a voltage $2V_i$ (+) is inputted to the node N11, and a voltage $2V_i$ (−) is inputted to the node N21. Consequently, potentials at the nodes NO1 and NO2 are ground potentials.

The switches SW11, SW12, SW14, and SW15 are then turned off. At this time, the switch SW13 is also turned off. The switches S1 to Sn and T1 to Tn are turned off. The switches E1 to En, F1 to Fn, G1 to Gn, and H1 to Hn are respectively turned on or off in accordance with the output levels of the comparators D1 to Dn shown in FIG. 3. Voltages are respectively applied to the input terminals of the capacitors B1 to Bn and C1 to Cn.

At this time, both the voltages $2V_i$ (+) and $2V_i$ (−) respectively inputted to the nodes N11 and N21 are equalized to an equal voltage $V_{A1}$, as shown in FIG. 10. Consequently, a difference voltage $\Delta V_O$ between the nodes NO1 and NO2 is expressed by the following equation, as described using FIG. 10:

$$\Delta V_O = V_O(+) - V_O(-) = (\Delta V_i - \Delta VDA) \cdot 4$$

An output from the operational amplification circuit 11 in the preceding stage can be thus used as the set voltage $V_{A1}$ inputted to the nodes N11 and N21. Accordingly, the voltage $2V_i$ (+) and the set voltage $V_{A1}$ can be inputted to the node N11 without using a switch, and the voltage $2V_i$ (−) and the set voltage $V_{A1}$ can be inputted to the node N21 without using a switch.

An arbitrary voltage can be used as the set voltage $V_{A2}$ inputted to the node N30. For example, a high-potential side reference voltage VRT or a low-potential side reference voltage VRB can be also used as the set voltage $V_{A2}$.

The set voltages $V_{A1}$ and $V_{A2}$ can be set in the vicinity of a power supply voltage or a ground voltage. Consequently, a low-voltage operation can be performed even if a CMOS switch is used.

As a result, a high-accuracy analog-to-digital conversion circuit which causes noise to be reduced and can perform a low-voltage operation is realized.

As described in the foregoing, in the analog-to-digital conversion circuit according to the present embodiment, the analog signal is amplified by a factor of two in the operational amplification circuit 11 in each of the first- to third-stage circuits 3 to 5, an output voltage of the operational amplification circuit 11 is amplified by a factor of two in the subtraction amplification circuit 14a, an output voltage of the D/A converter 10 is amplified by a factor of four, and the difference between the amplified output voltage of the operational amplification circuit 11 and the output voltage of the D/A converter 10 is calculated. Here, two times the output voltage range of the operational amplification circuit 11 and four times the output voltage range of the D/A converter 10 are the same output voltage range. Therefore, the subtraction amplification circuit 14a can calculate the difference between the analog signals at the same output voltage range without complicating the circuit structure of each of the circuits 3 to 5 and increasing the circuit scale thereof.

The amplification factor of the output voltage of the operational amplification circuit 11 and the amplification factor of the output voltage of the D/A converter 10 can be independently set, respectively, thereby making it possible to arbitrarily set the gains of the operational amplification circuits 11 and 13. Consequently, the degree of freedom of the design of each of the first- to third-stage circuits 3 to 5 is increased. Consequently, it is possible to respectively design the sub-A/D converter 9, the D/A converter 10, the operational amplification circuit 11, and the subtraction amplification circuit 14a which are constituent elements of each of the circuits 3 to 5 at suitable voltage ranges by considering the power consumption and the area occupied by the circuit.

The subtraction amplification circuit 14a in the analog-to-digital conversion circuit 1a in the second embodiment may be used in combination with the analog-to-digital conversion circuit 1 in the first embodiment.

In this case, the ratio of the reference voltage range of the sub-A/D converter 9 to the reference voltage range of the D/A converter 10 and the ratio of the capacitance of the capacitors 30a and 30b to the capacitance of the capacitors B1 to Bn and C1 to Cn in the D/A converter 10 and the subtraction amplification circuit 14a are set such that the output voltage range of the operational amplification circuit 11 and the output voltage range of the D/A converter 10 are equal to each other.

Figure 13:
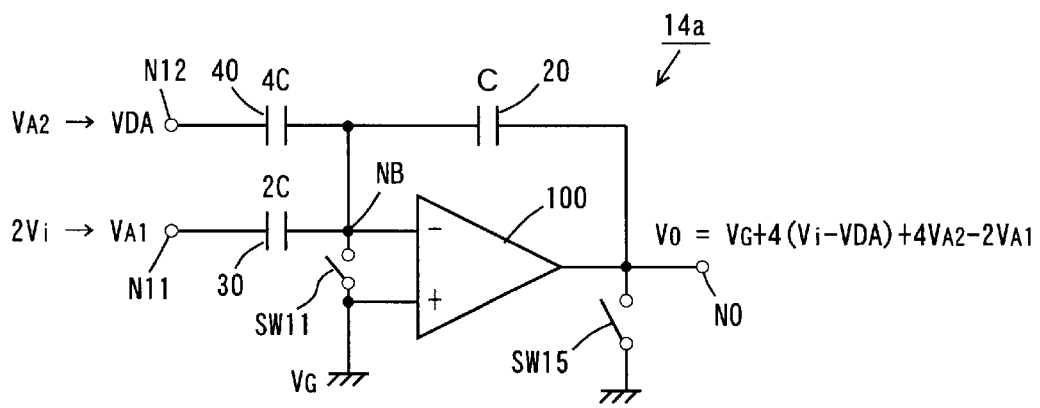
FIG. 13 is a circuit diagram for explaining the principle of the operations of a subtraction amplification circuit for a single input in the analog-to-digital conversion circuit shown in FIG. 8.
Figure 14:
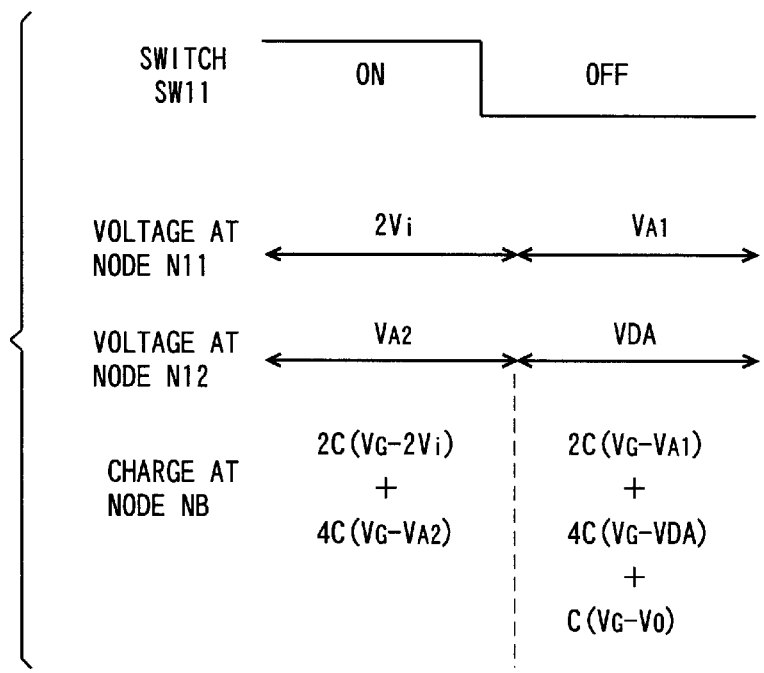
FIG. 14 is a diagram for explaining the operations of the subtraction amplification circuit shown in FIG. 13.

FIG. 13 is a circuit diagram for explaining the principle of the operations of the subtraction amplification circuit 14a for a single input (single-ended input) in the analog-to-digital conversion circuit 1a shown in FIG. 8. FIG. 14 is a diagram for explaining the operations of the differential amplification circuit 14a shown in FIG. 13.

In FIG. 13, an inverse input terminal of the operational amplifier 100 is connected to a node NB, and a non-inverse input terminal thereof is grounded. Further, an output terminal of the operational amplifier 100 is connected to a node NO, and is connected to the inverse input terminal through a capacitor 20. A switch W11 is connected between the inverse input terminal and the non-inverse input terminal of the operational amplifier 100. The node NB is connected to the node N1 through a capacitor 30, and is connected to the node N12 through a capacitor 40. The node NO is grounded through the switch SW15.

A voltage which changes from $2V_i$ to $V_{A1}$ is inputted to the node N11, and a voltage which changes from $V_{A2}$ to VDA is inputted to the node N12. $V_{A1}$ and $V_{A2}$ are arbitrary set voltages. A voltage $V_O$ is outputted from the node NO.

Referring now to FIG. 14, the operations of the differential amplification circuit 14a shown in FIG. 13 will be described. Let C be the capacitance value of the capacitor 20, 2C be the capacitance value of the capacitor 30, and 4C be the capacitance value of the capacitor 40. Further, let $V_G$ be a ground potential.

The switches SW11 and SW15 are first turned on. The voltage $2V_i$ is inputted to the node N11, and the set voltage $V_{A2}$ is inputted to the node N12. A potential at the node NO is a ground potential $V_G$. At this time, charges Qa at the node NB are expressed by the following equation:

$$Qa=2C(V_G-2V_i)+4C(V_G-V_{A2})$$

The switches SW11 and SW15 are then turned off. The set voltage $V_{A1}$ is inputted to the node N11, and the voltage VDA is inputted to the node N12. A voltage at the node NO is $V_O$. At this time, charges Qb at the node NB are expressed by the following equation:

$$Qb=2C(V_G-V_{A1})+4C(V_G-VDA)+C(V_G+V_O)$$

There is no path through which charge flows out at the node NB. Accordingly, Qa=Qb from the principle of conservation of charge. Consequently, the following equation holds:

$$2C(V_G-2V_i)+4C(V_G-V_{A2})=2C(V_G-V_{A1})+4C(V_G-VDA)+C(V_G-V_O)$$

From the foregoing equation, the voltage $V_O$ at the node NO is expressed by the following equation:

$$V_O=V_G+4(V_i-VDA)+4V_{A2}-2V_{A1}=4(V_i-VDA)+OF$$

OF is an offset voltage. In this case, means for removing the offset voltage OF must be provided between the stage and the succeeding stage.

In such a way, the subtraction amplification circuit 14a shown in FIG. 13 performs subtraction of the voltage $2V_i$ supplied from the operational amplification circuit 11 in the same stage and two times the voltage VDA supplied from the D/A converter 10 in the same stage and amplification of the gain 2. That is, the difference between four times the voltage $V_i$ and four times the voltage VDA is calculated.

In this case, the set voltage $V_{A1}$ can be arbitrarily set. Consequently, a predetermined voltage of an output from the operational amplification circuit 11 in the preceding stage can be used as the set voltage $V_{A1}$. Further, an external voltage can be used as the set voltage $V_{A2}$.

The voltage $2V_i$ which is an analog input signal can be inputted to the node N11 without through a switch. Accordingly, noise is reduced, and a low-voltage operation can be performed. Consequently, it is possible to reduce the voltage of the analog-to-digital conversion circuit 1a and increase the accuracy thereof.

FIG. 15 is a circuit diagram showing the specific structures of the D/A converter 10 and the subtraction amplification circuit 14a shown in FIG. 13 in a case where the subtraction amplification circuit 14a is used in the analog-to-digital conversion circuit 1a shown in FIG. 8.

In FIG. 15, the node N30 in the D/A converter 10 is connected to the input terminals of the capacitors B1 to Bn, respectively, through the switches S1 to Sn. Further, a set voltage $V_{A2}$ is inputted to the node N30, a high-potential side reference voltage VRT is inputted to the node N31, and a low-potential side reference voltage VRB is inputted to the node N32. The output terminals of the capacitors B1 to Bn are connected to the node Na in the subtraction amplification circuit 14a.

The node Na in the subtraction amplification circuit 14a is connected to the node N11 through the capacitor 30, and is connected to a node receiving a predetermined potential Vag through the switch SW11. A voltage $2V_i$ is inputted to the node N11. Further, the node NO is connected to a node receiving a potential Vag through the switch SW15.

The capacitance value of the capacitor 20 is C, and the capacitance value of the capacitor 30 is 2C. Further, the capacitance values of the capacitors B1 to Bn are respectively 4C/n. When n 16, for example, the capacitance values of the capacitors B1 to Bn are C/4.

A voltage V0 outputted from the node NO is supplied to the sub-A/D converter 9 in the second stage.

The operations of the D/A converter 10 and the subtraction amplification circuit 14a shown in FIG. 15 will be then described.

The switches SW11 and SW15 are first turned on. The switches S1 to Sn are turned on. Consequently, a set voltage $V_{A2}$ is inputted to the input terminals of the capacitors B1 to Bn. Further, the voltage $2V_i$ is inputted to the node N11. Consequently, a potential at the node NO is a ground potential.

The switches SW11 and SW15 are then turned off. The switches S1 to Sn are turned off. The switches E1 to En and G1 to Gn are respectively turned on or off in accordance with the output levels of the comparators D1 to Dn shown in FIG. 3. Voltages are respectively applied to the input terminals of the capacitors B1 to Bn.

At this time, a voltage inputted to the node N11 is set to $V_{A2}$, as shown in FIG. 14. Consequently, a voltage $V_O$ at the node NO is expressed by the following equation, as described using FIG. 14:

$$V_O=V_G+4(V_i-VDA)+4V_{A2}-2V_{A1}$$

An output from the operational amplification circuit 11 in the preceding stage can be thus used as the set voltage $V_{A1}$ inputted to the node N11. Accordingly, the voltage $2V_i$ and the set voltage $V_{A1}$ can be inputted to the node N11 without using a switch.

An arbitrary voltage can be used as the set voltage $V_{A2}$ inputted to the node N30. For example, a high-potential side reference voltage VRT or a low-potential side reference voltage VRB can be also used as the set voltage $V_{A2}$.

The set voltages $V_{A1}$ and $V_{A2}$ can be set in the vicinity of a power supply voltage or a ground voltage. Consequently, a low-voltage operation can be performed even if a CMOS switch is used.

As a result, a high-accuracy analog-to-digital conversion circuit which causes noise to be reduced and can perform a low-voltage operation is realized.

As described in the foregoing, even in the analog-to-digital conversion circuit for a single input, the analog signal is amplified by a factor of two in the operational amplification circuit 11 in each of the first- to third-stage circuits 3 to 5, an output voltage of the operational amplification circuit 11 is amplified by a factor of two in the subtraction amplification circuit 14a, an output voltage of the D/A converter 10 is amplified by a factor of four, and the difference between the amplified output voltage of the operational amplification circuit 11 and the output voltage of the D/A converter 10 is calculated. Here, two times the output voltage range of the operational amplification circuit 11 and four times the output voltage range of the D/A converter 10 are the same output voltage range. Therefore, the subtraction amplification circuit 14a calculates the difference between the analog signals at the same output voltage range without complicating the circuit structure of each of the circuits 3 to 5 and increasing the circuit scale thereof.

The amplification factor of the output voltage of the operational amplification circuit 11 and the amplification factor of the output voltage of the D/A converter 10 can be thus independently set, respectively, thereby making it possible to arbitrarily set the gains of the operational amplification circuits 11 and 13. Consequently, the degree of freedom of the design of each of the first- to third-stage circuits 3 to 5 is increased. Therefore, it is possible to respectively design the sub-A/D converter 9, the D/A converter 10, the operational amplification circuit 11, and the subtraction amplification circuit 14a which are constituent elements of each of the circuits 3 to 5 at suitable voltage ranges by considering the power consumption and the area occupied by the circuit.

(3) Third Embodiment

Figure 16:
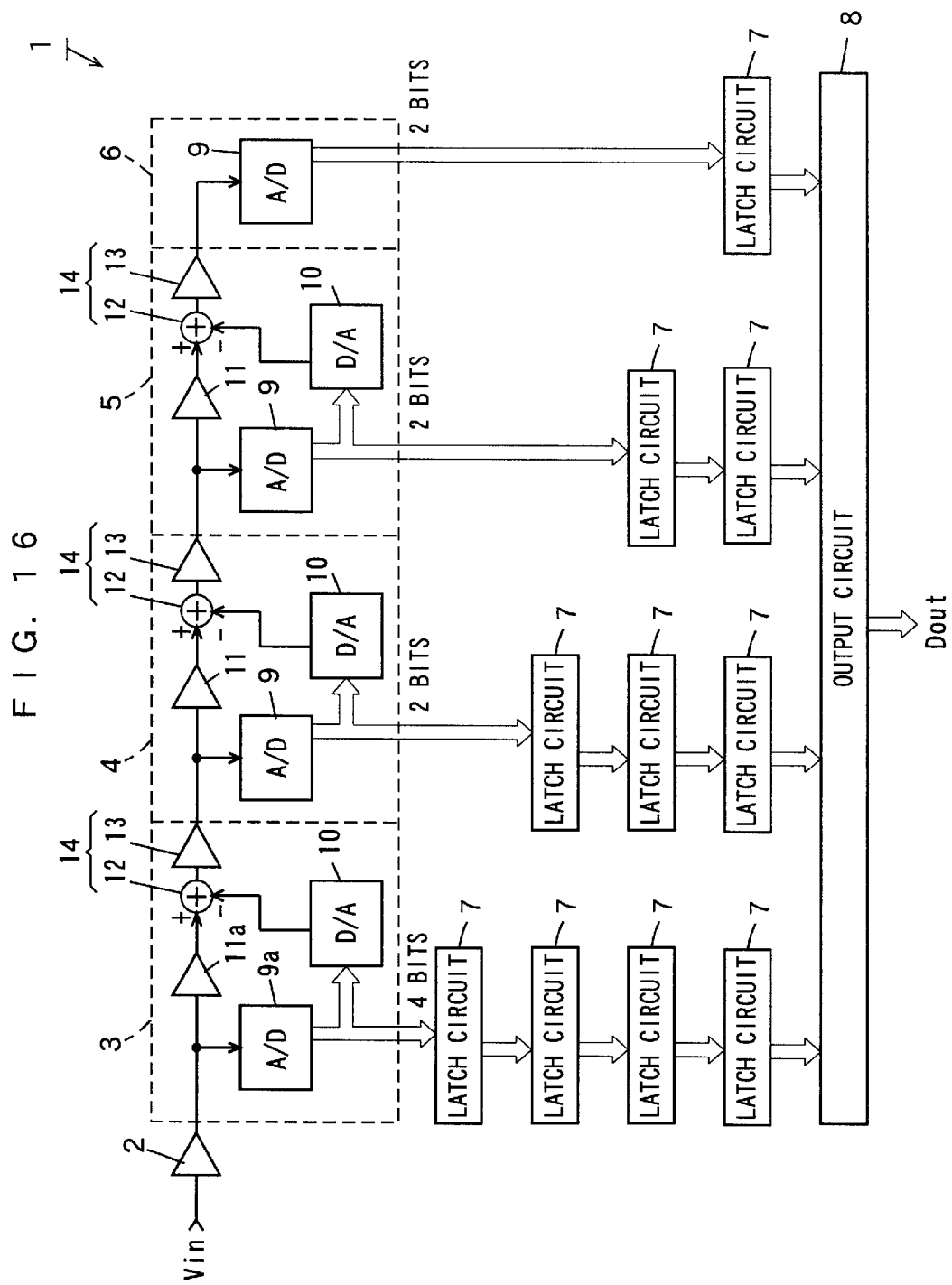
FIG. 16 is a block diagram showing the structure of a pipeline-type analog-to-digital conversion circuit in a third embodiment of the present invention.

FIG. 16 is a block diagram showing the structure of a pipeline-type analog-to-digital conversion circuit in a third embodiment of the present invention. The analog-to-digital conversion circuit shown in FIG. 16 has a 10-bit four-stage pipeline structure.

In FIG. 16, the analog-to-digital conversion circuit 1 comprises a sample-and-hold circuit 2, first- to fourth-stage circuits 3 to 6, a plurality of latch circuits 7, and an output circuit 8.

The first (initial)-stage circuit 3 comprises a sub-A/D converter 9a, a D/A converter 10, an operational amplification circuit 11a having a switchable gain, a subtraction circuit 12, and an operational amplification circuit 13. The subtraction circuit 12 and the operational amplification circuit 13 constitute a subtraction amplification circuit 14. Each of the second- and third-stage circuits 4 and 5 comprises a sub-A/D converter 9, a D/A converter 10, an operational amplification circuit 11, a subtraction circuit 12, and an operational amplification circuit 13. The subtraction circuit 12 and the operational amplification circuit 13 constitute a subtraction amplification circuit 14. The fourth (final)-stage circuit 6 comprises only a sub-A/D converter 9.

Figure 35:
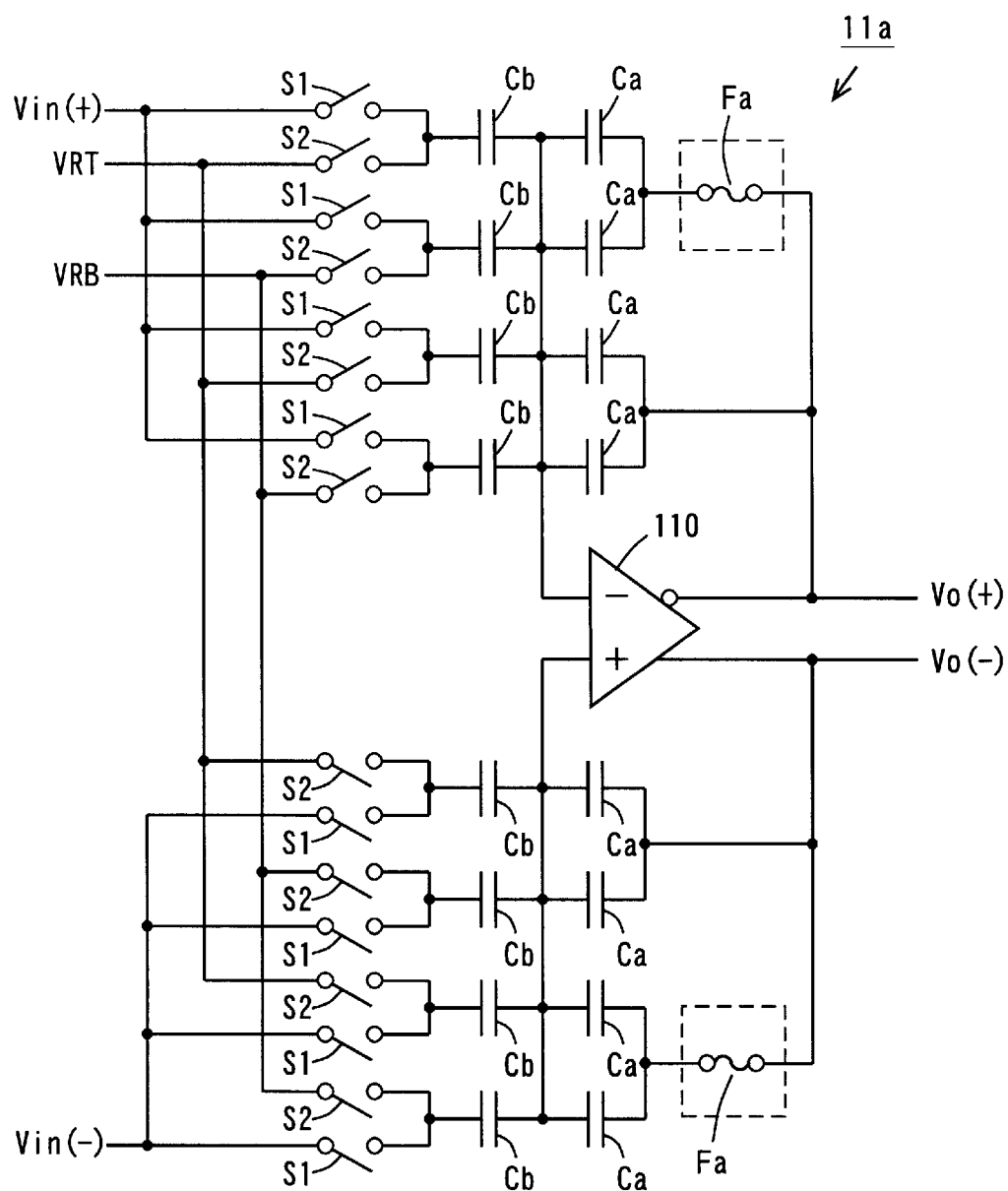
FIG. 35 is a circuit diagram showing another example of a switching part in switching means.

The pipeline-type analog-to-digital conversion circuit 1 shown in FIG. 16 differs from the conventional analog-to-digital conversion circuit 100 shown in FIG. 35 in that the sub-A/D converter 9a having a switchable full-scale range and the operational amplification circuit 11a having a switchable gain are used in the first-stage circuit 3.

Here, the full-scale range of the sub-A/D converter 9 in the first-stage circuit 3 is switched, when the voltage range of an analog input signal is $VIN_{p-p}$, to a voltage range $VIN_{p-p}$ equal thereto, while being switched, when the voltage range of the analog input signal is $VIN_{p-p}/2$, to a voltage range $VIN_{p-p}/2$ equal thereto. Further, the gain of the operational amplification circuit 11a in the first-stage circuit 3 is switched, when the voltage range of the analog input signal is $VIN_{p-p}$, to one, while being switched, when the voltage range of the analog input signal is $VIN_{p-p}/2$, to two.

The full-scale range of the D/A converter 10 in each of the first- to third-stage circuits 3 to 5 is fixed, and the full-scale range of the sub-A/D converter 9 in each of the second- to fourth-stage circuits 4 to 6 is fixed. Further, the gain of each of the operational amplification circuit 13 in the first-stage circuit 3 and the operational amplification circuits 11 and 13 in each of the second- and third-stage circuits 4 and 5 is two.

The first-stage circuit 3 has a four-bit configuration, and each of the second- to fourth-stage circuits 4 to 6 has a two-bit configuration. In each of the first- to third-stage circuits 3 to 5, the respective numbers of bits of the sub-A/D converters 9 and 9a and the D/A converter 10 are set to the same value.

The operations of the analog-to-digital conversion circuit 1 shown in FIG. 16 in a case where the voltage range of the analog input signal is $VIN_{p-p}$ and the voltage range of each of the circuits are the same as those in the analog-to-digital conversion circuit 100 shown in FIG. 35.

Description is herein made of the operations of the analog-to-digital conversion circuit 1 shown in FIG. 16 in a case where the voltage range of the analog input signal is $VIN_{p-p}/2$ and the output voltage range of each of the circuits.

The sample-and-hold circuit 2 samples an analog input signal Vin, and holds the sampled analog input signal for a predetermined time period. The analog input signal Vin outputted from the sample-and-hold circuit 2 is transferred to the first-stage circuit 3.

In the first-stage circuit 3, the sub-A/D converter 9a subjects the analog input signal Vin at the voltage range $VIN_{p-p}/2$ to A/D conversion. The full-scale range of the sub-A/D converter 9a at this time is switched to $VIN_{p-p}/2$, as described above.

A high order 4-bit digital output ($2^9$, $2^8$, $2^7$, $2^6$), which is the result of the A/D conversion by the sub-A/D converter 9, is transferred to the D/A converter 10, and is also transferred to the output circuit 8 through the four latch circuits 7. The D/A converter 10 converts the high order 4-bit digital output, which is the result of the A/D conversion by the sub-A/D converter 9, into an analog signal.

Since the full-scale range of the D/A converter 10 is fixed to $VIN_{p-p}$, the normal output voltage range of the D/A converter 10 is expressed by the following equation:

(resolution in first stage-1)×(full-scale range of D/A converter 10)/ (resolution in first stage)=$(2^4-1)\times(VIN_{p-p})/2^4=15VIN_{p-p}/16$ On the other hand, the operational amplification circuit 11a samples, amplifies and holds the analog input signal Vin. When the voltage range of the analog input signal is $VIN_{p-p}/2$, as described above, the gain is switched to two. Accordingly, the output voltage range of the operational amplification circuit 11a is expressed by the following equation:

(voltage range $VIN_{p-p}$ of analog input signal Vin)×(gain of operational amplification circuit 11a)=$(VIN_{p-p}/2)\times 2=VIN_{p-p}$ The subtraction amplification circuit 14 subtracts the analog input signal Vin outputted from the operational amplification circuit 11a and the result of D/A conversion by the D/A converter 10, and amplifies the result of the subtraction. An output from the subtraction amplification circuit 14 is transferred to the second-stage circuit 4.

The output voltage range of the subtraction amplification circuit 14 in the first stage is expressed by the following equation:

((output voltage range of operational amplification circuit 11a)−(normal output voltage range of D/A converter 10))×(gain of subtraction amplification circuit 14)=(($VIN_{p\text{-}p}$)−($15VIN_{p\text{-}p}$/16))×2=$VIN_{p\text{-}p}$/8

In the second-stage circuit 4, the sub-A/D converter 9 subjects the output from the subtraction amplification circuit 14 in the first-stage circuit 3 to A/D conversion. The result of the A/D conversion by the sub-A/D converter 9 is transferred to the D/A converter 10, and is also transferred to the output circuit 8 through the three latch circuits 7. Consequently, an intermediate high order 2-bit digital output ($2^5$, $2^4$) is obtained from the second-stage circuit 4.

On the other hand, the operational amplification circuit 11 amplifies the output from the subtraction amplification circuit 14 in the first-stage circuit 3. The subtraction amplification circuit 14 subtracts the output from the operational amplification circuit 11 and the result of D/A conversion by the D/A converter 10, and amplifies the result of the subtraction. An output from the subtraction amplification circuit 14 is transferred to the third-stage circuit 5.

The third-stage circuit 5 performs the same operations as those of the second-stage circuit 4 with respect to the output from the subtraction amplification circuit 14 in the second-stage circuit 4. Consequently, an intermediate low order 2-bit digital output ($2^3$, $2^2$) is obtained from the third-stage circuit 5.

In the fourth-stage circuit 6, the sub-A/D converter 9 subjects the output from the subtraction amplification circuit 14 in the third-stage circuit 5 to A/D conversion, thereby obtaining a low order 2-bit digital output ($2^1$, $2^0$).

The digital outputs from the first- to fourth-stage circuits 3 to 6 simultaneously reach the output circuit 8 through the respective latch circuits 7. That is, the latch circuits 7 are provided to synchronize the respective digital outputs from the circuits 3 to 6 with each other.

The output circuit 8 outputs a 10-bit digital output Dout of the analog input signal Vin in parallel after digital correction processing, when required.

When the voltage range of the analog input signal is $VIN_{p\text{-}p}$/2, as described above, the voltage range of an output signal fed to the second-stage circuit 5 from the subtraction amplification circuit 14 in the first-stage circuit 3 is $VIN_{p\text{-}p}$/8, as in a case where the voltage range of the analog input signal is $VIN_{p\text{-}p}$, by switching the gain of the operational amplification circuit 11a in the first-stage circuit 3 and the full-scale range of the sub-A/D converter 9a in the first-stage circuit 3. Consequently, the same digital output as that obtained before the voltage range of the analog input signal Vin is reduced to half is obtained irrespective of the fact that the voltage range of the analog input signal Vin is reduced to half.

Therefore, it is possible to provide an analog-to-digital conversion circuit corresponding to the change in the voltage range of the analog input signal without changing the circuit design.

According to the present embodiment, a differential double-ended input system analog-to-digital conversion circuit can be changed to a single-ended input system analog-to-digital conversion circuit without changing the circuit structure.

Figure 17:
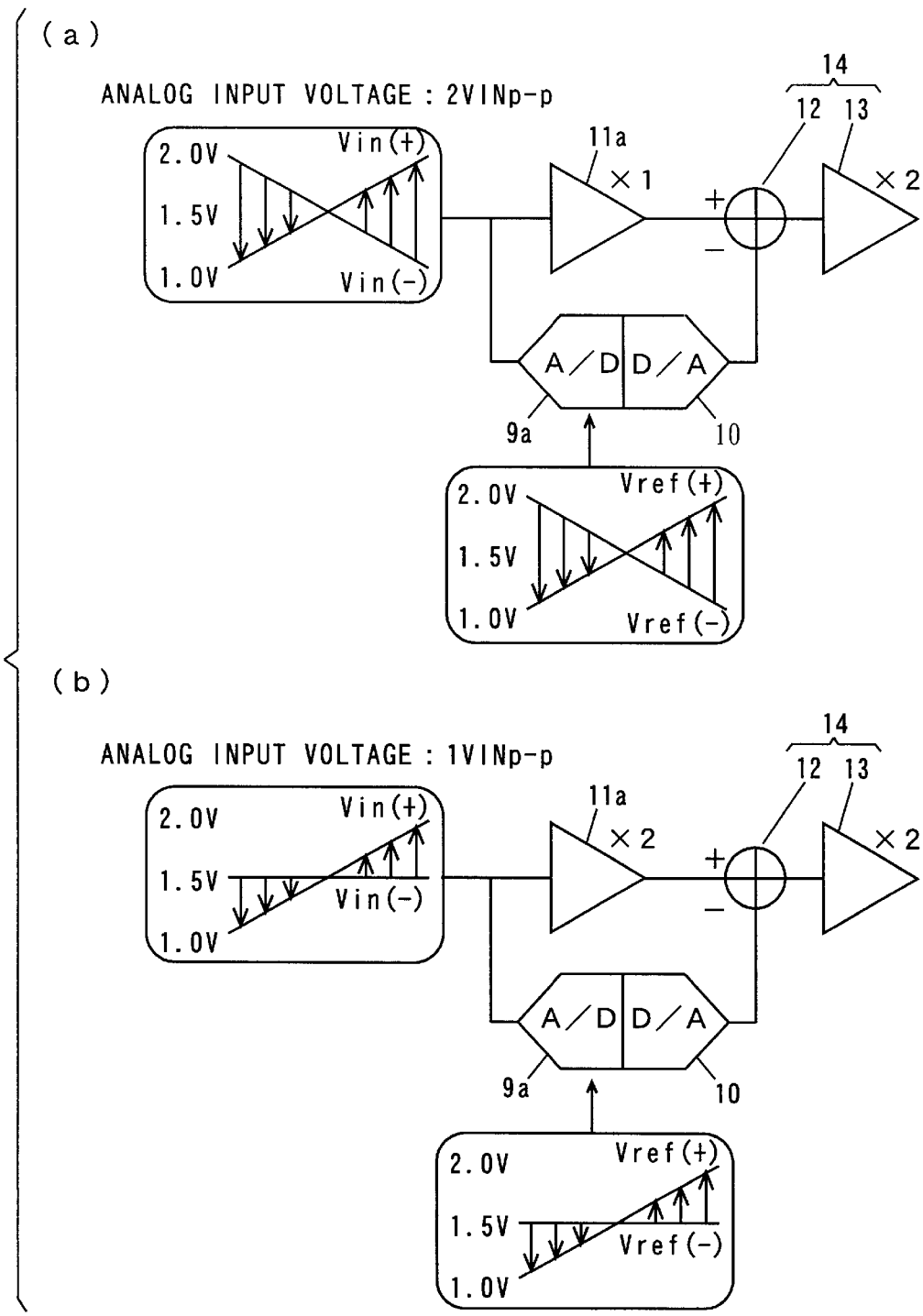
FIG. 17 is a diagram showing setting in a case where the analog-to-digital conversion circuit shown in FIG. 16 is switched to a differential double-ended input system and a single-ended input system.

FIGS. 17(a) and 17(b) are diagrams respectively showing setting in a case where the analog-to-digital conversion circuit 1 shown in FIG. 16 is switched to a differential double-ended input system and a single-ended input system.

As shown in FIG. 17(a), at the time of a differential double-ended input, the gain of the operational amplification circuit 11a is switched to one, and the full-scale range of the sub-A/D converter 9a is switched to $2VIN_{p\text{-}p}$. In this example, a positive side analog input voltage Vin(+) of the analog input signal Vin of the differential double-ended input system changes in a range from 1.0 V to 2.0 V, and a negative side analog input voltage Vin (−) changes in a range from 2.0 V to 1.0 V. The voltage range of the analog input signal Vin is as expressed by the following equation:

$2VIN_{p\text{-}p}$=maximum value of {Vin(+)−Vin(−)}−minimum value of {Vin(+)−Vin(−)}=2.0[V]

In this case, a positive-side reference voltage Vref (+) of the sub-A/D converter 9a changes in a range from 1.0 to 2.0 V, and a negative-side reference voltage Vref (−) changes in a range from 2.0 V to 1.0 V.

As shown in FIG. 17(b), at the time of a single-ended input, the gain of the operational amplification circuit 11a is switched to two, and the full-scale range of the sub-A/D converter 9a is switched to $VIN_{p\text{-}p}$. In this example, a positive side analog input voltage Vin (+) of the analog input signal Vin of the single-ended input system changes in a range from 1.0 V to 2.0 V, and a negative side analog input voltage Vin (−) is constant, i.e., 1.5 V. The voltage range of the analog input signal Vin is as expressed by the following equation:

$VIN_{p\text{-}p}$=maximum value of {Vin(+)−Vin(−)}−minimum value of {Vin(+)−Vin(−)}=1.0[V]

In this case, a positive-side reference voltage Vref (+) of the sub-A/D converter 9a changes in a range from 1.0 to 2.0 V, and a negative-side reference voltage Vref (−) is constant, i.e., 1.5 V.

In the analog-to-digital conversion circuit 1 shown in FIG. 16, the differential double-ended input system is thus changed to the single-ended input system, thereby eliminating the necessity of redesigning the circuit structure even if the voltage range of the analog input signal is reduced to half.

Even in a case where the voltage range of the analog input signal of the single-ended input system is reduced to half, and a case where the voltage range of the analog input signal of the differential double-ended input system is reduced to half, the circuit structure need not be redesigned.

In such a way, in the same LSI (Large-Scale Integrated Circuit), the voltage ranges of an analog input signal, an output from an operational amplification circuit, an output from a D/A conversion circuit, and an output from a subtraction amplification circuit can be changed in a programmable manner. As a result, it is possible to shorten a development period as well as to reduce power consumption.

(4) Fourth Embodiment

Figure 18:
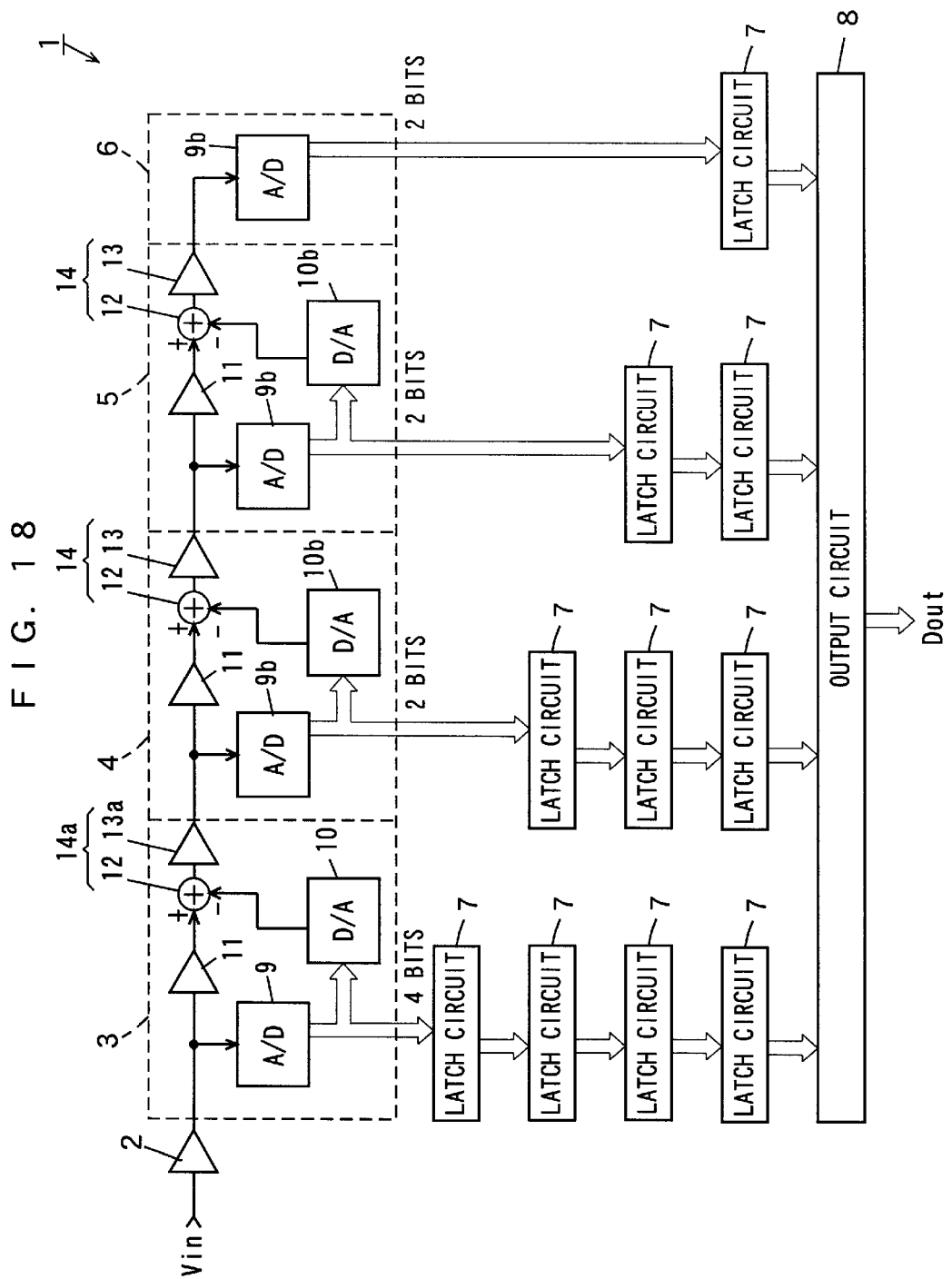
FIG. 18 is a block diagram showing the structure of a pipeline-type analog-to-digital conversion circuit in a fourth embodiment of the present invention.

FIG. 18 is a block diagram showing the structure of a pipeline-type analog-to-digital conversion circuit in a fourth embodiment of the present invention. The analog-to-digital conversion circuit shown in FIG. 18 also has a 10-bit four-stage pipeline structure.

In FIG. 18, the analog-to-digital conversion circuit 1 comprises a sample-and-hold circuit 2, first- to fourth-stage circuits 3 to 6, a plurality of latch circuits 7, and an output circuit 8.

The first-stage circuit 3 has a four-bit configuration, and each of the second- to fourth-stage circuits 4 to 6 has a two-bit configuration. In each of the first- to third-stage circuits 3 to 5, the respective numbers of bits (bit configurations) of sub-A/D converters 9 and 9b and D/A converters 10 and 10b are set to the same value.

The first (initial)-stage circuit 3 comprises a sub-A/D converter 9, a D/A converter 10, an operational amplification circuit 11, a subtraction circuit 12, and an operational amplification circuit 13a having a switchable gain. The subtraction circuit 12 and the operational amplification circuit 13a constitute a subtraction amplification circuit 14a.

Each of the second- and third-stage circuits 4 and 5 comprises a sub-A/D converter 9b having a switchable full-scale range, a D/A converter 10b having a switchable full-scale range, an operational amplification circuit 11, a subtraction circuit 12, and an operational amplification circuit 13. The subtraction circuit 12 and the operational amplification circuit 13 constitute a subtraction amplification circuit 14. The fourth (final)-stage circuit 6 comprises only a sub-A/D converter 9b having a switchable full-scale range.

Here, the sub-A/D converters 9b in the second to fourth stages shall have accuracy which is two times the accuracy of the sub-A/D converters 9 in the second to fourth stages shown in FIG. 35. Description is made of the redesign of the analog-to-digital conversion circuit 1 in a case where the sub-A/D converter 9b having accuracy which is two times the accuracy of the sub-A/D converters 9 is used in the second to fourth stages.

The gain of the subtraction amplification circuit 14a in the first-stage circuit 3 can be switched to one and two. Further, the full-scale range of the sub-A/D converter 9b in each of the second- to fourth-stage circuits 4 to 6 can be switched to $VIN_{p-p}/8$ and $VIN_{p-p}/6$. Further, the full-scale range of the D/A converter 10b in each of the second- and third-stage circuits 4 and 5 can be switched to $VIN_{p-p}/4$ and $VIN_{p-p}/8$.

Here, the gain of the subtraction amplification circuit 14a in the first-stage circuit 3 is switched to one. Further, the full-scale range of the sub-A/D converter 9b in each of the second- to fourth-stage circuits 4 to 6 is switched to $VIN_{p-p}/16$. The full-scale range of the D/A converter 10b in each of the second- and third-stage circuits 4 and 5 is switched to $VIN_{p-p}/8$.

The full-scale range of the sub-A/D converter 9 in the first-stage circuit 3 is $VIN_{p-p}$. Further, the gain of each of the operational amplification circuits 11 and 13 in each of the second- and third-stage circuits 3 and 4 is two.

Description is herein made of the operations of the analog-to-digital conversion circuit 1 shown in FIG. 16 and the output voltage range of each of the circuits in a case where the voltage range of the analog input signal is $VIN_{p-p}$.

The sample-and-hold circuit 2 samples an analog input signal Vin, and holds the sampled analog input signal for a predetermined time period. The analog input signal Vin outputted from the sample-and-hold circuit 2 is transferred to the first-stage circuit 3.

In the first-stage circuit 3, the sub-A/D converter 9 subjects the analog input signal Vin at the voltage range $VIN_{p-p}$ to analog-to-digital conversion. The full-scale range of the sub-A/D converter 9 at this time is $VIN_{p-p}$.

A high order 4-bit digital output ($2^9$, $2^8$, $2^7$, $2^6$), which is the result of the A/D conversion by the sub-A/D converter 9, is transferred to the D/A converter 10, and is also transferred to the output circuit 8 through the four latch circuits 7. The D/A converter 10 converts the high order 4-bit digital output, which is the result of the A/D conversion by the sub-A/D converter 9, into an analog signal.

Since the full-scale range of the D/A converter 10 is fixed, the normal output voltage range of the D/A converter 10 is expressed by the following equation:

(resolution in first stage-1)×(full-scale range of D/A converter 10)/ (resolution in first stage)=$(2^4-1)\times(VIN_{p-p})/2^4=15VIN_{p-p}/16$ On the other hand, the operational amplification circuit 11 samples, amplifies, and holds the analog input signal Vin. Since the gain of the operational amplification circuit 11 is one, the output voltage range of the operational amplification circuit 11 is expressed by the following equation:

(voltage range of analog input signal Vin)×(gain of operational amplification circuit 11)=$VIN_{p-p}\times 1=VIN_{p-p}$ The subtraction amplification circuit 14a subtracts the analog input signal Vin outputted from the operational amplification circuit 11 and the result of D/A conversion by the D/A converter 10, and amplifies the result of the subtraction. An output from the subtraction amplification circuit 14a is transferred to the second-stage circuit 4.

Since the gain of the subtraction amplification circuit 14a in the first stage is switched to one, the output voltage range of the subtraction amplification circuit 14a is expressed by the following equation:

((output voltage range of operational amplification circuit 11)- (normal output voltage range of D/A converter 10))×(gain of subtraction amplification circuit 14a)=$((VIN_{p-p})-(15VIN_{p-p}/16))\times 1=VIN_{p-p}/16$ In the second-stage circuit 4, the sub-A/D converter 9b subjects the output from the subtraction amplification circuit 14a in the first-stage circuit 3 to A/D conversion. The result of the A/D conversion by the sub-A/D converter 9 is transferred to the D/A converter 10, and is also transferred to the output circuit 8 through the three latch circuits 7.

In this case, the sub-A/D converter 9b has accuracy which is twice that of the A/D converter 9 shown in FIG. 35. Accordingly, an intermediate high order 2-bit digital output ($2^5$, $2^4$) is obtained from the second-stage circuit 4 at the full-scale range $VIN_{p-p}/16$ which is one-half that of the sub-A/D converter 9 shown in FIG. 35.

The D/A converter 10b converts the intermediate high order 2-bit digital output, which is the result of the A/D conversion by the sub-A/D converter 9b, into an analog signal.

Since the full-scale range of the D/A converter 10b is switched to $VIN_{p-p}/8$ which is one-half that of the D/A converter 10 shown in FIG. 35, the normal output voltage range of the D/A converter 10b is expressed by the following equation:

(resolution in second stage-1)×(full-scale range of D/A converter 10)/(resolution in second stage)=$(2^2-1)\times(VIN_{p-p}/8)/2^2=3VIN_{p-p}/32$ On the other hand, the subtraction amplification circuit 11 amplifies the output from the subtraction amplification circuit 14a in the first-stage circuit 3. Since the gain of the subtraction amplification circuit 14a in the first-stage circuit 3 is switched to one, as described above, the output voltage range of the operational amplification circuit 11 is expressed by the following equation:

((output voltage range of subtraction amplification circuit 14a in first stage)-(gain of operational amplification circuit 11)= $((VIN_{p-p}/16)\times 2=VIN_{p-p}/8$ The subtraction amplification circuit 14 subtracts the output from the operational amplification circuit 11 and the result of D/A conversion by the D/A converter 10b. An output from the subtraction amplification circuit 14 is transferred to the third-stage circuit 5.

The output voltage range of the subtraction amplification circuit 14 in the second stage is expressed by the following equation:

((output voltage range of operational amplification circuit 11)−(normal output voltage range of D/A converter 10))×(gain of subtraction amplification circuit 14)=$((VIN_{p\text{-}p}/8)-(3VIN_{p\text{-}p}/32))\times 2=VIN_{p\text{-}p}/16$ The third-stage circuit 5 performs the same operations as those of the second-stage circuit 4 with respect to the output from the subtraction amplification circuit 14 in the second-stage circuit 4. In this case, the sub-A/D converter 9b has accuracy which is twice that of the A/D converter 9 shown in FIG. 35. Consequently, an intermediate low order 2-bit digital output ($2^3$, $2^2$) is obtained from the third-stage circuit 5 at the full-scale range $VIN_{p\text{-}p}/16$ which is one-half that of the sub-A/D converter 9 shown in FIG. 35. The output voltage range of each of the circuits is the same as that in the second-stage circuit 4.

In the fourth-stage circuit 6, the sub-A/D converter 9b subjects the output from the subtraction amplification circuit 14 in the third-stage circuit 5 to A/D conversion. In this case, the sub-A/D converter 9b has accuracy which is twice that of the sub-A/D converter 9 shown in FIG. 35. Consequently, a low order 2-bit digital output ($2^1$, $2^0$) is obtained from the fourth-stage circuit 6 at the full-scale range $VIN_{p\text{-}p}/16$ which is one-half that of the sub-A/D converter 9 shown in FIG. 35.

The digital outputs from the first- to fourth-stage circuits 3 to 6 simultaneously reach the output circuit 8 through the respective latch circuits 7. That is, the latch circuits 7 are provided to synchronize the respective digital outputs from the circuits 3 to 6 with each other.

The output circuit 8 outputs a 10-bit digital output Dout of the analog input signal Vin in parallel after digital correction processing, when required.

As described in the foregoing, in the analog-to-digital conversion circuit 1 shown in FIG. 18, the sub-A/D converter 9b having accuracy which is twice that of the sub-A/D converter 9 is used, thereby obtaining the same digital output as that obtained before the voltage range of each of the second and succeeding stages of circuits 4 to 6 is one-half that of the analog-to-digital conversion circuit 100 shown in FIG. 35 irrespective of the fact that the voltage range is reduced to half.

In this case, the voltage range is optimized to that of the sub-A/D converter 9b having accuracy which is two times that of the sub-A/D converter 9 and is set to one-half that of the analog-to-digital converter 9, so that an AC component of a current flowing through each of the first- to fourth-stage circuits 3 to 6 decreases. Consequently, it is possible to provide an analog-to-digital conversion circuit whose consumed current is reduced by optimizing the voltage range without changing the circuit design.

(5) Circuit Structure of Each Circuit

Figure 19:
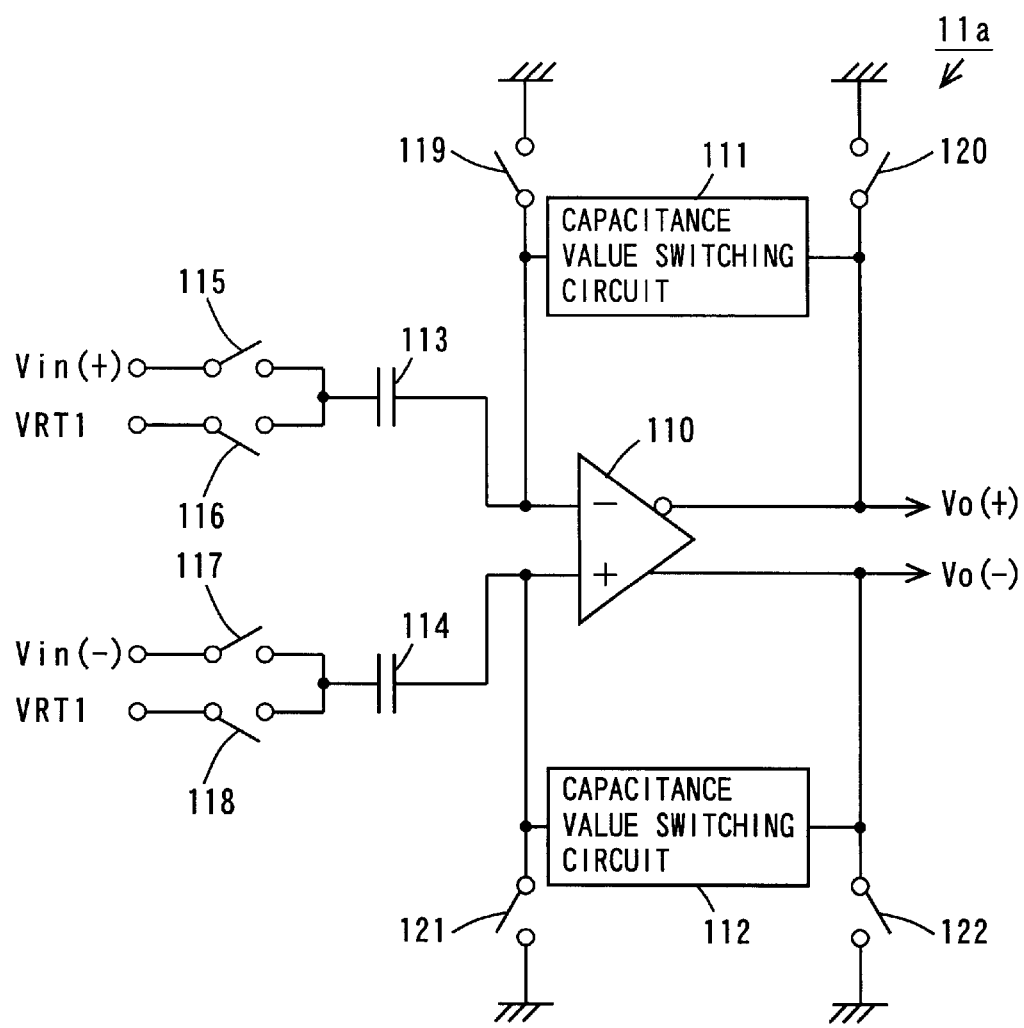
FIG. 19 is a circuit diagram showing a first example of the structure of an operational amplification circuit in the analog-to-digital conversion circuit shown in FIG. 16.

FIG. 19 is a circuit diagram showing a first example of the structure of the operational amplification circuit 11a in the analog-to-digital conversion circuit 1 shown in FIG. 16.

The operational amplification circuit 11a shown in FIG. 19 comprises an operational amplifier 110, capacitance value switching circuits 111 and 112, capacitors 113 and 114, and switches 115 to 122. Each of the switches 115 to 122 is composed of a MOS (metal Oxide Semiconductor) transistor, for example.

The capacitance value switching circuit 111 is connected as a feedback capacitance between an inverse input terminal and an inverse output terminal of the operational amplifier 110, and the capacitance value switching circuit 112 is connected as a feedback capacitance between a non-inverse input terminal and a non-inverse output terminal thereof. Further, the capacitor 113 is connected as an input capacitance to the inverse input terminal of the operational amplifier 110, and the capacitor 114 is connected as an input capacitance to the non-inverse input terminal. A positive side analog input voltage Vin (+) and an intermediate reference voltage VRT1 are respectively supplied to the capacitor 113 through the switches 115 and 116. On the other hand, a negative side analog input voltage Vin (−) and an intermediate reference voltage VRT1 are respectively supplied to the capacitor 114 through the switches 117 and 118. The inverse input terminal, the inverse output terminal, the non-inverse input terminal, and the non-inverse output terminal of the operational amplifier 110 are respectively grounded through the switches 119, 120, 121, and 122.

Letting CA be the capacitance value of each of the capacitors 113 and 114, and letting CB be the capacitance value of each of the capacitance value switching circuits 111 and 112, a positive side analog output voltage Vo (+) of the inverse output terminal of the operational amplifier 110 and a negative side analog output voltage Vo (−) of the non-inverse output terminal thereof are expressed by the following equation:

$Vo(+)=(Vin(+)-VRT1)(CA/CB)$ $Vo(-)=(Vin(-)-VRT1)(CA/CB)$ $\Delta Vo=Vo(+)-Vo(-)=(Vin(+)-Vin(-))(CA/CB)$ Consequently, the gain of the operational amplification circuit 11a can be switched by switching the capacitance value CB of each of the capacitance value switching circuits 111 and 112.

Figure 20:
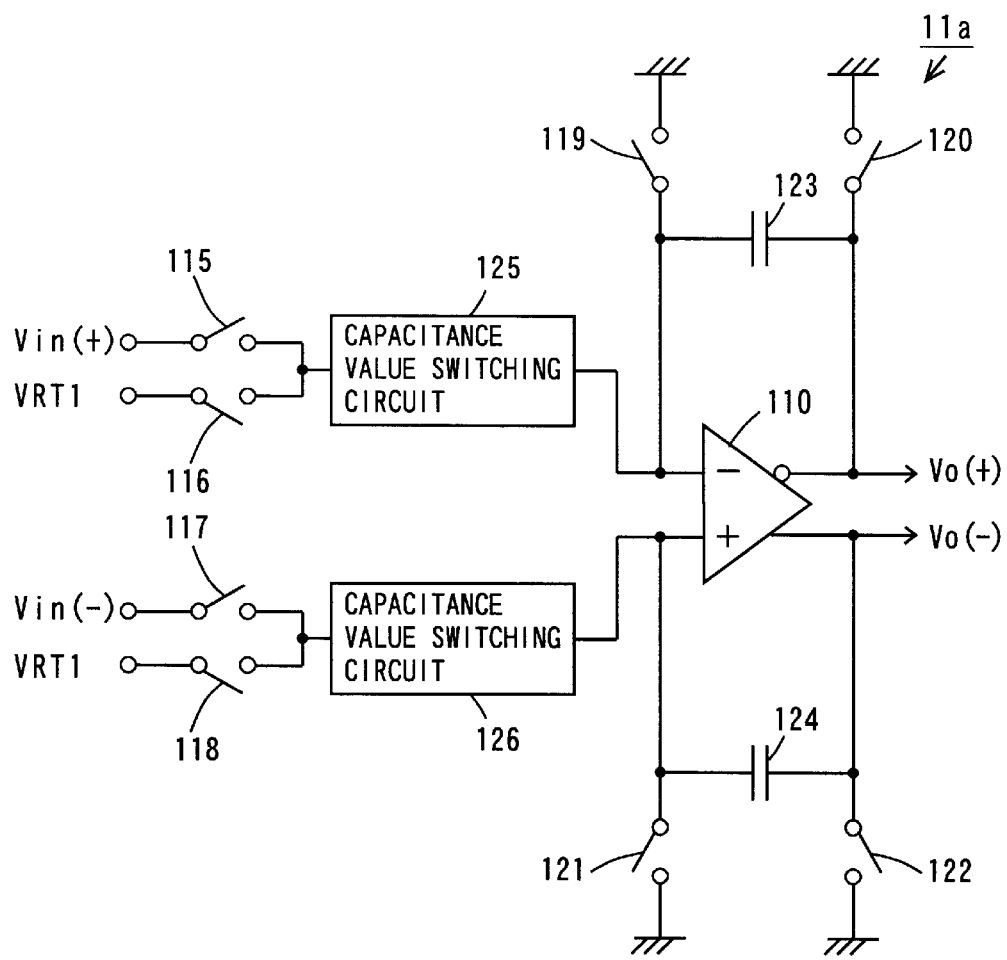
FIG. 20 is a circuit diagram showing a second example of the structure of an operational amplification circuit in the analog-to-digital conversion circuit shown in FIG. 16.

FIG. 20 is a circuit diagram showing a second example of the structure of the operational amplification circuit 11a in the analog-to-digital conversion circuit 1 shown in FIG. 16.

The operational amplification circuit 11a shown in FIG. 20 comprises an operational amplifier 110, capacitors 123 and 124, capacitance value switching circuits 125 and 126, and switches 115 to 122.

The capacitor 123 is connected as a feedback capacitance between an inverse input terminal and an inverse output terminal of the operational amplifier 110, and the capacitor 124 is connected as a feedback capacitance between a non-inverse input terminal and a non-inverse output terminal thereof. Further, the capacitance value switching circuit 125 is connected as an input capacitance to the inverse input terminal of the operational amplifier 110, and the capacitance value switching circuit 126 is connected as an input capacitance to the non-inverse input terminal thereof.

A positive side analog input voltage Vin (+) and an intermediate reference voltage VRT1 are respectively supplied to the capacitance value switching circuit 125 through the switches 115 and 116. On the other hand, a negative side analog input voltage Vin (−) and an intermediate reference voltage VRT1 are respectively supplied to the capacitance value switching circuit 126 through the switches 117 and 118. The inverse input terminal, the inverse output terminal, the non-inverse input terminal, and the non-inverse output terminal of the operational amplifier 110 are respectively grounded through the switches 119, 120, 121, and 122.

Letting CC be the capacitance value of each of the capacitance value switching circuits 125 and 126, and letting CD be the capacitance value of each of the capacitors 123 and 124, a positive side analog output voltage Vo(+) of the inverse output terminal of the operational amplifier 110 and a negative side analog output voltage Vo (−) of the non-inverse output terminal thereof are expressed by the following equation:

$$Vo(+)=(Vin(+)-\text{VRT1})(CC/CD)$$

$$Vo(-)=(Vin(-)-\text{VRT1})(CC/CD)$$

$$\Delta Vo=Vo(+)-Vo(-)=(Vin(+)-Vin(-))(CC/CD)$$

Consequently, the gain of the operational amplification circuit 11a can be switched by switching the capacitance value CC of each of the capacitance value switching circuits 125 and 126.

FIGS. 21 to 26 are circuit diagrams showing first to sixth examples of the specific circuit structure of the operational amplification circuit 11a.

In FIGS. 21 to 26, the capacitors Ca, Cb, and Cc shall have an equal capacitance value C. m is taken as an arbitrary positive integer.

In the example shown in FIG. 21, a parallel circuit of m capacitors Ca and a switch Sa are connected in series and the parallel circuit of the m capacitors Ca is connected between the inverse input terminal and the inverse output terminal of the operational amplifier 110. m is an arbitrary positive integer. Similarly, a parallel circuit of m capacitors Ca and a switch Sa are connected in series and the parallel circuit of the m capacitors Ca is connected between the non-inverse input terminal and the non-inverse output terminal of the operational amplifier 110. Further, 2m capacitors Cb are connected to the inverse input terminal of the operational amplifier 110, and the 2m capacitors Cb are connected to the non-inverse input terminal thereof.

A positive side analog input voltage Vin (+) is respectively supplied to the 2m capacitors Cb on the side of the inverse input terminal through switches S1. On the other hand, a negative side analog input voltage Vin (−) is respectively supplied to the capacitors Cb on the side of the non-inverse input terminal through switches S1. A high-potential side reference voltage VRT is supplied to the m capacitors Cb on the side of the inverse input terminal and the m capacitors Cb on the side of the non-inverse input terminal, respectively, through switches S2, and a low-potential side reference voltage VRB is supplied to the m capacitors Cb on the side of the inverse input terminal and the m capacitors on the side of the non-inverse input terminal, respectively, through switches S2.

In this example, the value of the input capacitance is 2mC. The value of the feedback capacitance is 2mC when the switch Sa is turned on, while being mC when the switch Sa is turned off. Consequently, the gain is one by turning the switch Sa on at the time of a differential double-ended input, while being two by turning the switch Sa off at the time of a single-ended input.

Figure 22:
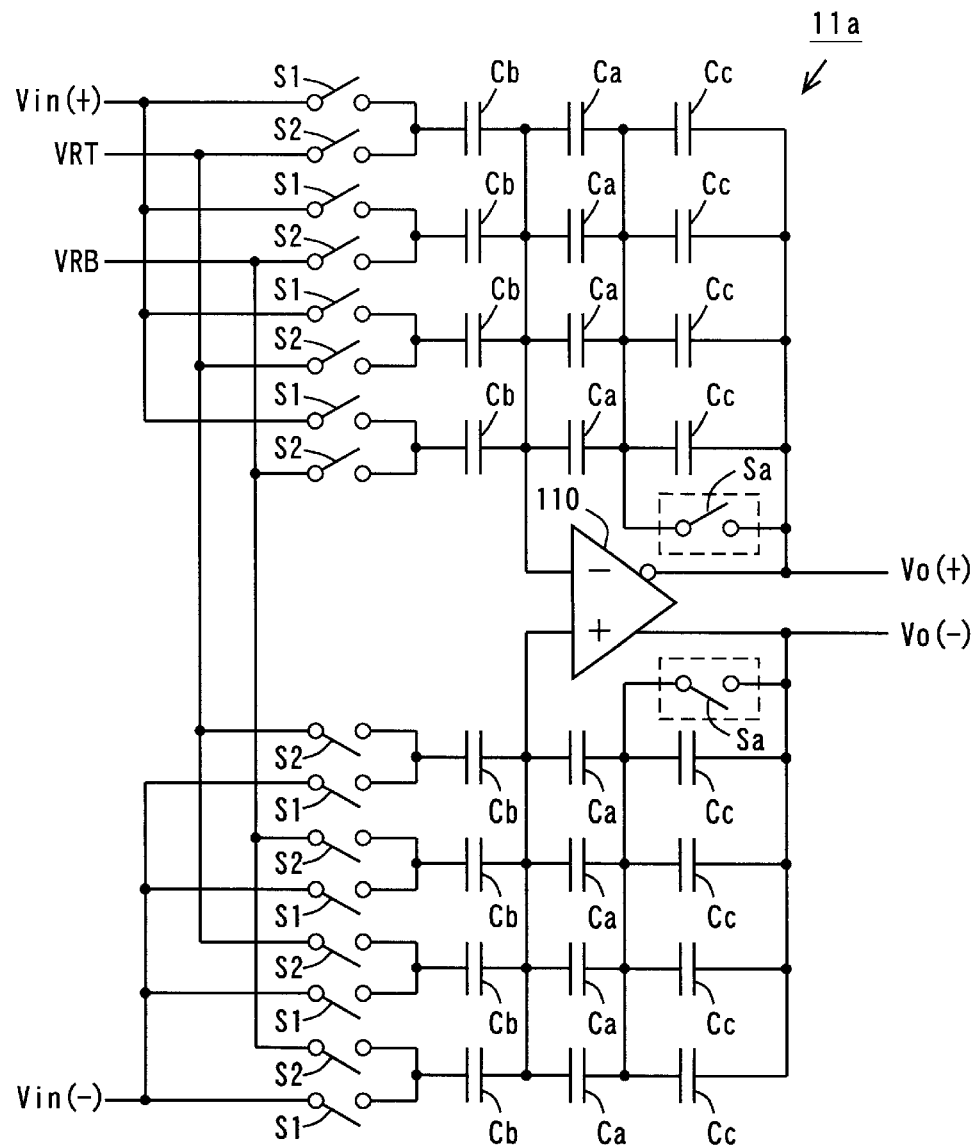
FIG. 22 is a circuit diagram showing a second example of the specific circuit structure of an operational amplification circuit.

In the example shown in FIG. 22, a parallel circuit of 2m capacitors Ca and a parallel circuit of 2m capacitors Cc are connected in series between the inverse input terminal and the inverse output terminal of the operational amplifier 110, and a switch Sa is connected in parallel with the capacitors Ca. Similarly, a parallel circuit of 2m capacitors Ca and a parallel circuit of 2m capacitors Cc are connected in series between the non-inverse input terminal and the non-inverse output terminal of the operational amplifier 110, and a switch Sa is connected in parallel with the capacitors Ca. The structures of the other parts in the operational amplification circuit 11a shown in FIG. 22 are the same as the structures of those in the operational amplification circuit 11a shown in FIG. 21.

In this example, the value of the input capacitance is 2mC. The value of the feedback capacitance is 2mC when the switch Sa is turned on, while being mC when the switch Sa is turned off. Consequently, the gain is one by turning the switch Sa on at the time of a differential double-ended input, while being two by turning the switch Sa off at the time of a single-ended input.

In the example shown in FIG. 23, a parallel circuit of 2m capacitors Ca and a parallel circuit of 2m capacitors Cc are connected in series between the non-inverse input terminal and the non-inverse output terminal of the operational amplifier 110, and a switch Sa is connected in parallel with the capacitors Ca. Similarly, a parallel circuit of 2m capacitors Ca and a parallel circuit of 2m capacitors Cc are connected in series between the non-inverse input terminal and the non-inverse output terminal of the operational amplifier 110, and a switch Sa is connected in parallel with the capacitor Ca. The structures of the other parts in the operational amplification circuit 11a shown in FIG. 23 are the same as the structures of those in the operational amplification circuit 11a shown in FIG. 21.

In this example, the value of the input capacitance is 2mC. The value of the feedback capacitance is 2mC when the switch Sa is turned on, while being mC when the switch Sa is turned off. Consequently, the gain is one by turning the switch Sa off at the time of a differential double-ended input, while being two by turning the switch Sa off at the time of a single-ended input.

Figure 24:
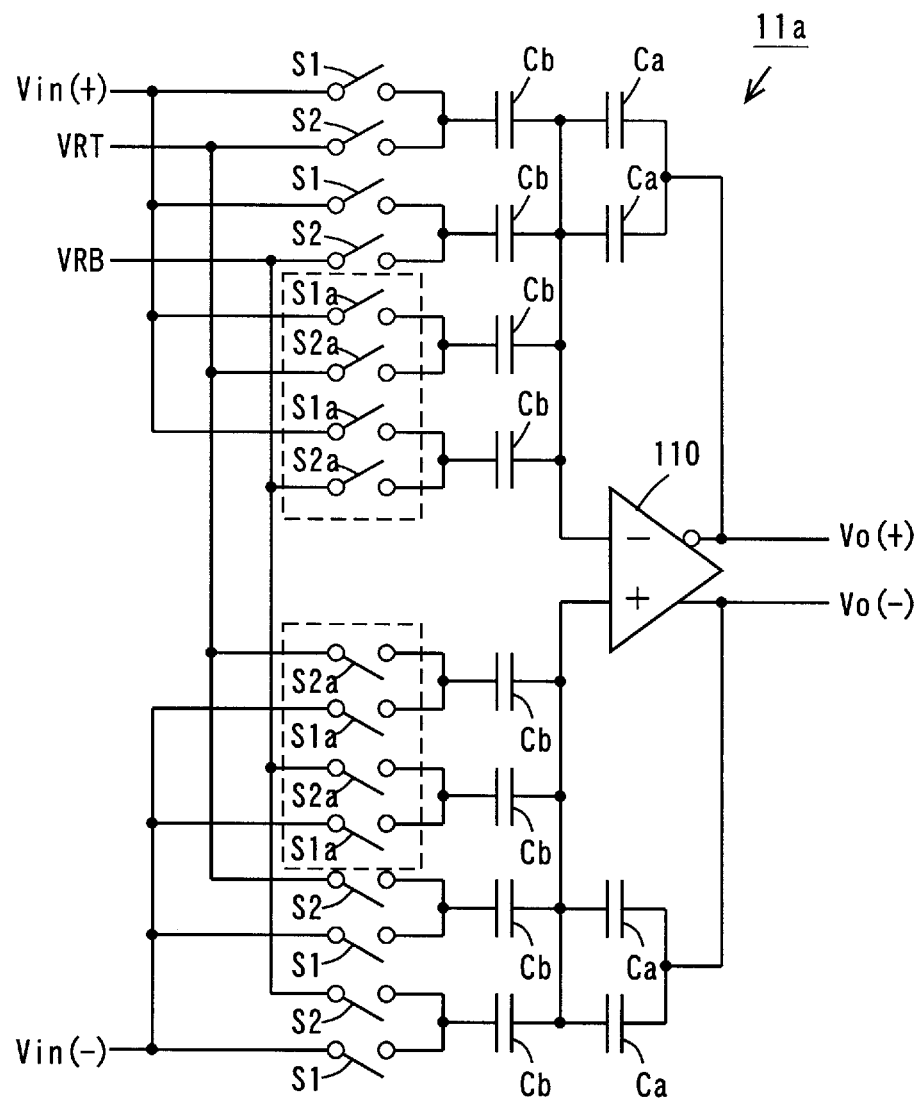
FIG. 24 is a circuit diagram showing a fourth example of the specific circuit structure of an operational amplification circuit.

In the example shown in FIG. 24, a parallel circuit of m capacitors Ca is connected between the inverse input terminal and the inverse output terminal of the operational amplifier 110. Similarly, a parallel circuit of m capacitors Ca is connected between the non-inverse input terminal and the non-inverse output terminal of the operational amplifier 110. Further, 2m capacitors Cb are connected to the inverse input terminal of the operational amplifier 110, and the 2m capacitors Cb are connected to the non-inverse input terminal thereof.

A positive side analog input voltage Vin (+) is respectively supplied to the 2m capacitors Cb on the side of the non-inverse input terminal through switches S1 and S1a. On the other hand, a negative side analog input voltage Vin (−) is respectively supplied to the 2m capacitors Cb on the side of the non-inverse input terminal through switches S1 and S1a. A high-potential side reference voltage VRT is supplied to the m capacitors Cb on the side of the inverse input terminal and the m capacitors Cb on the side of the non-inverse input terminal, respectively, through switches S2 and S2a, and a low-potential side reference voltage VRB is supplied to the m capacitors Cb on the side of the inverse input terminal and the m capacitors on the side of the non-inverse input terminal, respectively, through switches S2 and S2a.

In this example, the value of the feedback capacitance is mC. The value of the input capacitance is 2mC when the switches S1a and S2a are turned on, while being mC when the switches S1a and S2a are turned off. Consequently, the gain is one by always turning the switches S1a and S2a off at the time of a differential double-ended input, while being two by performing switching operations with respect to the switches S1a and S2a, similarly to the switches S1 and S2, at the time of a single-ended input.

Figure 25:
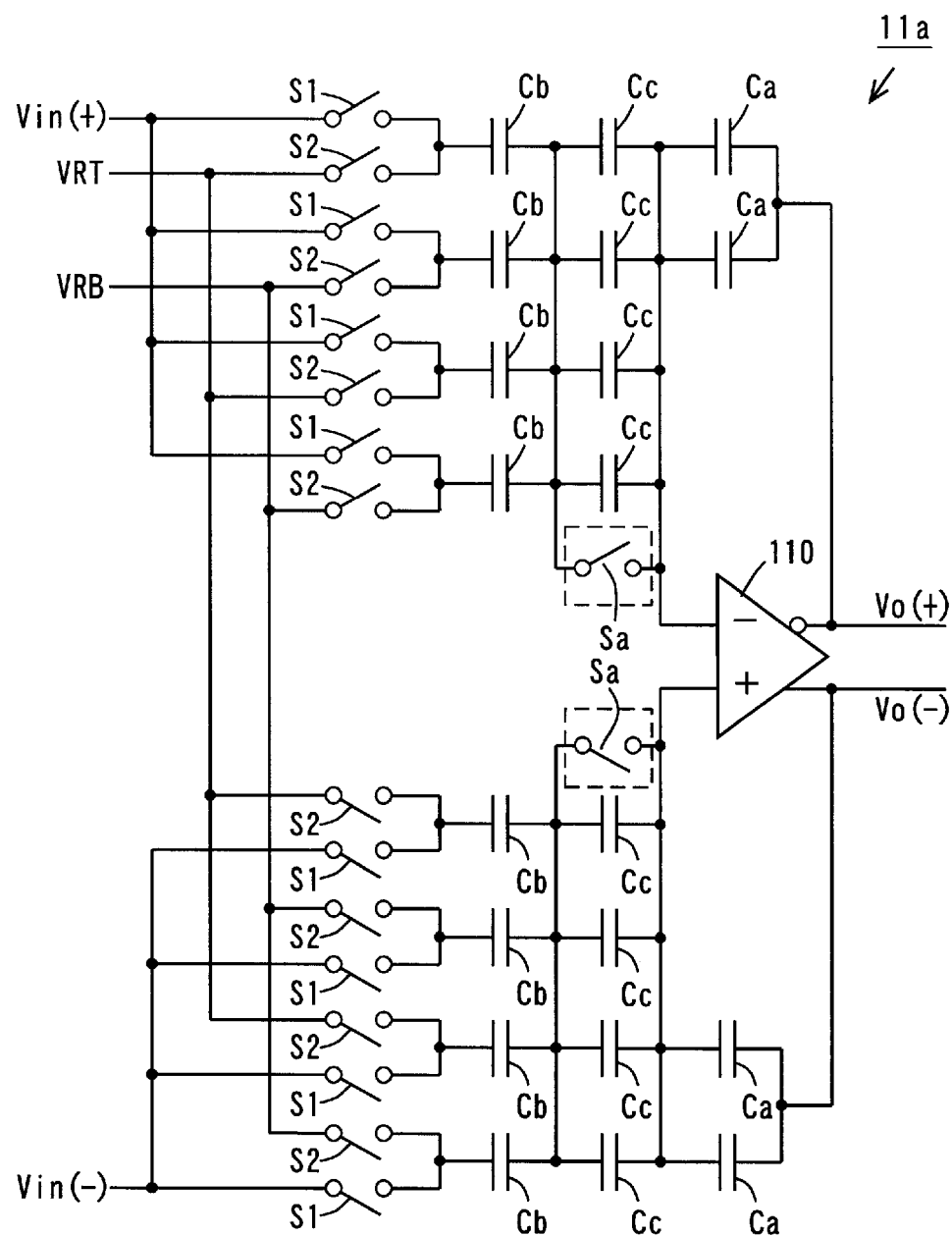
FIG. 25 is a circuit diagram showing a fifth example of the specific circuit structure of an operational amplification circuit.

In the example shown in FIG. 25, a parallel circuit of m capacitors Ca is connected between the inverse input terminal and the inverse output terminal of the operational amplifier 110. Similarly, a parallel circuit of m capacitors Ca is connected between the non-inverse input terminal and the non-inverse output terminal of the operational amplifier 110. Further, a parallel circuit of 2m capacitors Cc is connected to the inverse input terminal of the operational amplifier 110, 2m capacitors Cb are connected to a parallel circuit of capacitors Cc, and a switch Sa is connected in parallel with the capacitors Cc. On the other hand, a parallel circuit of 2m capacitors Cc is connected to the non-inverse input terminal of the operational amplifier 110, 2m capacitors Cb are connected to the parallel circuit of the capacitors Cc, and a switch Sa is connected in parallel with the capacitors Cc. The structures of the other parts in the operational amplification circuit 11a shown in FIG. 25 are the same as the structures of those in the operational amplification circuit 11a shown in FIG. 21.

In this example, the value of the feedback capacitance is mC. The value of the input capacitance is 2mC when the switch Sa is turned on, while being mC when the switch Sa is turned off. Consequently, the gain is one by turning the switch Sa on at the time of a differential double-ended input, while being two by turning the switch Sa on at the time of a single-ended input.

In the example shown in FIG. 26, a parallel circuit of m capacitors Ca is connected between the inverse input terminal and the inverse output terminal of the operational amplifier 110. Similarly, a parallel circuit of m capacitors Ca is connected between the non-inverse input terminal and the non-inverse output terminal of the operational amplifier 110. Further, a parallel circuit of 2m capacitors Cb is connected to the inverse input terminal of the operational amplifier 110, 2m capacitors Cb are connected to a parallel circuit of capacitors Cc, and a switch Sa is connected in parallel with the capacitors Cb. On the other hand, a parallel circuit of 2m capacitors Cc is connected to the non-inverse input terminal, 2m capacitors Cb are connected to the parallel circuit of the capacitors Cc, and a switch Sa is connected in parallel with the capacitors Cb. The structures of the other parts in the operational amplification circuit 11a shown in FIG. 26 are the same as the structures of those in the operational amplification circuit 11a shown in FIG. 21.

In this example, the value of the feedback capacitance is mC. The value of the input capacitance is 2mC when the switch Sa is turned on, while being mC when the switch Sa is turned off. Consequently, the gain is one by turning the switch Sa off at the time of a differential double-ended input, while being two by turning the switch Sa on at the time of a single-ended input.

In the operational amplification circuits 11a shown in FIGS. 21 to 26, the switch Sa is composed of an MOS transistor, as described above. A diffusion capacitance of the MOS transistor is added to a node to which the switch Sa is connected, a gate capacitance is added thereto when the switch Sa is turned on. When a capacitance is added to the inverse input terminal or the non-inverse input terminal of the operational amplifier 110, the operation speed of the operational amplification circuit 11a is reduced.

In the examples shown in FIGS. 21 and 22, the switch Sa is connected to the inverse output terminal and the non-inverse output terminal of the operational amplifier 110. Consequently, the operation speed of the operational amplification circuit 11a is not reduced. Therefore, the examples shown in FIGS. 21 and 22 are preferable.

When the switch Sa is connected in parallel with the capacitor, an on resistance exists when the switch Sa is turned on. Accordingly, the capacitance of the capacitor cannot be completely separated.

In the example shown in FIG. 21, the switch Sa is connected in series with the capacitor Ca, and the switch Sa is connected to the inverse output terminal and the non-inverse output terminal of the operational amplifier 110. Consequently, the capacitance of the capacitor Ca can be completely separated when the switch Sa is turned on. Consequently, the example shown in FIG. 21 is most preferable.

In the example shown in FIG. 24, the switches S1a and S2a are connected to the input side of the capacitor Cb. Conversely, in a case where the capacitor Cb is connected to the input side of the switches S1a and S2a, even if the switches S1a and S2a are set to an off state, the parasitic capacitance of the capacitor Cb is charged. When the gain is set, therefore, the parasitic capacitance must be considered, so that the gain varies depending on the variation in the parasitic capacitance. The switches S1a and S2a are connected to the input side of the capacitor Cb, as in the example shown in FIG. 24, so that the capacitor Cb, together with the parasitic capacitance, is separated by the switches S1a and S2a when the switches S1a and S2a are set to an off state. Therefore, the parasitic capacitance of the capacitor Cb need not be considered when the gain is set in the example shown in FIG. 24, so that the gain does not vary depending on the variation in the parasitic capacitance.

Figure 27:
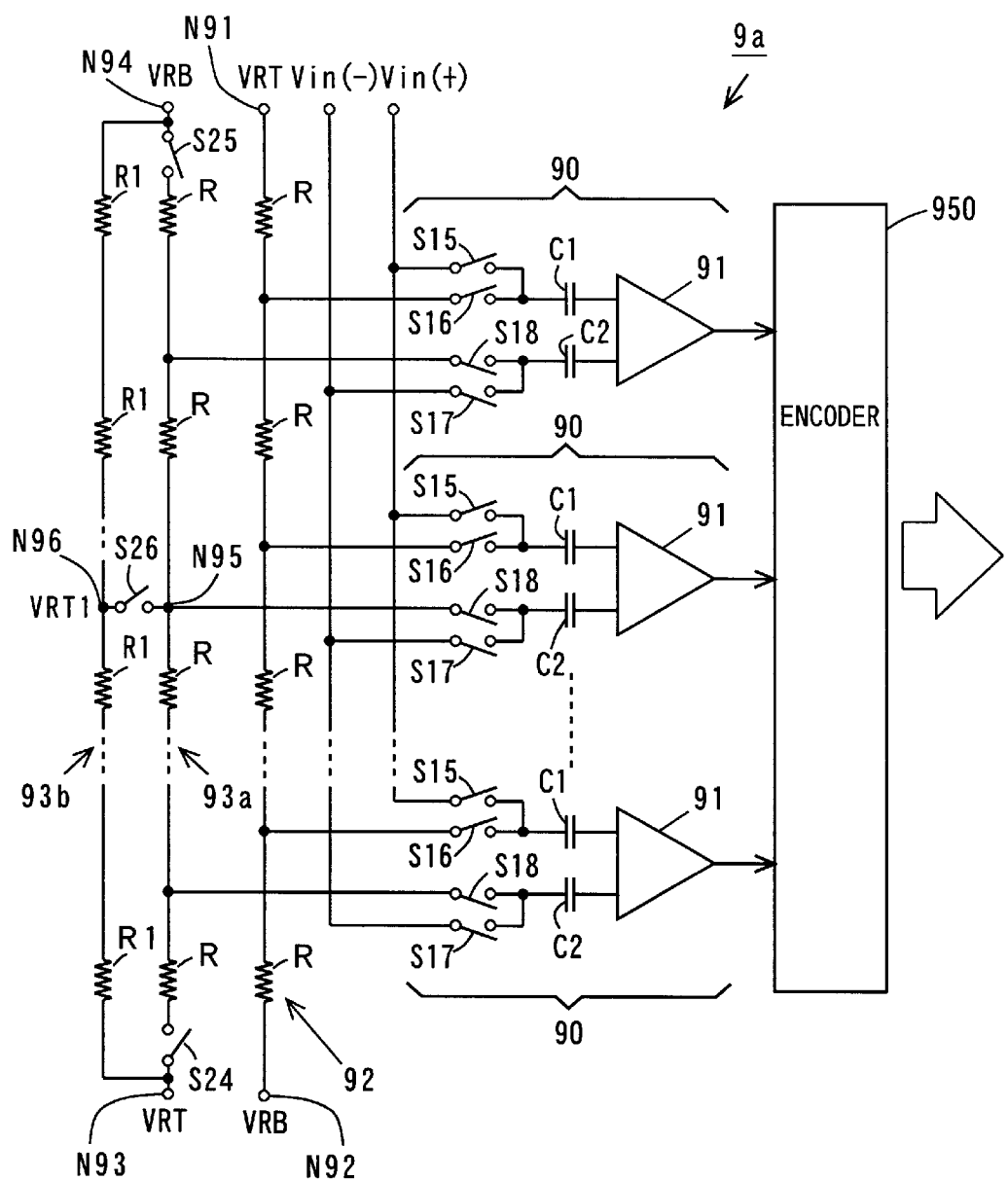
FIG. 27 is a circuit diagram showing a first example of the structure of a sub-A/D converter in the analog-to-digital conversion circuit shown in FIG. 16.
Figure 28:
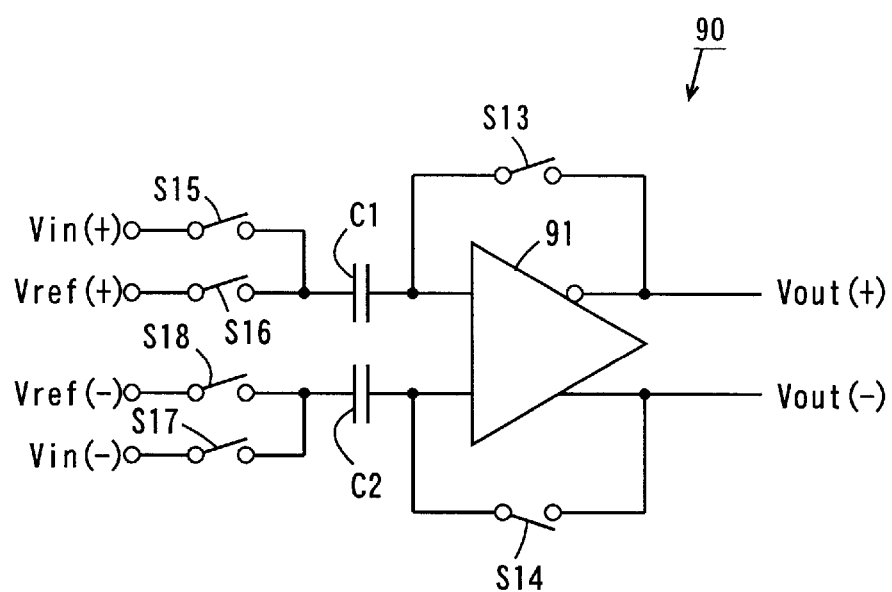
FIG. 28 is a circuit diagram showing the structure of a comparator used in the sub-A/D converter shown in FIG. 27.

FIG. 27 is a circuit diagram showing a first example of the structure of the sub-A/D converter 9a in the analog-to-digital conversion circuit 1 shown in FIG. 16, and FIG. 28 is a circuit diagram showing the structure of a comparator used in the sub-A/D converter 9a shown in FIG. 27.

In FIG. 27, the sub-A/D converter 9a comprises reference voltage generation circuits 92, 93a, and 93b that generate a reference voltage and a plurality of comparators 90.

The reference voltage generation circuit 92 is constituted by a plurality of resistors R connected in series. The reference voltage generation circuit 93a is constituted by a plurality of resistors R connected in series. The reference voltage generation circuit 93b is constituted by a plurality of resistors R1 connected in series. The plurality of resistors R have an equal resistance value, and the plurality of resistors R1 have an equal resistance value.

The reference voltage generation circuit 92 is connected between a node N91 receiving a high-potential side reference voltage VRT and a node N92 receiving a low-potential side reference voltage VRB. The reference voltage generation circuit 93a is connected between a node N93 receiving the high-potential side reference voltage VRT and a node N94 receiving the low-potential side reference voltage VRB through switches S24 and S25. The reference voltage generation circuit 93b is connected between the node N93 receiving the high-potential side reference voltage VRT and the node N94 receiving the low-potential side reference voltage VRB. A switch S26 is connected between an intermediate node N95 in the reference voltage generation circuit 93a and an intermediate node N96 in the reference voltage generation circuit 93b.

Different reference voltages are respectively generated at nodes among the resistors R in the reference voltage generation circuit 92. Similarly, different reference voltages are respectively generated at nodes among the resistors R in the reference voltage generation circuit 93a. Here, the different reference voltages obtained by the reference voltage generation circuit 92 are referred to as positive-side reference voltages Vref (+). The different reference voltages obtained by the reference voltage generation circuit 93a are referred to as negative-side reference voltages Vref (−).

An intermediate reference voltage VRT1 (=(VRT−VRB)/2) which is a voltage intermediate between the high-potential side reference voltage VRT and the low-potential side reference voltage VRB is generated at the intermediate node N96 of the reference voltage generation circuit 93b.

As shown in FIG. 28, each of the comparators 90 comprises an operational amplifier 91, capacitors C1 and C2, and switches S13 to S18. The switch S13 is connected between an inverse input terminal and an inverse output terminal of the operational amplifier 91, and the switch S14 is connected between a non-inverse input terminal and a non-inverse output terminal thereof. Further, the capacitor C1 is connected to the inverse input terminal of the operational amplifier 91, and the capacitor C2 is connected to the non-inverse input terminal thereof. The switches S15 and S16 are connected to the capacitor C1, and the switches S17 and S18 are connected to the capacitor C2. In FIG. 27, the illustration of the switches S13 and S14 in each of the comparators 90 is omitted.

A positive side analog input voltage Vin (+) and the positive-side reference voltage Vref (+) are respectively supplied to the capacitor C1 through the switches S15 and S16. On the other hand, a negative side analog input voltage Vin (−) and the negative-side reference voltage Vref (−) are respectively supplied to the capacitor C2 through the switches S17 and S18.

In the initial state, the switches S13, S14, S15, and S17 are turned on, and the switches S16 and S18 are turned off. After the switches S13 and S14 are then turned off, the switches S15 and S17 are turned off, and the switches S16 and S18 are turned on. At the time point where the switches S13 and S14 are turned off, the inverse input terminal and the non-inverse input terminal of the operational amplifier 91 are in a floating state. Accordingly, a voltage at the inverse input terminal is shifted to (Vin (+)−Vref (+)), and a voltage at the non-inverse input terminal is shifted to (Vin (−)−Vref (−)). As a result, a differential analog input voltage (Vin (+)−Vin (−)) and a differential reference voltage (Vref (+)−Vref (−)) are compared with each other, and a positive side analog output voltage Vo (+) and a negative side analog output voltage Vo (−) change depending on the result of the comparison.

The results of the comparison by the plurality of comparators 90 shown in FIG. 27 are encoded by an encoder 950, thereby making it possible to obtain a digital code Dcode.

In the sub-A/D converter 9a shown in FIG. 27, at the time of a differential double-ended input, the switches S24 and S25 are turned on, and the switch S26 is turned off. Consequently, difference negative-side reference voltages Vref (−) are respectively supplied to the capacitors C2 in the comparators 90 through the switches S18 by the reference voltage generation circuit 93a. At the time of a single-ended input, the switches S24 and S25 are turned off, and the switch S26 is turned on. Consequently, the intermediate reference voltage VRT1 is supplied to the capacitors C2 in the comparators 90 through the switches S18.

In the sub-A/D converter 9a, the full-scale range is thus switched.

The switch S26 may be connected between the intermediate node N95 in the reference voltage generation circuit 93a and the intermediate node in the reference voltage generation circuit 92 without providing the reference voltage generation circuit 93b.

Figure 30:
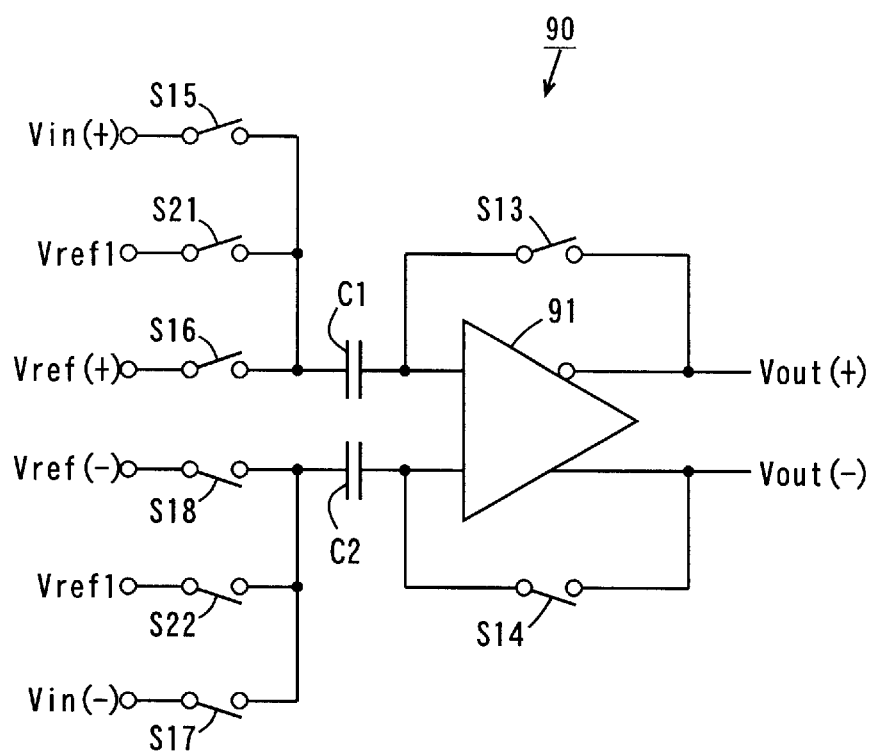
FIG. 30 is a circuit diagram showing the structure of a comparator used in the sub-A/D converter shown in FIG. 29.

FIG. 29 is a circuit diagram showing a second example of the structure of the sub-A/D converter 9a in the analog-to-digital conversion circuit 1 shown in FIG. 16. FIG. 30 is a circuit diagram showing the structure of a comparator used in the sub-A/D converter 9a shown in FIG. 29.

In FIG. 29, the switch S26 shown in FIG. 27 is connected between an intermediate node N95 in a reference voltage generation circuit 93a and an intermediate node N96 in a reference voltage generation circuit 93b.

As shown in FIG. 30, each of comparators 90 comprises an operational amplifier 91, capacitors C1 and C2, and switches S15 to S18, and further comprises switches S21 and S22. One end of the switch S21 is connected to the capacitor C1, and the other end of the switch S21 is opened. One end of the switch S22 is connected to the capacitor C2, and the other end thereof is connected to the intermediate node N96 in the reference voltage generation circuit 93b shown in FIG. 29. The structures of the other parts in the comparator 90 shown in FIG. 3 are the same as the structures of those in the comparator 90 shown in FIG. 28.

An intermediate reference voltage VRT1 is supplied to the capacitor C2 through the switch S22 by the reference voltage generation circuit 93b.

The operations of the comparator 90 shown in FIG. 30 at the time of a differential double-ended input are the same as the operations of the comparator 90 shown in FIG. 28. At this time, the switches S21 and S22 are normally turned off. At the time of a single-ended input, the switch S22 is operated in place of the switch S18. At this time, the switch S21 is normally turned off.

In the sub-A/D converter 9a shown in FIG. 29, at the time of a differential double-ended input, switches S24 and S25 are turned on. At this time, the switches S21 and S22 are normally turned off. Consequently, different negative-side reference voltages Vref (−) are respectively supplied to the capacitors C2 in the comparators 90 through the switches 18 by the reference voltage generation circuit 93a. At the time of a single-ended input, the switches S24 and S25 are turned off, and the switch S22 is operated in place of the switches S18. At this time, the switch S21 is normally turned off. Consequently, an intermediate reference voltage VRT1 is supplied to the capacitors C2 in the comparators 90 through the switches S22 by the reference voltage generation circuit 93b.

In the sub-A/D converter 9a, the full-scale range is thus switched.

Although the switch S21 need not be provided in each of the comparators 90, the switch S21 is preferably provided in order to ensure the symmetry of the circuit structure of the comparator 90.

Figure 31:
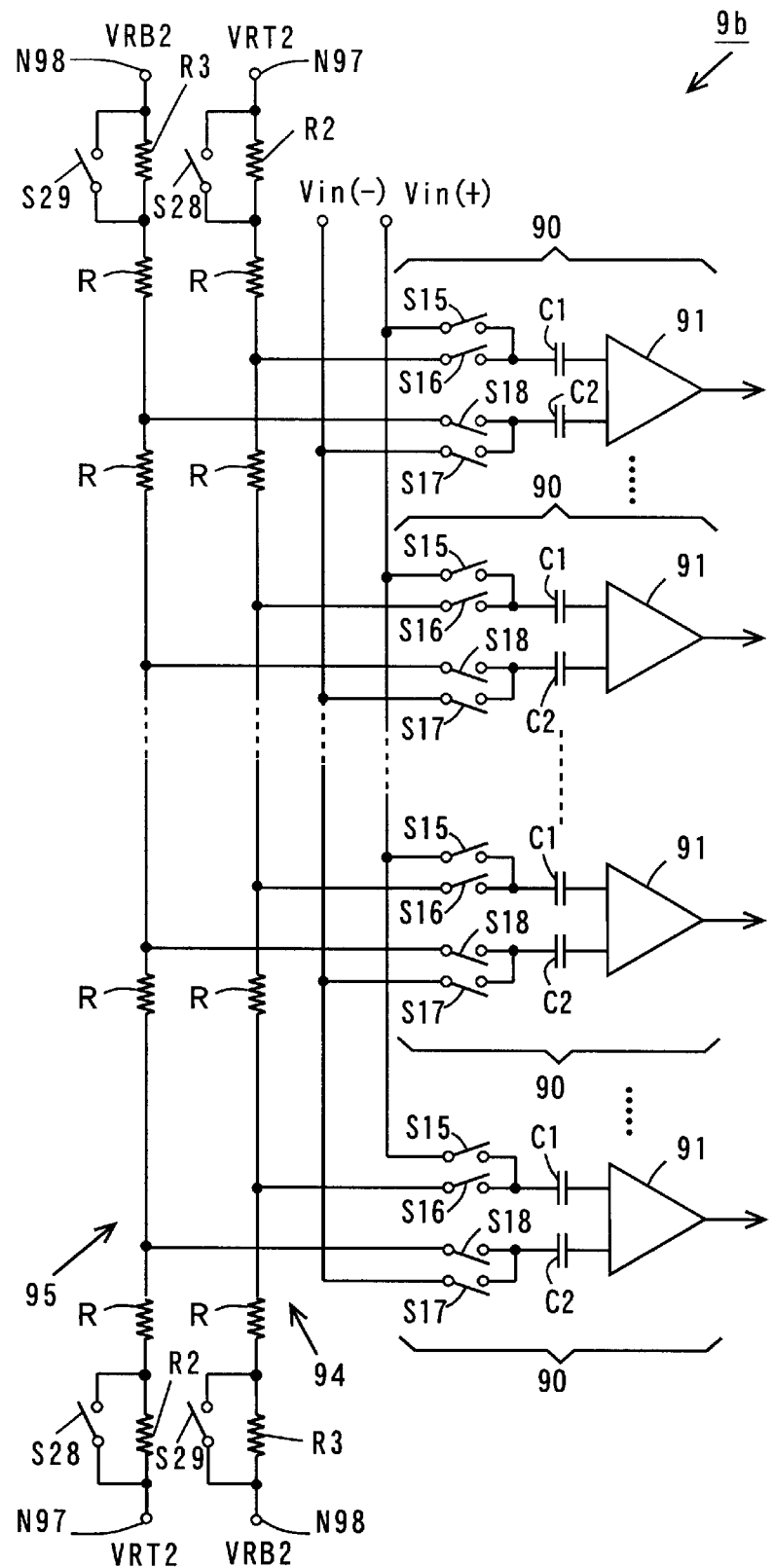
FIG. 31 is a circuit diagram showing a sub-A/D converter in the second-stage circuit in the analog-to-digital conversion circuit shown in FIG. 18.

FIG. 31 is a circuit diagram showing the sub-A/D converter 9b in the second-stage circuit 4 in the analog-to-digital conversion circuit 1 shown in FIG. 18. The sub-A/D converter 9b is a total parallel comparison (flash) system sub-A/D converter.

The sub-A/D converter 9b comprises reference voltage generation circuits 94 and 95 that respectively generate reference voltages and a plurality of comparators 90. Each of the reference voltage generation circuits 94 and 95 comprises a resistor R2, 2n resistors R, and a resistor R3. Each of the resistors R2 and R3 has a resistance value which is n times that of the resistor R. The resistor R2, the 2n resistors R, and the resistor R3 are connected between a node N97 receiving a high-potential side reference voltage VRT2 and a node N98 receiving a low-potential side reference voltage VRB2. A switch S28 is connected to both ends of the resistor R2, and a switch S29 is connected to both ends of the resistor R3.

Different reference voltages are respectively generated at nodes among the resistors R in the reference voltage generation circuit 94. Similarly, different reference voltages are respectively generated at nodes among the resistors R in the reference voltage generation circuit 95. Here, the different reference voltages obtained by the reference voltage generation circuit 94 are referred to as positive-side reference voltages Vref (+). The different reference voltages obtained by the reference voltage generation circuit 95 are referred to as negative-side reference voltages Vref (−).

A positive side analog input voltage Vin (+) and the positive-side reference voltage Vref (+) are respectively supplied to capacitors C1 in the comparators 90 through switches S15 and S16. A negative side analog input voltage Vin (−) and the negative-side reference voltage Vref (−) are respectively supplied to capacitors C2 in the comparators 90 through switches S17 and S18. The structure and the operations of the comparator 90 shown in FIG. 31 are the same as the structure and the operations of the comparator 90 shown in FIG. 28.

The difference between the high-potential side reference voltage VRT2 and the low-potential side reference voltage VRB2 is set to $VIN_{p-p}/8$. When the respective switches S28 and S29 in the reference voltage generation circuits 95 and 94 are turned off, the full-scale range is $VIN_{p-p}/16$. On the other hand, when the switches S28 and S29 are turned on, the full-scale range is $VIN_{p-p}/8$. The full-scale range can be thus switched to one and two in the sub-A/D converter 9b.

Figure 32:
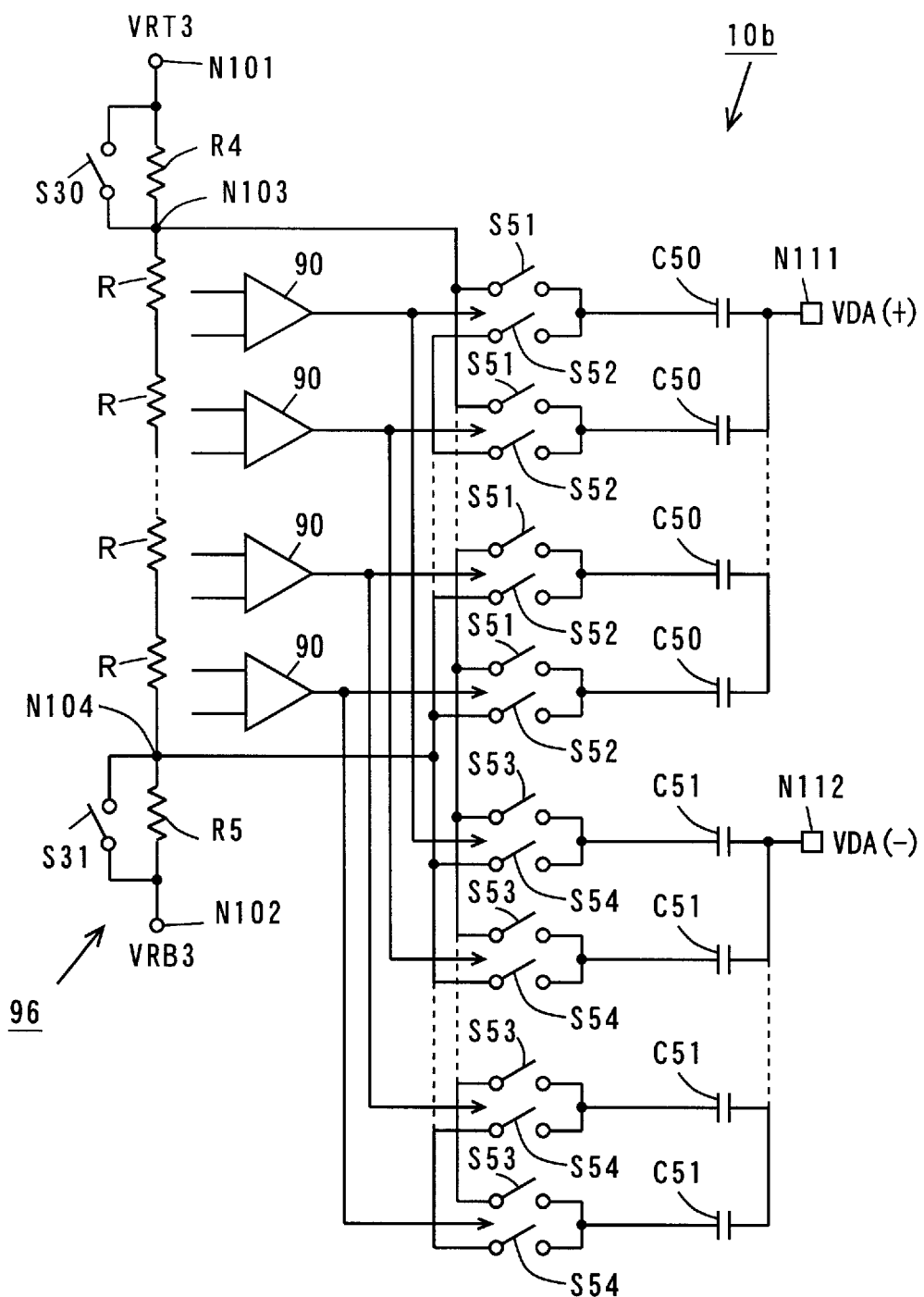
FIG. 32 is a circuit diagram showing a D/A converter in the second-stage circuit in the analog-to-digital conversion circuit shown in FIG. 18.

FIG. 32 is a circuit diagram showing the D/A converter 10b in the second-stage circuit 4 in the analog-to-digital conversion circuit 1 shown in FIG. 18. The D/A converter 10 is a capacitance array system D/A converter.

The D/A converter 10b comprises a reference voltage generation circuit 96 that generates a reference voltage, a plurality of positive-side switches S51 and S52, a plurality of negative-side switches S53 and S54, a plurality of positive-side capacitors C50, and a plurality of negative-side capacitors C51 which are respectively connected to one another in an array shape.

The reference voltage generation circuit 96 comprises a resistor R4, a plurality of resistors R, and a resistor R5. Each of the resistors R4 and R5 has a resistance value which is one-half the resistance value of a total of the plurality of resistors R. The resistor R4, the plurality of resistors R, and the resistor R5 are connected in series between a node N101 receiving a high-potential side reference voltage VRT3 and a node N102 receiving a low-potential side reference voltage VRB3. A switch S30 is connected to both ends of the resistor R4, and a switch S31 is connected to both ends of the resistor R5.

All the capacitors C50 and C51 have the same capacitance value. A differential positive side output voltage VDA (+) is generated from one terminal (hereinafter referred to as an output terminal) N111 of the capacitor C50, and a differential negative side output voltage VDA (−) is generated from one terminal (hereinafter referred to as an output terminal) N112 of the capacitor C51. The other terminal of each of the capacitors C50 and C51 is referred to be an input terminal.

One terminal of each of the switches S51 is connected to a node N103 between the resistor R4 and the resistor R, and the other terminal thereof is connected to an input terminal of the capacitor C50. One terminal of each of the switches S52 is connected to a node N104 between the resistor R5 and the resistor R, and the other terminal thereof is connected to the input terminal of the capacitor C50. One terminal of each of the switches S53 is connected to the node N103 between the resistor R4 and the resistor R, and the other terminal thereof is connected to an input terminal of the capacitor C51. One terminal of each of the switches S54 is connected to the node N104 between the resistor R5 and the resistor R, and the other terminal thereof is connected to the input terminal of the capacitor C51.

Each of the switches S51, S52, S53, and S54 performs an on-off operation in accordance with the output level of the comparator 90 in the sub-A/D converter 9b shown in FIG. 31. The four switches S51, S52, S53, and S54 receiving an output signal of the same comparator 90 constitute four series of switches. When an output from the one comparator 90 is at a high level, for example, the switches S51 and S54 are turned on and the switches S52 and S53 are turned off in the four series of switches. Conversely, when the output from the one comparator 90 is at a low level, the switches S51 and S54 are turned off and the switches S52 and S53 are turned on in the four series of switches.

The plurality of switches S51, S52, S53, and S54 respectively perform on-off operations in accordance with the output level of the plurality of comparators 90 in the sub-A/D converter 9b, and a differential positive side output voltage VDA (+) and a differential negative side output voltage VDA (−) are respectively obtained at the output terminals N111 and N112.

The difference between the high-potential side reference voltage VRT3 and the low-potential side reference voltage VRB3 is set to $VIN_{p-p}/4$. When the respective switches S30 and S31 in the reference voltage generation circuits 96 are turned off, the full-scale range is $VIN_{p-p}/8$. When the switches S30 and S31 are turned on, the full-scale range is $VIN_{p-p}/4$. The full-scale range can be thus switched to one and two in the D/A converter 10b.

Figure 33:
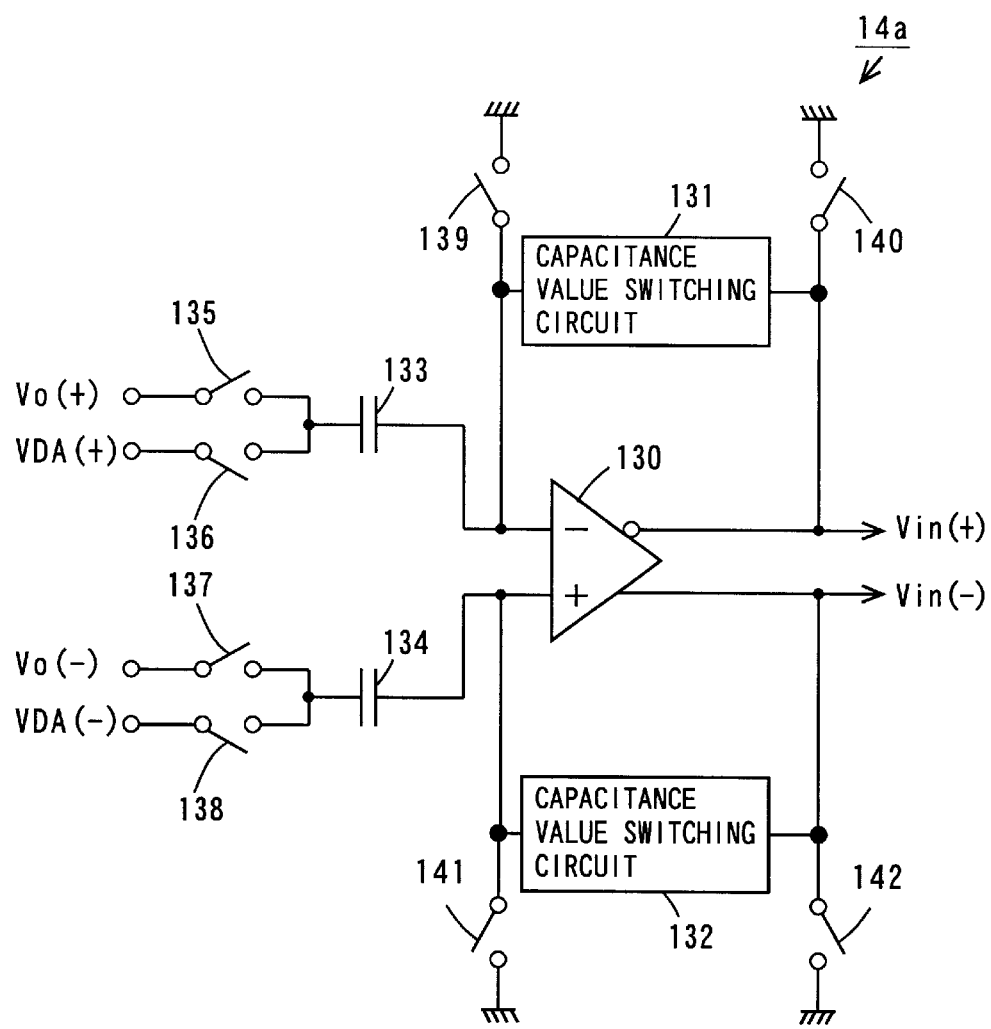
FIG. 33 is a circuit diagram showing the structure of a subtraction amplification circuit in the analog-to-digital conversion circuit shown in FIG. 18.

FIG. 33 is a circuit diagram showing a first example of the structure of the subtraction amplification circuit 14a in the analog-to-digital conversion circuit 1 shown in FIG. 18.

The subtraction amplification circuit 14a shown in FIG. 33 comprises an operational amplifier 130, capacitance value switching circuits 131 and 132, capacitors 133 and 134, and switches 135 to 138. The switch is composed of a MOS (metal Oxide Semiconductor) transistor, for example.

The capacitance value switching circuit 131 is connected as a feedback capacitance between an inverse input terminal and an inverse output terminal of the operational amplifier 130, and the capacitance value switching circuit 132 is connected as a feedback capacitance between a non-inverse input terminal and a non-inverse output terminal thereof. Further, the capacitor 133 is connected as an input capacitance to the inverse input terminal of the operational amplifier 130, and the capacitor 134 is connected as an input capacitance to the non-inverse input terminal thereof.

The positive side analog input voltage Vo (+) outputted from the operational amplification circuit 11 shown in FIG. 18 and the differential positive side output voltage VDA (+) outputted from the D/A converter 10b shown in FIG. 18 are respectively supplied to the capacitor 133 through the switches 135 and 136. The negative side analog input voltage Vo (−) outputted from the operational amplification circuit 11 and the differential positive side output voltage VDA (−) outputted from the D/A converter 10b are respectively supplied to the capacitor 134 through the switches 137 and 138. The inverse input terminal, the inverse output terminal, the non-inverse input terminal, and the non-inverse output terminal of the operational amplifier 130 are respectively grounded through switches 139, 140, 141, and 142.

The operations of the subtraction amplification circuit 14a shown in FIG. 33 are the same as the operations of the operational amplification circuit 11a shown in FIG. 19. A positive side analog input voltage Vin (+) and a negative side analog input voltage Vin (−) which are supplied to the succeeding stage of circuit 4 are obtained from the inverse output terminal and the non-inverse output terminal of the operational amplifier 130.

Here, the capacitance values of the capacitance value switching circuits 131 and 132 are switched, thereby making it possible to switch the gain of the subtraction amplification circuit 14a.

FIG. 34 is a circuit diagram showing a second example of the structure of the subtraction amplification circuit 14a in the analog-to-digital conversion circuit 1 shown in FIG. 18.

The subtraction amplification circuit 14a shown in FIG. 34 comprises an operational amplifier 130, capacitors 145 and 146, capacitance value switching circuits 143 and 144, and switches 135 to 140.

The capacitor 145 is connected as a feedback capacitance between an inverse input terminal and an inverse output terminal of the operational amplifier 130, and the capacitor 146 is connected as a feedback capacitance between a non-inverse input terminal and a non-inverse output terminal thereof. Further, the capacitance value switching circuit 143 is connected as an input capacitance to the inverse input terminal of the operational amplifier 130, and the capacitance value switching circuit 144 is connected as an input capacitance to the non-inverse input terminal thereof.

The positive side analog output voltage Vo (+) outputted from the operational amplification circuit 11 shown in FIG. 18 and the differential positive side output voltage VDA (+) outputted from the D/A converter 1ob shown in FIG. 18 are respectively supplied to the capacitance value switching circuit 143 through the switches 135 and 136. The negative side analog output voltage Vo (−) outputted from the operational amplification circuit 11 and a differential positive side output voltage VDA (−) outputted from the D/A converter 10b are respectively supplied to the capacitance value switching circuit 144 through the switches 137 and 138. The inverse input terminal, the inverse output terminal, the non-inverse input terminal, and the non-inverse output terminal of the operational amplifier 130 are respectively grounded through switches 139, 140, 141, and 142.

The operations of the subtraction amplification circuit 14a shown in FIG. 34 are the same as the operations of the operational amplification circuit 11a shown in FIG. 20. A positive side analog input voltage Vin (+) and a negative side analog input voltage Vin (−) which are supplied to the succeeding stage of circuit 4 are obtained from the inverse output terminal and the non-inverse output terminal of the operational amplifier 130.

Here, the capacitance values of the capacitance value switching circuits 143 and 144 are switched, thereby making it possible to switch the gain of the subtraction amplification circuit 14a.

Each of the switches Sa, S1a, S2a, S24, S25, S26, S28, S29, S30, and S31 in the above-mentioned embodiment is formed of a MOS (Metal Oxide Semiconductor) field effect transistor, for example.

In the above-mentioned embodiment, the switches Sa, S1a, S2a, S24, S25, S26, S28, S29, S30, and S31 are respectively used as switching parts in switching means. In this case, the switches Sa, S1a, S2a, S24, S25, S26, S28, S29, S30, and S31 can be switched to an on or off state at the time of fabrication or at the time of use. The switching part in the switching means is not limited to a switch. For example, a fuse which can be blown by a laser may be used as the switching part, and a mask switching part for patterning an uppermost layer metal may be used as the switching part.

FIG. 35 is a circuit diagram showing another example of the switching part. In the example shown in FIG. 35, the switch Sa in the operational amplification circuit 11a shown in FIG. 21 is replaced with a fuse Fa. The fuse Fa is made of polysilicon, for example, and can be blown by a laser. At the time of fabrication, the gain of the operational amplification circuit 11a can be switched depending on whether or not the fuse Fa is blown by the laser.

Figure 36:
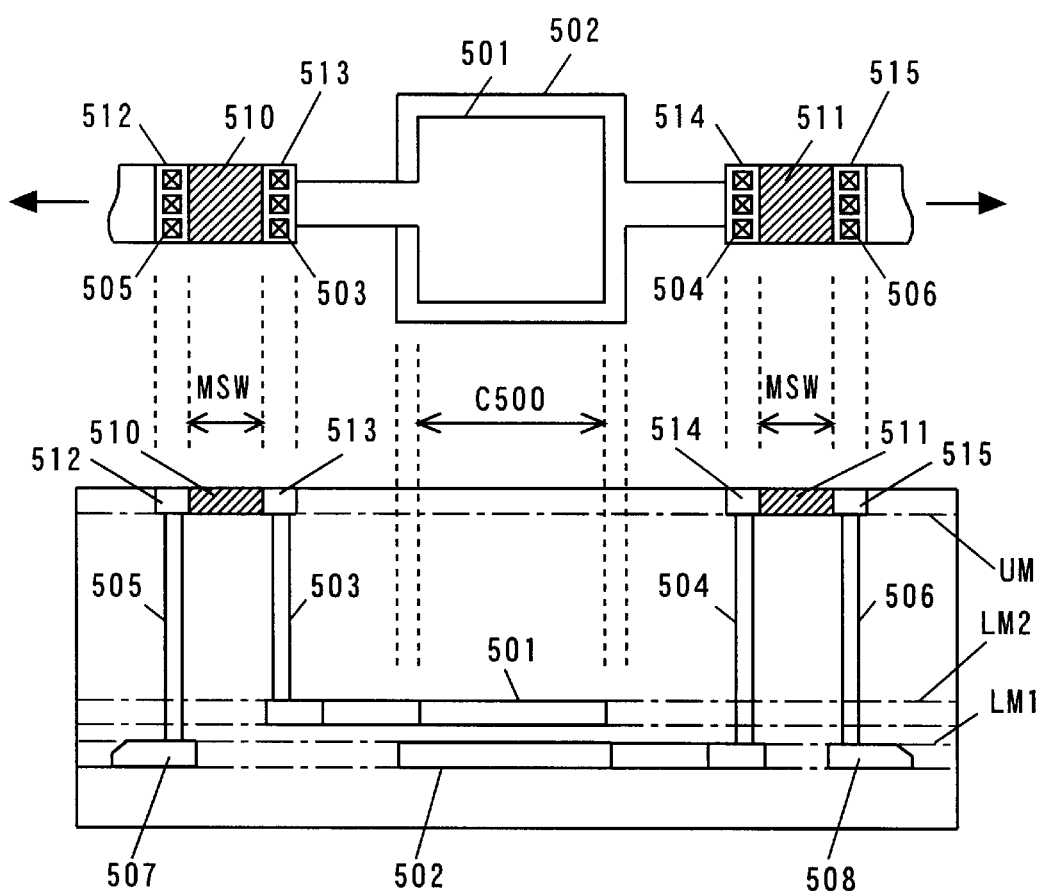
FIG. 36 is a plan view and a cross-sectional view showing still another example of a switching part in switching means.
Figure 37:
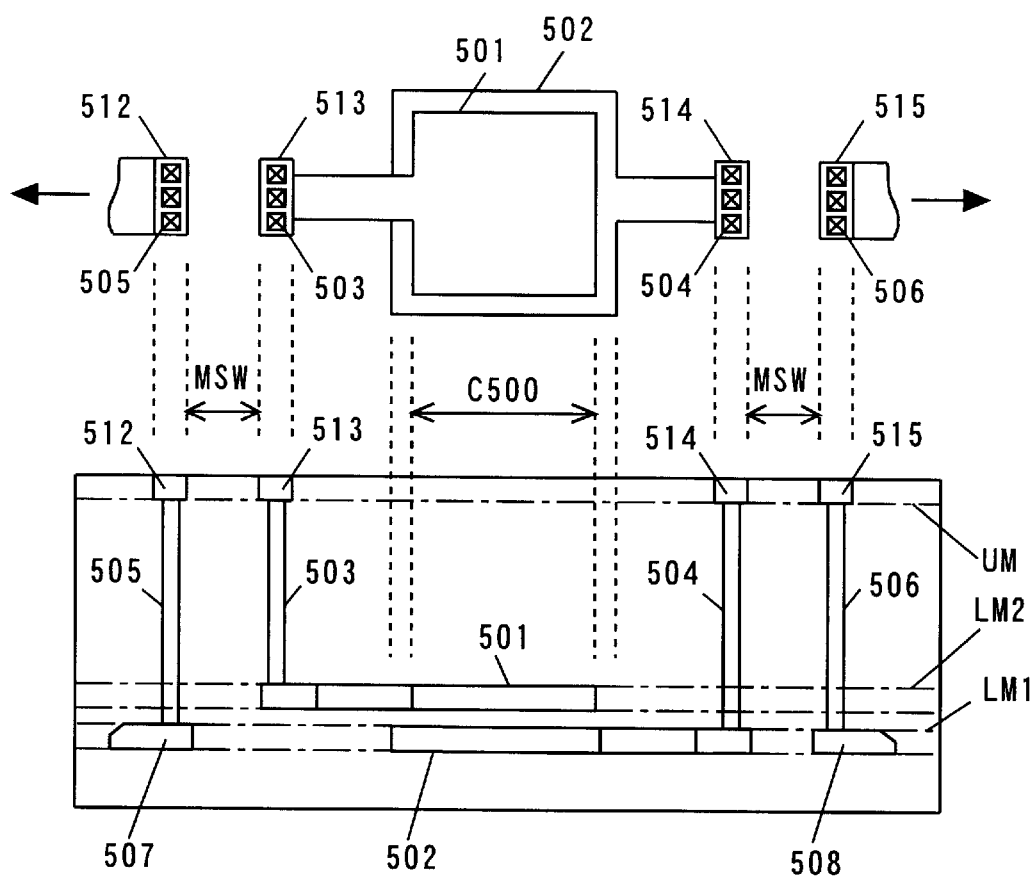
FIG. 37 is a plan view and a cross-sectional view showing still another example of a switching part in switching means.

FIGS. 36 and 37 are diagrams each showing still another example of the switching part, illustrated by a plan view on the upper side and a cross-sectional view on the lower side.

In a capacitive forming part C500, electrodes 501 and 502 of a capacitor are formed of lower layer metals LM1 and LM2. Further, electrodes 507 and 508 are formed of a lower layer metal LM1. Further, electrodes 512 and 513 are formed at predetermined intervals and electrodes 514 and 515 are formed at predetermined intervals by an uppermost layer metal UM. The electrode 501 is connected to the electrode 512 through a metal in a through hole 503, and the electrode 502 is connected to the electrode 514 through a metal in a through hole 504. Further, the electrode 507 is connected to the electrode 512 through a metal in a through hole 505, and the electrode 508 is connected to the electrode 515 through a metal in a through hole 506.

For example, the electrode 507 is connected to the inverse input terminal of the operational amplifier 110 shown in FIG. 21, and the electrode 508 is connected to the inverse output terminal of the operational amplifier 110 shown in FIG. 21.

The capacitance forming part C500 is formed by the electrodes 501 and 502, and mask switching parts MSW are respectively formed between the electrodes 512 and 513 and between the electrodes 514 and 515. The capacitance forming part C500 corresponds to the capacitor Ca shown in FIG. 21, for example.

At the time of fabrication, the pattern of a mask arranged on the mask switching part MSW is changed, thereby making it possible to switch a state between the electrodes 512 and 513 and a state between the electrodes 514 and 515 to a connected state or a disconnected state.

As shown in FIG. 36, such masks that metal layers 510 and 511 are formed of the uppermost layers UM are used between the electrodes 512 and 513 and between the electrodes 514 and 515, thereby making it possible to respectively connect the electrodes 512 and 513 and the electrodes 514 and 515 to each other.

As shown in FIG. 37, such masks that no metal layers are formed of the uppermost layers UM are used between the electrodes 512 and 513 and between the electrodes 514 and 515, thereby making it possible to respectively disconnect the electrodes 512 and 513 and the electrodes 514 and 515 from each other.

In the examples shown in FIGS. 36 and 37, the mask switching parts MSW are respectively provided at both terminals of the capacitance forming part C500, thereby making it possible to completely separate the capacitance forming part C500 from the operational amplifier.

The present invention is not limited to the above-mentioned embodiments. In an arbitrary stage of circuit in the analog-to-digital conversion circuit, at least one of an operational amplification circuit having a switchable gain, a subtraction amplification circuit having a switchable gain, a sub-A/D converter having a switchable full-scale range, and a D/A converter having a switchable full-scale range may be used.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An analog-to-digital conversion circuit having a multi-stage pipeline structure comprising a plurality of stages of circuits, each of the stages of circuits excluding the final-stage circuit comprising an analog-to-digital converter that converts an inputted analog signal into a digital signal, a first operational amplification circuit that amplifies the inputted analog signal, a digital-to-analog converter that converts the digital signal outputted from said analog-to-digital converter into an analog signal, and a second operational amplification circuit that amplifies the difference between the analog signal outputted from said first operational amplification circuit and the analog signal outputted from said digital-to-analog converter, in at least one of the stages of circuits excluding the final-stage circuit, said first operational amplification circuit having a gain larger than one, and the voltage range of said digital-to-analog converter and the voltage range of said analog-to-digital conversion circuit being independently set, respectively, such that the output voltage range of said first operational amplification circuit and the voltage range of said digital-to-analog converter are substantially equal to each other.

2. The analog-to-digital conversion circuit according to claim 1, wherein in at least one of the stages of circuits, the ratio of the voltage range of said digital-to-analog converter to the voltage range of said analog-to-digital conversion circuit is substantially equal to the gain of said first operational amplification circuit.

3. The analog-to-digital conversion circuit according to claim 1, wherein in at least one of the stages of circuits, said analog-to-digital converter operates on the basis of a reference voltage having a first voltage range, and said digital-to-analog converter operates on the basis of a reference voltage having a second voltage range, and said first voltage range and said second voltage range are independently set, respectively, such that the output voltage range of said first operational amplification circuit and the voltage range of said digital-to-analog converter are substantially equal to each other.

4. The analog-to-digital conversion circuit according to claim 3, wherein in at least one of the stages of circuits, the ratio of said second voltage range to said first voltage range is substantially equal to the gain of said first operational amplification circuit.

5. An analog-to-digital conversion circuit having a multi-stage pipeline structure comprising a plurality of stages of circuits, each of the stages of circuits excluding the final-stage circuit comprising an analog-to-digital converter that converts an inputted analog signal into a digital signal, a first operational amplification circuit that amplifies the inputted analog signal, a digital-to-analog converter that converts the digital signal outputted from said analog-to-digital converter into an analog signal, and a second operational amplification circuit that amplifies the difference between the analog signal outputted from said first operational amplification circuit and the analog signal outputted from said digital-to-analog converter, in at least one of the stages of circuits excluding the final-stage circuit, said first operational amplification circuit having a gain larger than one, said digital-to-analog converter having a capacitance array including a plurality of capacitances for generating a voltage of the analog signal corresponding to the digital signal, said second operational amplification circuit having an input capacitance, a feedback capacitance, and an operational amplifier, amplifying the analog signal outputted from said first operational amplification circuit with a first gain determined by the value of said input capacitance and the value of said feedback capacitance, amplifying the analog signal generated in said capacitance array by said digital-to-analog converter with a second gain determined by the value of said capacitance array and the value of said feedback capacitance, and outputting the difference between the analog signal amplified with said first gain and the analog signal amplified with said second gain, and the value of said capacitance array and the value of said input capacitance being independently set, respectively, such that the output voltage range of said first operational amplification circuit multiplied by said first gain and the voltage range of said digital-to-analog converter multiplied by said second gain are substantially equal to each other.

6. The analog-to-digital conversion circuit according to claim 5, wherein in at least one of the stages of circuits, the ratio of the value of said capacitance array to the value of said input capacitance is substantially equal to the gain of said first operational amplification circuit.

7. The analog-to-digital conversion circuit according to claim 5, wherein in at least one of the stages of circuits, said operational amplifier in said second operational amplification circuit has one input terminal to which said capacitance array is connected and has the other input terminal and an output terminal, said feedback capacitance in said second operational amplification circuit is connected between said one input terminal and said output terminal of said operational amplifier, said input capacitance in said second operational amplification circuit is connected in parallel with said capacitance array to said one input terminal of said operational amplifier, and said second operational amplification circuit further comprises a switch circuit that brings about a short-circuited state between said one input terminal and said other input terminal of said operational amplifier, and feeds the analog signal outputted from said operational amplifier to an input end of said input capacitance and feeds an arbitrary first set voltage to an input end of said capacitance array, then brings about an opened state between said one input terminal and said other input terminal of said operational amplifier, and feeds an arbitrary second set voltage to the input end of said input capacitance and feeds the analog signal outputted from said digital-to-analog converter to the input end of said capacitance array.

8. The analog-to-digital conversion circuit according to claim 7, wherein
in at least one of the stages of circuits,
said set voltage of said second operational amplification circuit is a predetermined voltage of the analog signal outputted from said first operational amplification circuit.

9. The analog-to-digital conversion circuit according to claim 5, wherein
in at least one of the stages of circuits,
said first operational amplification circuit outputs first and second differential analog signals,
said capacitance array of said digital-to-analog converter comprises first and second capacitance arrays for respectively generating voltages of third and fourth differential analog signals corresponding to the digital signal,
said operational amplifier in said second operational amplification circuit has one input terminal to which said first capacitance array is connected, the other input terminal to which said second capacitance array is connected, one output terminal, and the other output terminal,
said feedback capacitance comprises
a first feedback capacitance connected between said one input terminal and said one output terminal of said operational amplifier, and
a second feedback capacitance connected between said other input terminal and said other output terminal of said operational amplifier,
said input capacitance comprises
a first input capacitance connected in parallel with said first capacitance array to said one input terminal of said operational amplifier, and
a second input capacitance connected in parallel with said second capacitance array to said other input terminal of said operational amplifier,
said second operational amplification circuit further comprises a switch circuit that connects said one and other input terminals of said operational amplifier to a predetermined reference potential, and respectively feeds the first and second differential analog signals outputted from said first operational amplification circuit to input ends of said first and second input capacitances and respectively feeds an arbitrary first set voltage to input ends of said first and second capacitance arrays, then disconnects said one and other input terminals of said operational amplifier from said reference potential, and respectively feeds an arbitrary second set voltage to the input ends of said first and second input capacitances and respectively feeds third and fourth differential analog signals outputted from said digital-to-analog converter to the input ends of said first and second capacitance arrays, and
the value of said first capacitance array and the value of said first input capacitance are independently set, respectively, such that the output voltage range of said first operational amplification circuit multiplied by said first gain and the voltage range of said digital-to-analog converter multiplied by said second gain are substantially equal to each other.

10. The analog-to-digital conversion circuit according to claim 9, wherein in at least one of the stages of circuits, the ratio of the value of said first capacitance array to the value of said first input capacitance is substantially equal to the gain of said first operational amplification circuit, and
the ratio of said second capacitance array to the value of said second input capacitance is substantially equal to the gain of said first operational amplification circuit.

11. The analog-to-digital conversion circuit according to claim 9, wherein
in at least one of the stages of circuits,
said second set voltage of said second operational amplification circuit is an output voltage equalized in said first operational amplification circuit.

12. An analog-to-digital conversion circuit having a multi-stage pipeline structure comprising a plurality of stages of circuits,
each of the stages of circuits excluding the final-stage circuit comprising
an analog-to-digital converter that converts an inputted analog signal into a digital signal,
a first operational amplification circuit that amplifies the inputted analog signal,
a digital-to-analog converter that converts the digital signal outputted from said analog-to-digital converter into an analog signal, and
a second operational amplification circuit that amplifies the difference between the analog signal outputted from said first operational amplification circuit and the analog signal outputted from said digital-to-analog converter,
in at least one of the stages of circuits excluding the final-stage circuit,
said first operational amplification circuit having a gain larger, than one,
said analog-to-digital converter operating on the basis of a reference voltage having a first voltage range, and said digital-to-analog converter operating on the basis of a reference voltage having a second voltage range,
said digital-to-analog converter having a capacitance array to which a plurality of capacitances for generating a voltage of the analog signal corresponding to the digital signal are connected in an array shape,
said second operational amplification circuit having an input capacitance, a feedback capacitance, and an operational amplifier, amplifying the analog signal outputted from said first operational amplification circuit with a first gain determined by the value of said input capacitance and the value of said feedback capacitance, amplifying the analog signal generated in said capacitance array by said digital-to-analog converter with a second gain determined by the value of said capacitance array and the value of said feedback capacitance, and outputting the difference between the analog signal amplified with said first gain and the analog signal amplified with said second gain, and
said first voltage range and said second voltage range being independently set, respectively, and the value of said capacitance array and the value of said input capacitance being independently set, respectively, such that the output voltage range of said first operational amplification circuit multiplied by said first gain and the voltage range of said digital-to-analog converter multiplied by said second gain are substantially equal to each other.

13. An analog-to-digital conversion circuit having a multi-stage pipeline structure comprising a plurality of stages of circuits, each of the stages of circuits excluding the final-stage circuit comprising
an analog-to-digital converter that converts an inputted analog signal into a digital signal,
a digital-to-analog converter that converts the digital signal outputted from said analog-to-digital converter into an analog signal, and
a first operational amplification circuit that amplifies the difference between the inputted analog signal and the analog signal outputted from said digital-to-analog converter,
the final-stage circuit comprising an analog-to-digital converter that converts the inputted analog signal into a digital signal,
at least one of the stages of circuits excluding the final-stage circuit comprising at least one of an analog-to-digital converter having switching means for switching a voltage range among a plurality of ranks, a digital-to-analog converter having switching means for switching a voltage range among a plurality of ranks, and a first operational amplification circuit having switching means for switching a gain among a plurality of values, and/or the final-stage circuit comprising an analog-to-digital converter having switching means for switching the voltage range among a plurality of ranks.

14. The analog-to-digital conversion circuit according to claim 13, wherein
each of the stages of circuits excluding the final-stage circuit further comprises a second operational amplification circuit that amplifies the inputted analog signal and feeds the amplified analog signal to said first operational amplification circuit, and
said second operational amplification circuit in at least one of the stages of circuits excluding the final-stage circuit having switching means for switching a gain among a plurality of values.

15. The analog-to-digital conversion circuit according to claim 14, wherein
said second operational amplification circuit in at least one of the stages of circuits has an input capacitance, a feedback capacitance, and an operational amplifier, and amplifies the inputted analog signal with a gain determined by the value of said input capacitance and the value of said feedback capacitance, and
said switching means comprises a variable part that variably sets at least one of the value of said input capacitance and the value of said feedback capacitance.

16. The analog-to-digital conversion circuit according to claim 15, wherein
said variable part comprises a switching part that switches part of said input capacitance or said feedback capacitance to a separated state or a short-circuited state.

17. The analog-to-digital conversion circuit according to claim 16, wherein
said feedback capacitance comprises first and second capacitances provided in parallel or in series between the input terminal and the output terminal of said operational amplifier, and
said switching part is connected in series or in parallel with said second capacitance.

18. The analog-to-digital conversion circuit according to claim 17, wherein said switching part is connected to the output terminal of said operational amplifier.

19. The analog-to-digital conversion circuit according to claim 16, wherein
said input capacitance comprises first and second capacitances provided in parallel or in series with the input terminal of said operational amplifier,
said switching part is connected in series or in parallel with said second capacitance.

20. The analog-to-digital conversion circuit according to claim 19, wherein
said switching part is connected to the input side of said second capacitance.

21. The analog-to-digital conversion circuit according to claim 13, wherein
said first operational amplification circuit in at least one of the stages of circuits has an input capacitance, a feedback capacitance, and an operational amplifier, and amplifies the inputted analog signal with a gain determined by the value of said input capacitance and the value of said feedback capacitance, and
said switching means comprises a variable part that variably sets at least one of the value of said input capacitance and the value of said feedback capacitance.

22. The analog-to-digital conversion circuit according to claim 21, wherein
said variable part comprises a switching part that switches part of said input capacitance or said feedback capacitance to a separated state or a short-circuited state.

23. The analog-to-digital conversion circuit according to claim 22, wherein
said feedback capacitance comprises first and second capacitances provided in parallel or in series between the input terminal and the output terminal of said operational amplifier, and
said switching part is connected in series or in parallel with said second capacitance.

24. The analog-to-digital conversion circuit according to claim 23, wherein said switching part is connected to the output terminal of said operational amplifier.

25. The analog-to-digital conversion circuit according to claim 22, wherein
said input capacitance comprises first and second capacitances provided in parallel or in series with the input terminal of said operational amplifier,
said switching part is connected in series or in parallel with said second capacitance.

26. The analog-to-digital conversion circuit according to claim 25, wherein
said switching part is connected to the input side of said second capacitance.

27. The analog-to-digital conversion circuit according to claim 13, wherein
said analog-to-digital converter in at least one of the stages of circuits comprises a reference voltage generation circuit that generates a plurality of reference voltages, and a plurality of comparators that compare the plurality of reference voltages generated by said reference voltage generation circuit with the inputted analog signal, and
said switching means comprises a variable part that variably sets the plurality of reference voltages generated by said reference voltage generation circuit.

28. The analog-to-digital conversion circuit according to claim 27, wherein said digital-to-analog converter in at least one of the stages of circuits excluding the final-stage circuit comprises a reference voltage generation circuit that generates a reference voltage, a plurality of capacitances connected to a common terminal, and a plurality of switches, connected between said reference voltage generation circuit and said plurality of capacitances, which respectively feed the reference voltage generated by said reference voltage generation circuit to said plurality of capacitances in response to an inputted digital signal, and said switching means comprises a variable part that variably sets the reference voltage generated by said reference voltage generation circuit.

* * * * *